United States Patent
Jagt et al.

(10) Patent No.: US 9,599,292 B2
(45) Date of Patent: Mar. 21, 2017

(54) LIGHT EMITTING MODULE, A LAMP, A LUMINAIRE AND A DISPLAY DEVICE

(75) Inventors: Hendrik Johannes Boudewijn Jagt, Eindhoven (NL); Olexandr Velentynovych Vdovin, Eindhoven (NL); Coen Adrianus Verschuren, Eindhoven (NL); Durandus Kornelius Dijken, Eindhoven (NL); Christian Kleijnen, Eindhoven (NL); Marcellinus Petrus Carolus Michael Krijn, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 143 days.

(21) Appl. No.: 14/232,916

(22) PCT Filed: Mar. 23, 2012

(86) PCT No.: PCT/IB2012/051405
§ 371 (c)(1),
(2), (4) Date: Jan. 15, 2014

(87) PCT Pub. No.: WO2013/041979
PCT Pub. Date: Mar. 28, 2013

(65) Prior Publication Data
US 2015/0009649 A1  Jan. 8, 2015

(30) Foreign Application Priority Data
Sep. 20, 2011  (EP) .................................. 11181914

(51) Int. Cl.
*F21V 9/00*  (2015.01)
*F21K 9/62*  (2016.01)
(Continued)

(52) U.S. Cl.
CPC .................. *F21K 9/54* (2013.01); *F21K 9/62* (2016.08); *F21K 9/64* (2016.08); *H01L 33/507* (2013.01);
(Continued)

(58) Field of Classification Search
CPC ..... F21K 9/54; F21K 9/56; F21K 9/62; F21K 9/64; H01L 33/507; F21Y 2113/13; F21Y 2115/10
(Continued)

(56) References Cited

U.S. PATENT DOCUMENTS 7,091,661 B2 *  8/2006  Ouderkirk ............ H01L 33/505
                                                           313/112
7,663,152 B2    2/2010  Bierhuizen
(Continued)

FOREIGN PATENT DOCUMENTS

CN  1836339 A    9/2006
CN  103403894 A  11/2013
(Continued)

OTHER PUBLICATIONS

"Analysis of High Power Packages for Phosphor Based White Light Emitting Diodes" Hong et al, Applied Physics Letters, AIP, Melville, NY vol. 86, No. 24, Jun. 8, 2005 p. 243505-1-243505-3.
(Continued)

*Primary Examiner* — Peggy Neils
*Assistant Examiner* — William N Harris
(74) *Attorney, Agent, or Firm* — Patent Law Group LLP; Brian D. Ogonowsky

(57) ABSTRACT

A light emitting module includes at least one LED mounted on a reflective base and surrounded by reflective walls to form a cavity. A partially diffusive layer containing a phosphor is mounted above the LED with a gap therebetween. Some of the light emitted by the phosphor is backscattered (Continued)

toward the LED, base, and walls. The LED absorbs a significant amount of the light, while the reflective base and walls efficiently reflect over 90% of the light back toward the phosphor layer for exiting the module. Various equations are provided that allow the designer to select an optimal gap between the LED and the partially diffusive layer to maximize light extraction efficiency out of the diffusive layer. The optimal gap range for maximizing light extraction efficiency is a product of LED largest linear length, LED surface area, base area, wall area, and reflective coefficients of the various elements.

17 Claims, 21 Drawing Sheets

(51) Int. Cl.
*F21K 9/64* (2016.01)
*H01L 33/00* (2010.01)
*H01L 33/60* (2010.01)
*F21K 99/00* (2016.01)
*H01L 33/50* (2010.01)
*F21Y 113/13* (2016.01)
*F21Y 115/10* (2016.01)

(52) U.S. Cl.
CPC .......... *H01L 33/60* (2013.01); *F21Y 2113/13* (2016.08); *F21Y 2115/10* (2016.08); *H01L 2924/0002* (2013.01); *H01L 2933/0091* (2013.01)

(58) Field of Classification Search
USPC ........................................................ 362/293
See application file for complete search history.

(56) References Cited

U.S. PATENT DOCUMENTS

| | | | |
|---|---|---|---|
| 2006/0097245 A1 | 5/2006 | Aanegola et al. | |
| 2006/0171152 A1* | 8/2006 | Suehiro | H01L 33/56 362/363 |
| 2008/0023339 A1 | 1/2008 | Berggren et al. | |
| 2008/0054281 A1* | 3/2008 | Narendran | H01L 33/507 257/98 |
| 2008/0089053 A1 | 4/2008 | Negley | |
| 2009/0200939 A1* | 8/2009 | Lenk | F21K 9/135 313/512 |
| 2009/0322208 A1 | 12/2009 | Shaikevitch | |
| 2010/0258828 A1 | 10/2010 | Ramer et al. | |
| 2010/0315832 A1 | 12/2010 | Pijlman | |
| 2014/0003044 A1* | 1/2014 | Harbers | F21K 9/00 362/230 |
| 2014/0022779 A1* | 1/2014 | Su | H01L 33/504 362/231 |

FOREIGN PATENT DOCUMENTS

| | | |
|---|---|---|
| EP | 1588427 A2 | 8/2004 |
| EP | 1686630 A2 | 8/2006 |
| EP | 1930959 A1 | 6/2008 |
| JP | 2005537651 A | 12/2005 |
| JP | 2007234637 A | 9/2007 |
| JP | 2008533664 A | 8/2008 |
| JP | 2010503004 A | 1/2010 |
| JP | 2010515096 A | 5/2010 |
| JP | 2011510445 A | 3/2011 |
| RU | 2083031 C1 | 6/1997 |
| WO | WO-2010002708 A1 | 1/2010 |
| WO | 2010059614 A1 | 5/2010 |
| WO | WO-2011033406 A2 | 3/2011 |
| WO | WO-2011052502 A1 | 5/2011 |

OTHER PUBLICATIONS

EPO as ISA, PCT/IB2012/051405 filed Mar. 23, 2012, "International Search Report and Written Opinion" mailed Aug. 9, 2012, 16 pages.
First Office Action issued Mar. 21, 2016, Chinese Patent Application No. 201280045784.9, 18 pages.
Grant Decision mailed Apr. 7, 2016, Russian Patent Application No. 2014115713, 17 pages.
Office Action mailed Feb. 9, 2016, Japanese Patent Application No. 2014-531336, 9 pages.
Reason for Rejection received Nov. 1, 2016, Japan Application No. 2014-531336, 9 pages.

* cited by examiner (i)

(ii)

(iii)

(iv)

(v)

(vi)

LIGHT EMITTING MODULE, A LAMP, A LUMINAIRE AND A DISPLAY DEVICE

CROSS-REFERENCE TO PRIOR APPLICATIONS

This application is the U.S. National Phase application under 35 U.S.C. §371 of International Application No. PCT/IB2012/051405, filed on Mar. 23, 2012, which claims the benefit of EP 11181914.0 Sept. 20, 2011. These applications are hereby incorporated by reference.

FIELD OF THE INVENTION

The invention relates to a light emitting module which comprises a luminescent layer and a solid state light emitter. The invention further relates to a lamp, a luminaire and a display device comprising a light emitting module.

BACKGROUND OF THE INVENTION

Published patent application US2009/0322208A1 discloses a light emitting device. A Light Emitting Diode (LED) is provided within a conical cavity formed by a recessed housing. At the front side of the recessed housing the conical cavity is covered with a transparent thermal conductor layer on which a refractory luminescent layer is provided. At the backplane of the recessed housing a heat sink is provided and the side walls of the recessed housing are covered with a metal frame. The conical cavity may be filled with a material such as silicone.

The LED emits light of a first color towards the luminescent layer. A portion of the emitted light may be reflected or scattered back into the cavity by the luminescent layer. Another portion of the emitted light is converted by the luminescent layer into light of a second color. When the luminescent layer emits the light of the second color, this light is emitted in all directions, and thus a part of the light of the another color is emitted into the cavity. Light which is reflected back into the cavity or light of the second color which is emitted into the cavity partially impinges on a base of the cavity, partially impinges on a wall of the cavity, and partially impinges on the LED. At the surfaces of the LED and at the surfaces of the cavity the light is partially reflected and partially absorbed. Especially the absorption of light results in an inefficiency of the light emitting device.

Some light module manufacturers provide light emitting modules which comprise a cavity with a base. These modules often have a plurality of light emitters, such as for example LEDs, provided on the base. In certain embodiments of these light emitting modules the luminescent layer is provided directly on top of the light emitters, for example via a bond layer, and in other embodiments the luminescent layer is a so-called remote luminescent layer which means that there is a relatively large distance between the light emitter and the luminescent layer in the order of centimeters.

A problem of the light emitting modules with the light emitters which have the luminescent layer directly on top is that light directed back from the luminescent layer to the LED suffers from poor recycling efficiency due to the fact that back reflectors inside the LED have a limited reflectance (typically the back mirror is silver, with 90% reflectance levels). In reality the actual reflectance is even lower as the light emitter material, typically GaN/InGaN or AlInGaN, has a high refractive index, causing light to be trapped inside the light emitter and thus further limiting metal reflectance. Typical LED reflection coefficients are close to 70% (averaged over the visible spectral range and measured at normal incidence). Another problem of these light emitting modules is the formation of hot spots in which most of the light is concentrated in the area on top of the LED and the light output of the module is therefore highly non-uniform resulting in hot spots both in light output and thermal distribution. Furthermore, a phosphor layer on top of the LED die may get relatively hot and is excited with a high flux density, leading to a non-optimal phosphor conversion efficiency thereby limiting the luminescent performance.

The light emitting modules with the remote luminescent layer are generally more efficient than the light emitting modules with the light emitters which have the luminescent layer directly on top, because of a more efficient recycling of light inside the cavity. Also the light output of these modules is typically more homogeneous, reducing the hot spots. However, the light emitting modules with the remote luminescent layer have a relatively large size compared to the light emitting modules with the light emitters which have the luminescent layer directly on top. The relatively bulky remote luminescent layer solutions cannot be used in size constrained applications, such as spot lamp applications, for example halogen replacement lamps and parabolic reflector lamps.

Another disadvantage of light emitting modules with a remote luminescent layers is that the relatively large area of the luminescent layer results in relatively high material cost levels. In addition, the heat conductance within the phosphor layer is only directed laterally towards the side walls of the light emitter and due to their bulky construction, the ability to direct the heat away from the remote phosphor plate is limited.

SUMMARY OF THE INVENTION

It is an object of the invention to provide a light emitting module which is relatively efficient.

A first aspect of the invention provides a light emitting module as claimed in claim 1. A second aspect of the invention provides a lamp as claimed in claim 23. A third aspect of the invention provides a luminaire as claimed in claim 24. A fourth aspect of the invention provides a display device as claimed in claim 25. Advantageous embodiments are defined in the dependent claims.

A light emitting module in accordance with the first aspect of the invention emits light through a light exit window. The light emitting module comprises a base, at least one solid state light emitter and a partially diffusive reflective layer, which is a layer that has diffuse reflective properties wherein at least a part of incident light is diffusively reflected and at least a part of the incident light is transmitted through this layer. The base has a surface and at least part of the surface of the base reflects light that impinges on the surface of the base. The part of the surface of the base that reflects light is named hereinafter the light reflective surface of the base. The light reflective surface has a base reflection coefficient which is defined by a ratio between the amount of light that is reflected by the light reflective surface of the base and the amount of light that impinges on the light reflective surface of the base. The at least one solid state light emitter is configured to emit light of a first color range and has a top surface and a solid state light emitter reflection coefficient which is defined by a ratio between the amount of light that is reflected by the at least one solid state light emitter and the amount of light that impinges on the top surface of the at least one solid state light emitter. A largest linear size of the top surface of the at least one solid state light emitter is defined as the longest distance from a point on the top surface of the at least one solid state light emitter to another point on the top surface of the at least one solid state light emitter along a straight line. The light exit window comprises at least a part of the partially diffusive reflective layer. A solid state light emitter area ratio is defined as the ratio between the area of the top surface of the at least one solid state light emitter and the area of the light reflective surface of the base. The value of the base reflection coefficient is larger than 70% and larger than the solid state light emitter reflection coefficient. A gap is present between the top surface of the at least one solid state light emitter and the partially diffusive reflective layer. The gap is defined by a distance between the top surface of the at least one solid state light emitter and the partially diffusive reflective layer. This distance is in a range with a minimum value equal to or larger than 0.3 times a largest linear size of the top surface and a maximum value equal to or smaller than 5 times the largest linear size of the top surface for a relatively small value of the solid state emitter area ratio, i.e. smaller than 0.1. For intermediate values of the solid state emitter area ratio, i.e. in a range with a minimum value that is larger than or equal to 0.1 and a maximum value that is smaller than or equal to 0.25, the distance is in a range with a minimum value equal to or larger than 0.15 times the largest linear size of the top surface and a maximum value that is equal to or smaller than 3 times the largest linear size of the top surface. For a relatively large value of the solid state emitter area ratio, i.e. larger than 0.25, the distance is in a range with a minimum value equal to or larger than 0.1 times the largest linear size of the top surface and a maximum value that is equal to or smaller than 2 times the largest linear size of the top surface.

The distance between the top surface of the solid state light emitter and the partially diffusive reflective layer is defined as the length of the shortest linear path between the top surface of the at least one solid state light emitter and the surface of the partially diffusive reflective layer that faces the at least one solid state light emitter. If the light emitting module comprises more than one solid state light emitters, the distance between the top surfaces of the solid state light emitters and the partially diffusive reflective layer is an average of the distances between each of top surfaces of the solid state light emitters and the partially diffusive reflective layer.

The largest linear size of the top surface of the solid state light emitter is defined as the longest distance from a point on the top surface of the at least one solid state light emitter to another point on the top surface of the at least one solid state light emitter along a straight line. If the light emitting module comprises more than one solid state light emitters, the average value of the largest linear sizes of the top surfaces is used. The top surface may be any shape, for example, a square, rectangle, circle or ellipse. For the square or the rectangle, the longest linear distance is the length of a diagonal of the square or the rectangle. For the circle, the longest linear size is the length of a diameter of the circle.

The inventors have found with experiments that the distance between the solid state light emitter(s) and the partially diffusive reflective layer should have a minimum value above which a relatively large light output of the light emitting module is obtained and which depends on the solid state emitter area ratio. Below this minimum value the light emitting module operates less efficiently and too much light is reflected, back scattered and/or re-emitted by the partially diffusive reflective layer to the at least one solid state light emitter. Further, the inventors have found that when the distance between the at least one solid state light emitter and the partially diffusive reflective layer becomes too large, the light output starts to decrease and is therefore not advantageous, also depending on the value of the solid state emitter area ratio. The decrease is the result of more absorption of light because the light has a longer traveling path through the light emitting module and thus may experience more absorption events.

The value of the base reflection coefficient is at least larger than the value of the solid state light emitter reflection coefficient and consequently the base absorbs less light than the solid state emitter. This is advantageous because more light is reflected by the base and therefore more light may be emitted through the light exit window in the ambient of the light emitting module. It actually means that more light is reflected by the base which is subsequently recycled instead of absorbed. The efficiency of the light emitting module as a whole improves, as light losses in the light emitting module according to the invention are minimized. Compared to light emitting modules with a luminescent layer directly on top of the solid state light emitter, less light is lost by the light absorption of the solid state light emitter. Compared to light emitting modules with a remote luminescent layer acting as a partially diffusive reflective layer, the light that is reflected, back scattered and/or re-emitted by the partially diffusive reflective layer to the inside of the module is recycled more efficiently as it has less interaction (reflections) inside the module before exiting the light exit window. As a result, a light emitting module according to the invention is relatively efficient.

The inventors have found experimentally that the specific combination of the base reflection coefficient being higher than the solid state light emitter reflection coefficient according to the previously specified criterion and the criterion of the distance between the top surface of the solid state light emitter(s) and the luminescent layer being in the specific range, leads to a relatively high light output and thus a relatively efficient light emitting module.

The gap has to be interpreted broadly. The meaning is that the partially diffusive reflective layer is not in direct contact with the top surface or top surfaces of the at least one solid state light emitter and that there is a certain distance between the at least one solid state light emitter and the partially diffusive reflective layer. The gap may be filled with air, but a substantially transparent material may also be present in the gap.

If the partially diffusive reflective layer is not in direct contact with the top surface of the solid state light emitter or solid sate light emitters, a relatively larger amount of light will be reflected and emitted towards the light reflective surface. If, according to the invention, the light reflective surface has a higher reflectivity than the at least one solid state light emitter, more light will be reflected back to the partially diffusive reflective layer and, consequently, a higher light output will be obtained.

The inventors have found experimentally that the optical effect of a relatively high reflectivity may further increase the light output. If there is a gap between the solid state light emitter(s) and the partially diffusive reflective layer, the at least one solid state light emitter does not become as warm as it would be when the partially diffusive reflective layer is positioned on top of, or very close to, the solid state light emitter(s). This further improves the efficiency of the at least one solid state light emitter and may allow a higher current loading before a critical temperature is reached in the solid state light emitter or a solder joint of the solid state light emitter. Hence, a higher absolute light output is realized.

Also, if the partially diffusive reflective layer is not directly thermally coupled to the at least one solid state light emitter it does not receive the heat from the at least one solid state light emitter. It depends on the quality of thermal interface towards the base and a possible heat sink to which the module is connected how well the partially diffusive reflective layer can be cooled.

Thus, a specific combination of the base reflection coefficient being higher than the solid state light emitter reflection coefficient according to the presence of the gap, leads to a higher light output than one expects only on basis of the optical effect of more reflection by the light reflective surface of the base.

In an embodiment the partially diffusive reflective layer comprises luminescent material for converting at least a part of the light of the first color range into light of a second color range. The light of the second color range is emitted by the luminescent material in all directions and a part of this light is also emitted towards the at least one solid state light emitter or towards the light reflective surface of the base.

The light conversion from the first spectral range towards the second spectral range, in case the partially diffusive reflective layer acts as a luminescent layer, converts light energy partially to heat, typically denoted as 'Stokes shift' losses. Furthermore, in practice the Quantum Efficiency (QE) of the luminescent material(s) is limited, e.g. to 0.9 giving rise to further thermal heat-up of the partially diffusive reflective layer comprising luminescent material, hereafter called a luminescent layer. The efficiency of the luminescent material is higher if the temperature of the luminescent material is kept within acceptable limits. This can be achieved by limiting the light flux loading, i.e. the flux density distribution, on the luminescent material, for example by applying a specific distance between the solid state light emitters and the luminescent layer thus allowing the light to spread thereby reducing the flux density on the luminescent layer. However, more preferably the thermal resistance between the luminescent layer and the base and between the luminescent layer and the heat sink is optimized to achieve a low thermal resistance. This can be achieved by various means, such as by coupling the luminescent layer to a heat conductive wall at the circumference of the exit window, or by applying a heat conductive material between the emitters and the base and the luminescent material, such as a heat conductive glass or ceramic or by applying heat spreading layers or structures on the luminescent layer, such as a carrier substrate to which the luminescent layer is attached with heat conductive properties. Thus, with such measures, the gap between the solid state light emitter(s) and the luminescent layer results in the photo-thermal effect of a more efficient luminescent layer.

Further, the gap between the at least one solid state light emitter and the partially diffusive reflective layer results in a more uniform distribution of light flux through the partially diffusive reflective layer instead of a relatively high light flux in a very specific area of the partially diffusive reflective layer. Also a reduction of thermal hot spots and temperature gradients is achieved in this way in case the partially diffusive reflective layer comprises a luminescent material. Luminescent materials tend to be sensitive to photosaturation, which means that above a certain light flux, the luminescent material converts light at a lower efficiency. Thus, by having a gap between the solid state light emitter(s) and the partially diffusive reflective layer comprising luminescent material, photosaturation of the luminescent material is prevented and efficiency is improved.

In an embodiment the top surface of the at least one solid state light emitter faces towards the light exit window. In an embodiment one of the solid state light emitters is a socalled side emitter. In an embodiment, at least one solid state light emitter emits light towards at least a part of the light exit window.

In an embodiment, the light emitting module comprises a plurality of solid state light emitters. Each one of the solid state light emitters is configured to emit light in a specific color range. In another embodiment the plurality of solid state light emitters are provided on an imaginary plane which is in between the base and the light exit window. In a further embodiment at least one of the plurality of solid state light emitters emits light towards at least a specific part of the light exit window. Additionally or alternatively, at least one of the plurality of solid state light emitters has a top surface facing towards the light exit window. The solid state light emitter reflection coefficient is defined as the average value of the reflection coefficients of the plurality of solid state light emitters. In a further embodiment the top surface of at least one solid state light emitter faces the light exit window and the top surface of another solid state light emitter does not face the light exit window.

In specific embodiments, the light emitter may be a combination of a plurality of solid state light emitters with their light emitting surfaces positioned very close to each other in one plane. Very close means that the distance between the individual solid state light emitters is in the order of tens of micrometers, but not more than 0.2 mm. Such closely positioned solid state light emitters are seen in the context of this invention as a single light emitter, also called a multi-die LED. The top surface is the combination of top surfaces of the individual solid state light emitters of the very closely positioned solid state light emitters. It is to be noted that the very close placement relates to the dies of the solid state light emitters and not to the very close placement of packages of solid state light emitter.

The light emitting module is able to emit more light if more than one solid light emitter is provided. More light, seen in absolute values, will be reflected within the light emitting module and consequently emitted back towards the solid state light emitters and the light reflective surface of the base. Thus, if the light reflective surface of the base has a better reflectivity than the solid state light emitters, more light, seen in absolute values, may be recycled by reflecting the light via the reflective surface back to the partially diffusive reflective layer (and through the light exit window). Further, the light emitting module with a plurality of solid state light emitters has the same advantages as the light emitting module with a single solid state light emitter. In the case of two or more solid state light emitters the total summed area of the top surfaces of the solid state light emitters is used in the calculation of the solid state light emitter area ratio.

In an embodiment the value of the base reflection coefficient is larger than the solid state light emitter reflection coefficient plus a factor c times the difference between 1 and the solid state light emitter reflection coefficient. The value of the factor c depends on the value of a solid state light emitter area ratio which is defined as the ratio between the area of the top surface of the at least one solid state light emitter and the area of the light reflective surface of the base. If the solid state light emitter area ratio is relatively small, i.e. a value that is smaller than 0.1, then a relatively efficient light emitting module is provided if the factor c is larger than or equal to 0.2. If the solid state light emitter area ratio is in an intermediate range, i.e. in a range with a minimum value that is larger than or equal to 0.1 and a maximum value that is smaller than or equal to 0.25, then a relatively efficient light emitting module is provided if the factor c is equal to or larger than 0.3. If the solid state light emitter area ratio is relatively large, i.e. has a value that is larger than 0.25, then a relatively efficient light emitting module is provided if the factor c is equal to or larger than 0.4. The factor c has a maximum value of 1, because a reflection coefficient value cannot be larger than 1. In practice the value of the solid state emitter area ratio ranges between 0 and 1.

Light of the first color range which impinges on the partially diffusive reflective layer is scattered and partially reflected towards the at least one solid state light emitter and the base due to reflections by a surface of the partially diffusive reflective layer and due to internal reflections and due to back scattering in the partially diffusive reflective layer, and is also partially transmitted through the partially diffusive reflective layer.

The at least one solid state light emitter has a limited solid state light emitter reflection coefficient due to its construction, which means that a significant portion of the light which impinges on the at least one solid state light emitter is absorbed by the at least one solid state light emitter. The top surface of the at least one solid state light emitter reflects a relatively small portion of the light which impinges on the top surface, and a relatively large portion of that light is transmitted into the core of the solid state light emitter. The back surface and the semiconductor regions inside the solid state light emitter absorb a significant portion of the light and, as a consequence, a limited amount of light, which enters into the core of the solid state light emitter, is emitted back into the ambient of the solid state light emitter. Often the word 'die' is used for solid state light emitter chip and both terms refer to the semiconductor device in which the light is generated. The semiconductor device includes the semiconductor material which actually generates the light, and also includes electrode, segmentation, vias, back side mirrors, and for example, protection layers. It is to be noted that in some applications solid state light emitters are grown on a light transmitting substrate, for example, sapphire. After the manufacturing, the substrate may still be present on the solid state light emitter die and the light which is generated in the solid state light emitter is emitted through the growth substrate. The term 'top surface' does not refer to a surface of the growth substrate, but to a surface of the solid state light emitter die which emits most of the light. In some embodiments the light emission through the top surface is mainly in the direction of the light exit window.

It was noticed that, if the base reflection coefficient is sufficiently higher than the solid state light emitter reflection coefficient, the efficiency of the light emitting module as a whole substantially improves. Further, a significant improvement was noticed above a certain difference in reflection coefficients dependant on the solid state light emitter area ratio. Thus, according to this embodiment, the base reflection coefficient is at least larger than the value of the solid state light emitter reflection coefficient plus a factor c times the difference between 1 and the value of the solid state light emitter reflection coefficient. If it is assumed that Rbase is the base reflection coefficient and R_SSL is the solid state light emitter reflection coefficient, then this criterion is represented by the formula: $Rbase > R\_SSL + c*(1 - R\_SSL)$. Thus, if the solid state emitter area ratio is relatively small, i.e. smaller than 0.1, meaning that the reflective surface of the base has a relative large area with respect to the area of the top surface of the solid state light emitter, then a relatively efficient lighting module is provided for if $c \geq 0.2$.

As an example, if in this case R_SSL=0.7, then the reflection coefficient of the reflective surface of the base should be larger than or equal to 0.76 to achieve a relatively efficient light emitting module. If the solid state emitter area ratio is in an intermediate range, i.e. is in a range with a minimum value that is larger than or equal to 0.1 and a maximum value that is smaller than or equal to 0.25, meaning that the area of the reflective surface of the base is comparable to the area of the top surface of the solid state light emitter, then a relatively efficient lighting module is provided for if $c \geq 0.3$. As an example, if in this case R_SSL=0.7, then the reflection coefficient of the reflective surface of the base should be larger than or equal to 0.79 to achieve a relatively efficient light emitting module. If the solid state emitter area ratio is relatively large, i.e. is larger than 0.25, meaning that the reflective surface of the base has a relatively small area with respect to the area of the top surface of the solid state light emitter, then the factor c should be larger than or equal to 0.4 to achieve a relatively efficient light emitting module. As an example, if in this case R_SSL=0.7, then the reflection coefficient of the reflective surface of the base should be larger than or equal to 0.82 to provide for a relatively efficient light emitting module.

It should be noted that the reflection coefficients are average numbers over a whole surface to which they relate. The light reflective surface of the base may comprise, for example, areas which are less reflective than other areas, such as by using different materials and/or different reflector layer thicknesses on the base. Further, the reflection of light of different wavelengths may differ, however, preferably the reflection coefficient is a weighted average over a spectral range, which comprises at least light of the first color range, and over an angle of incidence distribution.

In some cases the at least one solid state light emitter is attached to a substrate, for example, a ceramic substrate, and the combination of the substrate and the at least one solid state light emitter is attached to another carrier layer. This carrier layer may for instance be a metal core printed circuit board (MCPCB) also called insulated metal substrate (IMS) or a conventional PCB, such as FR4, or another ceramic carrier, such as alumina or aluminiumnitride. In such situations, the base of the light emitting module is the combination of the another carrier layer and the substrate to which the at least one solid state light emitter is attached. In other words, the base is the combination of materials and/or layers on which solid state light emitter(s) are provided. Consequently, in this specific case, the base reflection coefficient is the weighted average of reflection coefficients of the substrates and the carrier layer. For the avoidance of doubt, in the calculations the area of the reflective surface of the base does not include the area that is covered by the at least one solid state light emitter.

When the solid state emitter area ratio is relatively small, i.e. smaller than 0.1, then a more efficient light emitting module is obtained in case $0.4 \leq c \leq 1$. An even more efficient light emitting module is obtained in this case for $0.6 \leq c \leq 1$. When the solid state emitter area ratio is in an intermediate range, i.e. is in a range with a minimum value that is larger than or equal to 0.1 and a maximum value that is smaller than or equal to 0.25, then a more efficient light emitting module is obtained in case $0.6 \leq c \leq 1$. An even more efficient light emitting module is obtained in this case for $0.84 \leq c \leq 1$. If the solid state light emitter area ratio is relatively large, i.e. larger than 0.25, then a more efficient light emitting module is obtained in case $0.8 \leq c \leq 1$.

In an embodiment the at least one solid state light emitter is provided on the light reflective surface of the base. For the avoidance of doubt, in the calculations the area of the reflective surface of the base does not include the area that is covered by the at least one solid state light emitter. However, in other embodiments the at least one solid state light emitter may be positioned on a network of wires which are provided in between the base and the light exit window. In such an embodiment, the wires carry the solid sate light emitter(s) and provide power to the solid sate light emitter (s). The wire may contain a metal core and a protective plastic cladding and only be electrically attached at point of contact to the substrate or carrier of the emitter, e.g. by a solder joint connection.

In an embodiment, the light emitting module comprises a wall interposed between the base and the light exit window. The base, the wall and the light exit window enclose a cavity. The wall comprises a light reflective wall surface facing towards the cavity and the light reflective wall surface has a wall reflection coefficient which is defined by a ratio between the amount of light that is reflected by the light reflective wall surface and the amount of light that impinges on the light reflective wall surface. In this embodiment an effective reflection coefficient is defined as a weighted average of the base and the wall reflection coefficient, for example weighted corresponding to the sizes of the respective surface areas. In this embodiment the effective reflection coefficient is at least larger than 70% and larger than the solid state light emitter reflection coefficient. Thus, the light emitting module is relatively efficient if the base and the walls combined have the effective reflection coefficient as specified.

In a further embodiment the effective reflection coefficient is at least larger than the solid state light emitter reflection coefficient plus the factor c times the difference between 1 and the solid state light emitter reflection coefficient. The criteria for the factor c are similar as for the embodiment without the walls, the only difference being that the total reflective surface now comprises the reflective surface of the wall and the reflective surface of the base. Thus, the solid state emitter coverage ratio is now defined as the ratio between the area of the top surface of the at least one solid state light emitter and the sum of the area of reflective surface of the base and the area of the reflective wall surface. It is to be noted that, in line with the base and solid state light emitter reflection coefficient, the wall reflection coefficient is a weighted average of reflection of light of a predefined spectrum of light. It is to be noted that the walls may have a further function, such as conducting heat from the partially diffusive reflective layer, which comprises, in this example, luminescent material, towards the base. The base is often coupled to a heat sink and the luminescent layer may become relatively hot as the result of heat generation in case light of the first color range is converted to light of the second color range. The reflective surface of the walls aids in achieving a relatively efficient light emitting module.

In an embodiment, the wall reflection coefficient, i.e. the reflection coefficient of the walls, is at least smaller than 95% and the distance between the top surface of the solid state light emitter and the partially diffusive reflective layer is in a range with a minimum value of 0.3 times the largest linear size of the top surface (or the average value of the largest linear sizes of the top surfaces) and a maximum value smaller than 0.75 times the largest linear size of the top surface (or the average value of the largest linear sizes of the top surfaces) for a relatively small value of the solid state emitter area ratio, i.e. smaller than 0.1. For intermediate values of the solid state emitter area ratio, i.e. in range with a minimum value that is larger than or equal to 0.1 and a maximum value that is smaller than or equal to 0.25, the distance in this case is in a range with a minimum value of 0.15 times the largest linear size of the top surface (or the average value of the largest linear sizes of the top surfaces) and a maximum value smaller than 0.3 times the largest linear size of the top surface (or the average value of the largest linear sizes of the top surfaces). For a relatively large value of the solid state emitter area ratio, i.e. larger than 0.25, the distance in this case is in a range with a minimum value of 0.1 times the largest linear size of the top surface (or the average value of the largest linear sizes of the top surfaces) and a maximum value smaller than 0.2 times the largest linear size of the top surface (or the average value of the largest linear sizes of the top surfaces). The inventors have found that for these criteria a relatively efficient light emitting module is obtained.

In an embodiment, the wall reflection coefficient is larger than or equal to 95% and a relatively efficient light emitting module is obtained if the distance between the top surface of the solid state light emitter and the partially diffusive reflective layer is in a range with a minimum value of 0.75 times the largest linear size of the top surface (or the average value of the largest linear sizes of the top surfaces) and a maximum value of 2 times the largest linear size of the top surface (or the average value of the largest linear sizes of the top surfaces) for a relatively small value of the solid state emitter area ratio, i.e. smaller than 0.1. For intermediate values of the solid state emitter area ratio, i.e. in a range with a minimum value that is larger than or equal to 0.1 and a maximum value that is smaller than or equal to 0.25, the distance in this case is in a range with a minimum value of 0.3 times the largest linear size of the top surface (or the average value of the largest linear sizes of the top surfaces) and a maximum value of 0.7 times the largest linear size of the top surface (or the average value of the largest linear sizes of the top surfaces). For a relatively large value of the solid state emitter area ratio, i.e. larger than 0.25, the distance in this case is in a range with a minimum value of 0.2 times the largest linear size of the top surface (or the average value of the largest linear sizes of the top surfaces) and a maximum value of 0.5 times the largest linear size of the top surface (or the average value of the largest linear sizes of the top surfaces).

In an embodiment of the invention at least a part of the reflective base surface is closer to the partially diffusive reflective layer than the top surface of the solid state light emitter. In this embodiment an efficient light emitting module is obtained if the distance between the top surface and the partially diffusive reflective layer is in a range with a minimum value of $0.4*d_{SSL}+\Delta h/2$ and a maximum value of $5*d_{SSL}+\Delta h/2$ for a solid state light emitter area ratio smaller than 0.1, a minimum value of $0.15*d_{SSL}+\Delta h/2$ and a maximum value of $3*d_{SSL}+\Delta h/2$ for a solid state light emitter area ratio that is in a range with a minimum value that is larger than or equal to 0.1 and a maximum value that is smaller than or equal to 0.25, or a minimum value of $0.1*d_{SSL}+\Delta h/2$ and a maximum value of $2* d_{SSL}+\Delta h/2$ for a solid state light emitter area ratio larger than 0.25. The parameter $d_{SSL}$ is the largest linear size of the top surface of the at least one solid state light emitter and the parameter $\Delta h$ is the absolute value of the difference between the distance between the top surface of the at least one solid state light emitter and the partially diffusive reflective layer and the distance, or the average distance, between the reflective base surface and the partially diffusive reflective layer. In case of a plurality of solid state light emitters, average values are used. In this embodiment the base has, for example, one or more recesses wherein the solid state light emitter(s) are placed.

In an embodiment, the wall comprises at least one of the following materials: aluminium, copper, ceramic like alumina, thermally conductive polymers such as polyamides or spectralon.

In another embodiment, at least one of the light reflective surface of the base and/or the light reflective wall surface comprise a light reflective coating, a light reflective molding, a light reflective ceramic or a light reflective foil. A light reflective coating may be used to increase the reflectivity of the respective light reflective surfaces, thereby improving the efficiency of the light emitting module. In a preferred embodiment, the light reflective surface of the base and/or the wall diffusely scatter light, which may be obtained by means of a white coating. A diffusely scattering surface further improves the light recycling efficiency of the light emitting module. In another embodiment, the light reflective surface of the base and/or the wall may be specularly reflecting, which may be obtained by means of a metal mirror (e.g. protected silver or aluminium). In a further embodiment, the light reflective surface of the base and/or the wall may be a combination of a diffusely scattering material and a specularly reflecting material.

In a further embodiment, the light reflective wall surface is tilted with respect to a normal axis of the base for increasing the reflection of light towards the light exit window. In another further embodiment, the light reflective wall surface is curved for increasing the reflection of light towards the light exit window. Such a tilted wall surface or curved wall surface results in a convex cavity, seen from the interior of the cavity. Further, the tilting or the curving is such that the edges of the light reflective wall surface that touch the base are closer to each other than the edges of the light reflective wall surface that touch the partially diffusive reflective layer. The convex cavity with such a tilted or curved light reflective wall surface better reflects the light which impinges on the light reflective wall surface towards the partially diffusive reflective layer (and thus the light exit window). It is at least partly prevented that light is reflected by the light reflective wall surface to the interior of the cavity which results in more absorption at another reflection point or by the solid sate light emitter. Consequently, the efficiency of the light emitting module increases. This is especially advantageous at a relatively high value of the solid state light emitter area ratio.

In an embodiment, the partially diffusive reflective layer forms the light exit window. The partially diffusive reflective layer has an edge, and the edge of the partially diffusive reflective layer is in contact with the base. A construction according to the embodiment prevents the use of walls between the partially diffusive reflective layer and the base, which may be advantageous in certain applications. In this embodiment the cavity is formed by the light exit window and the base. Further, it may result in a wider angular light output distribution.

In another embodiment, the light emitting module comprises a substantially transparent material arranged between the one or more solid state light emitter(s) and the luminescent layer, the transparent material being optically coupled to the one or more solid state light emitter(s). The substantially transparent material assists in the outcoupling of light from the solid state light emitter. The material of a solid state light emitter has in general a relatively high refractive index, and as such a significant amount of light is caught within the solid state light emitter because of total internal reflection (TIR). The substantially transparent material has a refractive index that is closer to the refractive index of the solid state light emitter than the refractive index of, for example, air, and as a consequence more light is emitted into the transparent material and, consequently, finally out of the light emitting module. The transparent material may have a refractive index close to the refractive index of the solid state light emitter. If the solid state light emitter is of the type of InGaN materials, the refractive index of the emitter is close to 2.4 and a high refractive index glass or ceramic attached to the emitter surface will extract most light from the chip. The transparent material may comprise various materials applied in various layers or as mixtures. For example, a high refractive index ceramic substrate may be bonded with a high index glass or a high index resin to the at least one solid state light emitter. The substantially transparent material may be, for example, a dome or a flat encapsulant placed on the at least one solid state light emitter. In an embodiment, the refractive index of the transparent material is higher than 1.4. In another embodiment, the refractive index of the transparent material is higher than 1.7.

In a further embodiment, the substantially transparent material is optically and thermally coupled to the luminescent layer. For example, the whole space between the base and the partially diffusive reflective layer is filled with the transparent material, and thus, the transparent material is also optically coupled to the partially diffusive reflective layer resulting in less reflection at the interface between the partially diffusive reflective layer and the cavity. Consequently, more light is emitted into the environment of the light emitting module. Further, if the transparent material is in contact with the partially diffusive reflective layer, the transparent material is also thermally coupled to the partially diffusive reflective layer and assists in the heat conduction from the partially diffusive reflective layer towards, for example, the base. It results in a less warm partially diffusive reflective layer, which is, in general, more efficient and has a longer lifetime. For example, in case the partially diffusive reflective layer is a luminescent layer the transparent material thus provides an enhanced thermal contact between the luminescent material and the base compared to an air gap. As air has a thermal conductivity of about 0.025 W/mK, a silicone resin with thermal conductivity of about 0.3 W/mK will provide a better thermal interface, whereas a glass substrate like sodalime glass of about 1.0 W/mK thermal conductivity is even better, whereas a borosilicate glass or a fused silica glass of about 1.3 W/mK, a translucent polycrystalline alumina substrate of about 30 W/mK, and a sapphire substrate of 42 W/mK are much better. Optionally the substantially transparent material may be sintered translucent polycrystalline alumina wherein the grain size is preferably larger than 44 um or preferably smaller than 1 um to provide for a relatively high translucency combined with a very good thermal performance.

In another embodiment, the substantially transparent material comprises at least one of: a transparent resin, a transparent gel, a transparent liquid, a transparent glass, a transparent polymer, and a transparent ceramic. Transparent refers to the absence of substantial light absorption in the spectral region of the first and second wavelength range. Some limited levels of scattering may be allowed in the transparent layers, especially if this scattering is of a forward scattering type. Hence, some scattering centers may be allowed in the substantially transparent material in between the luminescent material and the base, for example by using a translucent layer of a slightly hazy material.

In a further embodiment, the luminescent material comprises at least one of: an inorganic phosphor, an organic phosphor, a ceramic phosphor and quantum dots, or another fluorescent material, or a mixture of these. It is to be noted that the luminescent layer may comprise a carrier layer, for example a glass substrate, and a layer of luminescent material, or that the luminescent layer comprises randomly distributed particles of the luminescent material in a carrier layer, or in the case of a ceramic phosphor, substantially the whole luminescent layer is the luminescent material. It is also noted that the luminescent layer may consist of various separate luminescent layers stacked or closely spaced. Different luminescent materials may be used in the different layers. However, the luminescent materials may also be mixed together in the same layers(s). Examples of inorganic luminescent materials may include, but are not limited to, Ce doped YAG ($Y_3Al_5O_{12}$) or LuAG ($Lu_3Al_5O_{12}$). Ce doped YAG emits yellow light, and Ce doped LuAG emits yellow-green light. Examples of other inorganic luminescent materials which emit red light may include, but are not limited to ECAS (ECAS, which is $Ca_{1-x}AlSiN_3:Eu_x$; with $0 \leq x \leq 1$; especially $x \leq 0.2$) and BSSN (BSSNE, which is $Ba_{2-x-z}M_xSi_{5-y}AlyN_{8-y}O_y:Eu_z$ (M=Sr, Ca; $0 \leq x \leq 1$, especially $x \leq 0.2$; $0 \leq y \leq 4$, $0.0005 \leq z \leq 0.05$).

In an embodiment, the light exit window further comprises a diffuser layer for obtaining a diffuse light emission, for obtaining a spatially, color and color over-angle uniform light emission, and for obtaining a color mixed light emission. The light exit window may also comprise a dichroic layer for correcting color over angle variations or light uniformity. In addition to influencing the light emission characteristics by the luminescent layer, other optical layers may also be used to influence the characteristics of the light that is emitted through the light exit window into the environment of the light emitting module, such as for example an optical element for providing a desired light beam shape.

In an embodiment a diffuser layer for obtaining a diffuse light emission, for obtaining a spatially, color and color over-angle uniform light emission, and for obtaining a color mixed light emission is provided at a distance from a side of the partially diffusive reflective layer facing away from the at least one solid state light emitter.

In an embodiment a polarizing element is positioned at a side of the partially diffusive reflective layer facing away from the at least one solid state light emitter.

According to a second aspect of the invention a lamp is provided which comprises the light emitting module according to the invention. The lamp may comprise a plurality of light emitting modules. The lamp may comprises a retrofit light bulb, a retrofit parabolic aluminized reflector (PAR) lamp, a spot lamp, a downlighter lamp, a retrofit halogen lamp or a retrofit light tube.

According to a third aspect of the invention, a luminaire is provided which comprises a light emitting module according to the invention or which comprises a lamp according to the invention. The luminaire may comprise a plurality of light emitting modules.

According to a fourth aspect of the invention a display device is provided which comprises the light emitting module according to the invention. In use, the light emitting module may act as a backlighting unit for a LCD display device. As the light emitting module generates relatively efficient (polarized light), the cost level of the display device is reduced.

The lamp, luminaire and the display device according to, respectively, the second, third and fourth aspect of the invention provide the same benefits as the light emitting module according to the first aspect of the invention and have similar embodiments with similar effects as the corresponding embodiments of the light emitting module.

In this context, light of a color range typically comprises light having a predefined spectrum. The predefined spectrum may, for example, comprise a primary color having a specific bandwidth around a predefined wavelength, or may, for example, comprise a plurality of primary colors. The predefined wavelength is a mean wavelength of a radiant power spectral distribution. In this context, light of a predefined color also includes non-visible light, such as ultraviolet light. The light of a primary color, for example, includes Red, Green, Blue, Yellow and Amber light. Light of the predefined color may also comprise mixtures of primary colors, such as Blue and Amber, or Blue, Yellow and Red. It is to be noted that the first color range may also comprise light which is invisible for the human eye, such are ultra violet light or infrared light. The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-590 nm. The terms "orange light" or "orange emission" especially relate to light having a wavelength in the range of about 590-620 nm. The terms "red light" or "red emission" especially relate to light having a wavelength in the range of about 620-750 nm. The terms "amber light" or "amber emission" especially relate to light having a wavelength in the range of about 575-605 nm. The terms "visible" light or "visible emission" refer to light having a wavelength in the range of about 380-750 nm.

These and other aspects of the invention are apparent from and will be elucidated with reference to the embodiments described hereinafter.

It will be appreciated by those skilled in the art that two or more of the above-mentioned embodiments, implementations, and/or aspects of the invention may be combined in any way deemed useful.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Modifications and variations of the light emitting module, lamp, luminaire, and/or display device which correspond to the described modifications and variations of the light emitting module, can be carried out by a person skilled in the art on the basis of the present description.

Figure 1A:
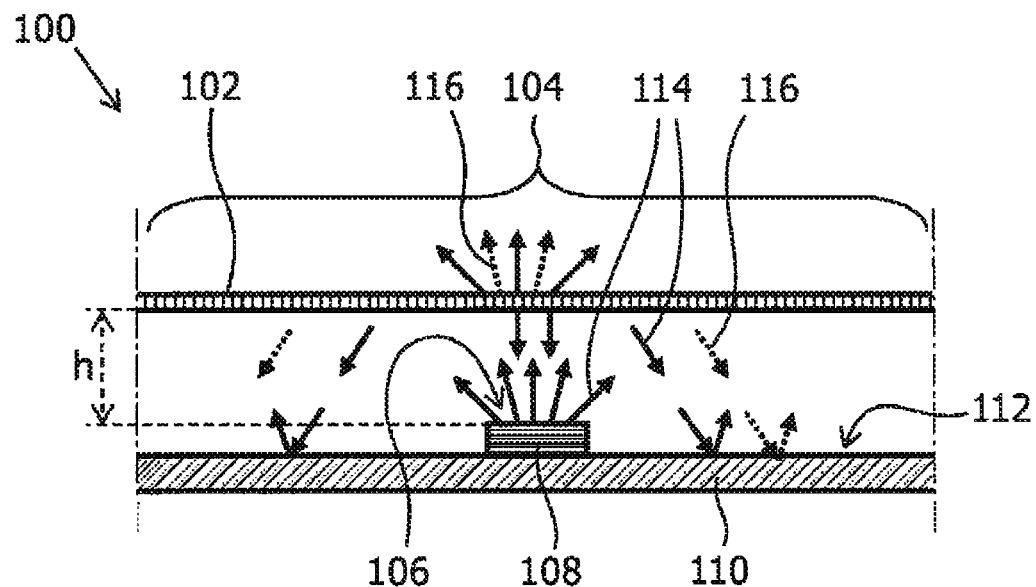
FIGS. 1a and 1b schematically show cross-sections of embodiments of a light emitting module according to the invention, FIGS. 2a and 2b schematically show a top-view of embodiments of a light emitting module according to the invention, FIG. 3a schematically shows an embodiment of a light emitting module according to the invention comprising a cavity, FIG. 3b schematically shows an embodiment of a light emitting module according to the invention having a cylindrical shape, FIGS. 4a and 4b schematically show embodiments of a cross-section of the embodiment of a light emitting module according to the invention comprising the cavity, FIGS. 5a and 5b schematically show a plurality of cross-sections of embodiments of the light emitting module according the invention, FIG. 6 schematically shows a plurality of cross-sections of embodiments of light emitting modules according to the invention with a luminescent layer forming the light exit window and the edge of the luminescent layer touching the base, FIGS. 7a and 7b schematically show cross-sections of embodiments according to the invention of a flexible light emitting module, FIGS. 8a, 8b and 8c schematically show cross-sections of embodiments of a light emitting module according to the invention.

It should be noted that items denoted by the same reference numerals in different Figures have the same structural features and the same functions, or are the same signals. Where the function and/or structure of such an item have been explained, there is no necessity for repeated explanation thereof in the detailed description.

The figures are purely diagrammatic and not drawn to scale. Particularly for clarity, some dimensions are exaggerated strongly

DETAILED DESCRIPTION OF THE EMBODIMENTS

A first embodiment is shown in FIG. 1a which shows a cross-section of a light emitting module 100 according to the first aspect of the invention. The light emitting module 100 has a light exit window 104. The light exit window 104 in this embodiment is formed by a luminescent layer 102 which comprises luminescent material. The luminescent material converts at least a part of light of a first color range 114 which impinges on the luminescent material into light of a second color range 116. At another side of the light emitting module 100 a base 110 is provided which has a light reflecting surface 112 that faces towards the light exit window 104. On the base 110 a solid state light emitter 108 is provided which emits, in use, light of the first color range 114 towards a part of the light exit window 104. The base is typically provided with electrode structures to contact the dies or plurality of dies of the solid state light emitter 108 to provide electrical power. The electrode structures are not shown in the Figures. The surface of the base 110 which is covered by the solid state light emitter 108 is not included in the light reflective surface 112 of the base 110.

The light reflective surface 112 has a base reflection coefficient Rbase, which is defined by a ratio between an amount of light that is reflected by the light reflective surface 112 and an amount of light that impinges on the light reflective surface 112. The solid state light emitter 108 has a solid state light emitter reflection coefficient R_SSL, which is defined by a ratio between an amount of light that is reflected by the solid state light emitter 108 and an amount of light that impinges on solid state light emitter 108. It is noted that the reflection coefficients both are an average of the reflection coefficients related to light of different wavelengths, for example, an (weighted) average over light of the first color range 114 and light of the second color range 116.

The luminescent layer 102 is not positioned directly on a top surface 106 of the solid state light emitter 108, but it is arranged at a distance h from the solid state light emitter 108. If the solid state light emitter 108 emits light of the first color range 114, at least a part of the light of the first color range 114 is reflected by the luminescent layer 102 towards the base 110 and the solid state light emitter 108. The part of the light of the first color range 114 is reflected by the luminescent layer 102 because of reflection at a surface at which the light impinges, or because of internal reflection or backscattering. The light which is reflected back, partially impinges on the solid state light emitter 108 and partially impinges on the light reflective surface 112 of the base 110.

Another part of the light of the first color range 114 may be transmitted through the luminescent layer 102 into the environment of the light emitting module 100. A further part of the light of the first color range 114 is converted by the luminescent material into light of the second color range 116. The luminescent material emits the light of the second color range 116 in a plurality of directions and, consequently, a part of the light of the second color range 116 is emitted into the environment of the light emitting module 100, and another part of the light of the second color range 116 is emitted towards the base 110 and the solid state light emitter 108.

The light which impinges on a top surface 106 of the solid state light emitter 108 is partially reflected and partially transmitted into the semiconductor material of the solid state light emitter 108. Inside the solid state light emitter 108 a part of the light is absorbed and some other part of the light is reflected back towards the top surface 106 and emitted back towards the light exit window 104. The value of the solid state light emitter reflection coefficient R_SSL defines which part of the impinging light is reflected back, and the value (1−R_SSL) defines how much of the impinging light is absorbed by the solid state light emitter 108. In practice, the solid state light emitter 108 has a relatively low value of the solid state light emitter reflection coefficient R_SSL, generally in the order of 0.7.

The light which is reflected, scattered, i.e. diffusive reflected, or emitted by the luminescent layer towards the base 110 and which does not impinge on the solid state light emitter 108 is to a large extent reflected by the light reflective surface 112 of the base 110. However, a small amount of light may still be absorbed at the surface or in the underlying layers. The base reflection coefficient Rbase defines which part of the impinging light is reflected back by the light reflective surface 112, and the value (1−Rbase) defines how much of the impinging light is absorbed by the light reflective surface 112.

The value of the base reflection coefficient Rbase and the solid state light emitter reflection coefficient R_SSL is always a value between 0 and 1. It is to be noted that the amount of light which is generated by the solid state light emitter 108 is not taken into account when determining the solid state light emitter reflection coefficient R_SSL. The part of light which is reflected is a part of the amount of light which impinges on the solid state light emitter 108.

According to the invention, the value of the base reflection coefficient Rbase is at least larger than the value of the solid state light emitter reflection coefficient R_SSL. Preferably, the value of the base reflection coefficient Rbase is at least larger than the value of the solid state light emitter reflection coefficient R_SSL plus a factor c times the difference between 1 and the solid state light emitter reflection coefficient R_SSL. Thus, Rbase>R_SSL+c·(1−R_SSL). Thus, the light reflective surface 112 is, on average, more light reflective than the solid state light emitter 108 with a value that is at least a value of c times the difference between a full reflective solid state light emitter, i.e. a reflectivity of 100%, and the actual reflectivity of the used solid state light emitter 108. The factor c is dependent on the total area of the solid state light emitter 108 with respect to the total reflective area of the base 110, which is hereafter called the solid state light emitter area ratio $\rho_{SSL}$: $\rho_{SSL}$=(A_SSL/Abase), in which A_SSL represents the total area of the top surface 106 of the solid state light emitter 108 and Abase represents the total area of the reflective surface 112 of the base 110. In practice the solid state light emitter area ratio $\rho_{SSL}$ has a maximum value of 1.0. If the value of the solid state light emitter area ratio $\rho_{SSL}$ is smaller than 0.1, i.e. $\rho_{SSL}$<0.1, indicating a relatively large reflective area of the base 110 with respect to the area of the top surface 106 of the solid state light emitter 108, then the factor c should fulfill the criterion c≥0.2 in order to have a relatively efficient light emitting module. If 0.1≤$\rho_{SSL}$≤0.25, indicating a reflective area of the base 110 that is comparable to the area of the top surface 106 of the solid state light emitter 108, then the factor c should fulfill the criterion c≥0.3 in order to have a relatively efficient light emitting module. If $\rho_{SSL}$>0.25, indicating a relatively small reflective area of the base 110 with respect to the area of the top surface 106 of the solid state light emitter 108, then the factor c should fulfill the criterion c≥0.4 in order to have a relatively efficient light emitting module. The value of the factor c in all cases is in practice smaller than 1.0.

Because a substantial amount of light is reflected, scattered or emitted by the luminescent layer 102 in a direction away from the luminescent layer 102 towards the base 110, it is advantageous to reuse this light by reflecting the light back to the light exit window 104 to improve the efficiency of the light emitting module 100. The solid state light emitter reflection coefficient R_SSL can often not be chosen because it is a fixed characteristic of the specific solid state light emitter 108 that has to be used in the light emitting module 100. Therefore, in order to improve the efficiency of the light emitting module 100, it is advantageous to have the light reflective surface 112 of the base 110 which better reflects impinging light than the solid state light emitter 108. Further, it has been found that a significant efficiency improvement may be obtained if Rbase>R_SSL+c·(1−R_SSL).

The inventors have further found that even more efficient light emitting modules are achieved if c≥0.4 for 0.0<$\rho_{SSL}$<0.1, c≥0.6 for 0.1≤$\rho_{SSL}$≤0.25, and c≥0.8 for $\rho_{SSL}$>0.25. Still more efficient light emitting modules are achieved if c≥0.6 for 0.0<$\rho_{SSL}$<0.1 and c≥0.84 for 0.1≤$\rho_{SSL}$≤0.25.

The properties of partially diffusive reflective light are important for achieving an efficient light emitting module according to the efficient and therefore according to the invention the luminescent layer can also be replaced by another layer that has partially diffusive reflective properties wherein incident light is partially reflected diffusively and partially transmitted.

Depending on the application, there are different requirements for light emitting modules with respect to their lumen output and the size of the light emitting area of the light emitting module and the solid state light emitter. For applications where a certain angular distribution of light intensity is needed, usually beam-shaping optical elements are applied. To convert the beam profile of a solid state light emitter light beam, which is usually close to a Lambertian emitter profile, into a collimated beam it is necessary to keep the initial light emitting size relatively small. In this case the brightness of the light emitting module should be relatively high, which is determined by the lumen output and related to the total area of the light emitting surface 106 of the solid state light emitter 108, which, for example, can also be increased by employing more than one solid state light emitter 108. For these applications a relatively high solid state light emitter area ratio $\rho_{SSL}$ is needed. An example is a module for a retrofit halogen lamp.

In applications in which there are no strict requirements to brightness levels of the light emitting module, the specific beam shape or the total emitting area of the solid state light emitter 108, it is preferred to have a relatively large reflective base surface 112 with respect to the partially absorbing surface 106 of the solid state light emitter 108 in order to provide for a more efficient light recycling and higher efficiency. For these applications a relatively low solid state light emitter area ratio $\rho_{SSL}$ is preferable. An example is a high lumen package realized in retrofit bulb applications which imposes only limited restrictions to the geometry of the light emitting module.

It should be noted that the reflection coefficients are average numbers over a whole surface to which they relate. The light reflective surface of the base may comprise, for example, areas which are less reflective than other areas. Further, the reflection of light of different wavelengths and at different angles of incidence may differ. Preferably the reflection coefficient is averaged over a spectral range and over an angle of incidence distribution, for example, over the spectral range of daylight, or over a spectral range which comprises specific quantities of the first color range and of the second color range. Measuring a reflectivity coefficient is often performed by pointing a collimated light beam of the spectral range to the object of which the reflectivity has to be measured and measuring the amount of reflected light. This is typically done at one or more angles of incidence and the reflection coefficient is a weighted average of the obtained reflection coefficients in case of different angles of incidence, wherein the weight factor depends on the amounts of light which impinge at the various angles of incidence on the object in the light emitting module.

In some cases the solid state light emitter is attached to a substrate, for example, a ceramic or silicon substrate, and the combination of the substrate and the solid state light emitter are attached to another carrier layer. This carrier layer may for instance be a metal core printed circuit board (MCPCB) also called insulated metal substrate (IMS) or a conventional PCB, such as FR4, or another ceramic carrier, such as alumina or aluminiumnitride or a silicon substrate. In such situations, the base of the light emitting module is the combination of the another carrier layer and the substrate to which the solid state light emitter is attached. In other words, the base is the combination of materials and/or layers on which the solid state light emitters are provided. Consequently, in this specific case, the base reflection coefficient is the weighted average of reflection coefficients of the substrates and the carrier layer. It is not necessary that the substrate, to which the solid state light emitter is attached, or the carrier substrate is completely flat. Typically there will be metal electrodes present on the substrates with a physical height, such as conductive copper tracks to supply power to the emitters. Also, there may be heat spreading layer applied to the surface. Part of the substrate of carrier may be locally thicker to achieve an additional support structure, e.g. for clamping the module or attaching collimators to the module or to define a rim, e.g. to separate optical functions from electrical functions. Other electrical components may be present on the substrate or carrier, such as capacitors, temperature sensors like NTCs, resistors, ESD protection diodes, Zener diodes, varistors, photo sensors such as a photodiode, or integrated circuits (ICs). These components may likely be placed outside the circumference of the optical exit window, but in principle could also be placed inside the circumference of the optical exit window. In the latter case they will contribute to the average reflectance of the base. These components may be covered with a reflective layer to minimize optical losses.

Figure 1B:
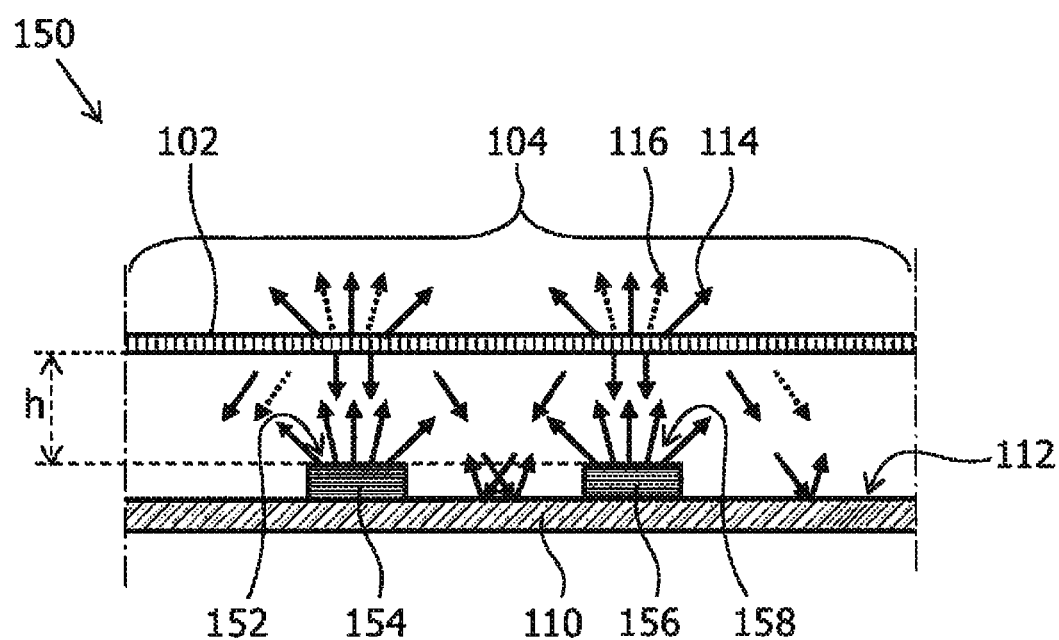

FIG. 1b shows another embodiment of a light emitting module 150 according to a first aspect of the invention. Light emitting module 150 has a similar structure as light emitting module 100, however, a plurality of solid state light emitters 154, 156 are provided which emit light of the first color range 114 towards the luminescent layer 102. With respect to the light emitting module 150, the solid state emitter light reflection coefficient R_SSL is defined as the average of the light reflection coefficients of the plurality of solid state light emitters 154, 156.

As seen in FIG. 1b, the solid state light emitter area ratio $\rho_{SSL}$, of the light emitting module 150 is larger than such a ratio of the light emitting module 100, wherein for the calculation of $\rho_{SSL}$, the total summed area of the top surfaces 152, 158 of the solid state light emitters should be substituted for A_SSL. Thus, in the light emitting module 150 a relatively larger amount of light impinges on the solid state light emitters 154, 156, and thus a relatively larger amount of light is absorbed by the solid state light emitters 154, 156 than in the light emitting module 100. The light emitting module 150 is an example of a light emitting module in which the area ratio $\rho_{SSL}$, is larger than 0.25 and wherein the value of the factor c should be larger than or equal to 0.4 in order to have a relatively efficient light emitting module.

It is to be noted that in other embodiments, the different solid state light emitters 154, 156 emit different color ranges. Furthermore, the luminescent layer 102 may comprise different luminescent materials each having a different conversion characteristic such that the light which is transmitted through the light exit window 104 comprises more than only the first color range 114 and the second color range 116.

In FIG. 1a and FIG. 1b each one of the solid state light emitters 108, 154, 156 has a top surface 106, 152, 158 which is facing towards the light exit window 104 and the luminescent layer 102. The top surfaces 106, 152, 158 are surfaces through which light of the first color range 114 is dominantly emitted in the direction of the luminescent layer. The distance between the top surfaces 106, 152, 158 of the solid state light emitters 108, 154, 156 and the surface of the luminescent layer 102 that faces the top surfaces 106, 152, 158 is the distance h which is defined as the length of the shortest linear path between the top surfaces 106, 152, 158 of the solid state light emitters 108, 154, 156 and the surface of the luminescent layer 102 that faces the top surfaces 106, 152, 158.

The inventors have found experimentally that the optical effect of more reflection by the light reflective surface is not the only factor which contributes to a higher light output. A gap and a distance h between the solid state light emitter(s) 108, 154, 156 and the luminescent layer 102, also contributes to the efficiency and light output of the light emitting module. Each one of the top surfaces 106, 152, 158 has a largest linear size $d_{SSL}$, being defined as the largest linear distance along a line on the top surface 106, 152, 158. If the top surfaces are circular, the largest linear size $d_{SSL}$, is the length of the diameter of the circle. If the top surface has the shape of a square or a rectangle, the largest linear size $d_{SSL}$, is the length of the diagonal of the square or of the rectangle. The inventors have realized that, if the distance h is too small, too much light impinges back on the solid state light emitters 108, 154, 156 such that too much light is absorbed by the solid state light emitters 108, 154, 156. And the inventors have further realized that, if the distance h is larger than a specific value, the amount of light is emitted back to the solid state emitters 108, 154, 156 compared to the amount of light which is emitted back to the light reflective surface, may be such that no significant efficiency improvement may be obtained in case the distance h is further increased. Furthermore, the inventors have found that the range of values of the distance h which results in a relatively efficient light emitting module, depends on the solid state light emitter area ratio $\rho_{SSL}$. The distance h between the top surfaces 106, 152, 158 and the luminescent layer 102 is preferably in a range that has a minimum value of 0.3 times the largest linear size $d_{SSL}$ of the top surfaces 106, 152, 158 and has a maximum value of 5 times the largest linear size $d_{SSL}$ of the top surfaces 106, 152, 158 for $\rho_{SSL}$<0.1. For $0.1 \le \rho_{SSL} \le 0.25$ the distance h between the top surfaces 106, 152, 158 and the luminescent layer 102 is preferably in a range that has a minimum value of 0.15 times the largest linear size $d_{SSL}$ of the top surfaces 106, 152, 158 and has a maximum value of 3 times the largest linear size $d_{SSL}$ of the top surfaces 106, 152, 158. For $\rho_{SSL}$>0.25 the distance h between the top surfaces 106, 152, 158 and the luminescent layer 102 is preferably in a range that has a minimum value of 0.1 times the largest linear size $d_{SSL}$ of the top surfaces 106, 152, 158 and has a maximum value of 2 times the largest linear size $d_{SSL}$ of the top surfaces 106, 152, 158.

The light emitting modules 100 and 150 may be even more efficient if in the above presented formulas and criteria the factor c is larger than the values mentioned above. An efficiency increase in the order of 40% may be obtained with respect to a solid state light emitter with a luminescent layer directly on the top surface.

In light emitting module 150 a plurality of light emitters 154, 156 are provided, and each one of the plurality of light emitters 154, 156 may have a different distance to the luminescent layer 102. If the distances are different, the average of the distances should be in one of the ranges that are defined above. If the solid state light emitters 154, 156 each have a different shape and/or size of their top surfaces 152, 158, the largest linear size $d_{SSL}$ is defined as the average of the largest linear sizes $d_{SSL}$ of the top surfaces of the plurality of solid state light emitters 154, 156.

If there is a gap and a distance h between the solid state light emitter(s) 108, 154, 156 and the luminescent layer 102, the solid state light emitter(s) 108, 154, 156 does not become as warm as it would be in the case that the luminescent layer 102 is positioned on top of, or very close to, the solid state light emitter(s) 108, 154, 156. In this case, the luminescent layer 102 is not directly thermally coupled to the solid state light emitter(s) 108, 154, 156 and provides or receives to a lesser extent the heat of the solid state light emitter(s) 108, 154, 156. The efficiency of the luminescent material is higher if the temperature of the luminescent material is kept within acceptable limits. Further, the efficiency of the solid state light emitter(s) 108, 154, 156 is higher if the temperature of the solid state light emitter(s) 108, 154, 156 is kept within acceptable limits. Thus, the distance h between the solid state light emitter(s) 108, 154, 156 and the luminescent layer 102 results in the photothermal effect of a more efficient luminescent layer 102. Further, the distance h between the solid state light emitter(s) 108, 154, 156 and the luminescent layer 102 results in a more uniform light flux distribution through the luminescent layer 102 instead of a relatively high light flux in a very specific area of the luminescent layer 102. Luminescent materials tend to be sensitive to photosaturation, which means that above a certain flux value, the luminescent material converts light at a lower efficiency. Also some luminescent materials or binders of these materials, such as organic phosphors or organic binders, tend to be sensitive to photodegradation, which means that above a certain flux value, the luminescent material or the binder starts to degrade which typically results in a lowering of efficiency. Thus, by creating a distance h between the solid state light emitter(s) 108, 154, 156 and the luminescent layer 102 photosaturation of the luminescent material and photodegradation effects are prevented. Also the distance h aids in achieving a more uniform light output distribution in the exit window and aids to mix color distributions between the first spectral range(s) and the second spectral range(s). So both the spatial and angular color homogeneity is improved. This may be further enhanced with a diffuser or dichroic layer on top of the solid state light emitter or in the light exit window.

The solid state light emitter(s) 108, 154, 156 may be light emitting diode(s) (LEDs), organic light emitting diode(s) (OLEDs), or, for example, laser diode(s), for example vertical-cavity surface-emitting laser(s) (VCSEL).

Figure 2A:
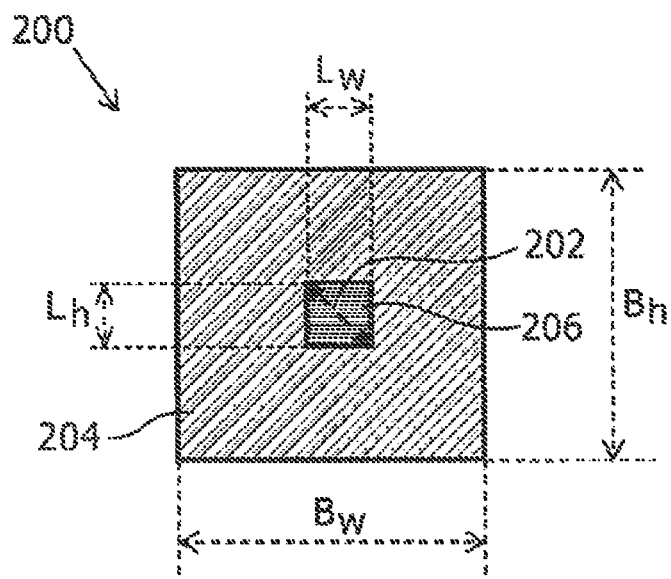
Figure 2B:
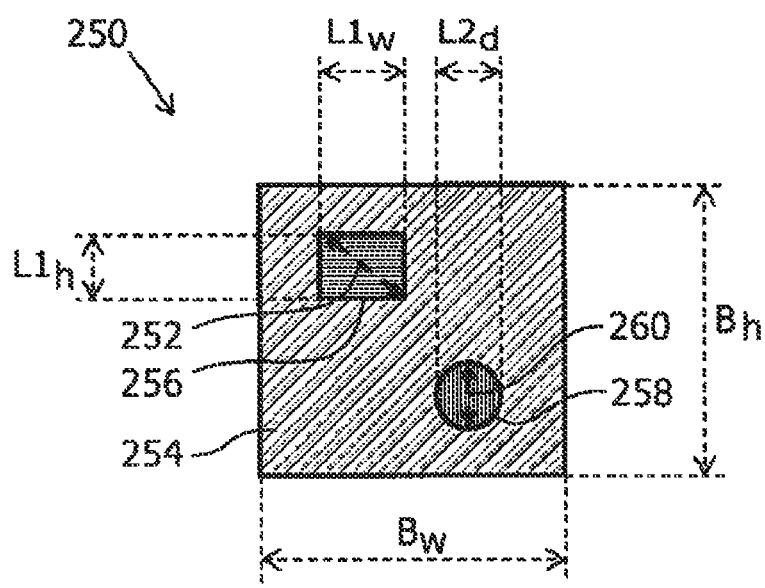

FIG. 2a and FIG. 2b present top views of light emitting modules 200, 250 according to the first aspect of the invention. The presented top views are seen if one faces towards a surface of the base of the light emitting modules 200, 250 on which the solid state light emitters are provided via the light exit window. It is to be noted that the luminescent layer is not drawn in FIGS. 2a and 2b.

In FIG. 2a a light reflective surface 204 of a base and a top surface 206 of a solid state light emitter is drawn. Arrow 202 indicates the largest linear size $d_{SSL}$ of the top surface 206 of the solid state light emitter. The area of the top surface 206 of the solid state emitter is $L_w L_h$. The area of the light reflective surface 204 of the base is $(B_w B_h - L_w L_h)$, which is the total area of the base minus the area of the base that is occupied by the solid state light emitter. Thus, the area of the light reflective surface 204 of the base does not include the area of the base that is covered by the solid state light emitter.

FIG. 2b shows a light reflective surface 254, a first top surface 256 of a first solid state light emitter, and a second top surface 258 of a second solid state light emitter. A largest linear distance of the rectangular first solid state emitter is indicated by arrow 252. The area of the first top surface 256 of the first solid state light emitter is $L1_w L1_h$. The second top surface 258 of the second solid state light emitter is circular and its diameter is indicated with arrow 260. The area of the second top surface 258 of the second solid state light emitter is $\frac{1}{4}\pi(L2_d)^2$. The area of the light reflective surface 254 of the base is in this case $(B_w B_h - L1_w L1_h - \frac{1}{4}\pi(L2_d)^2)$.

Figure 3A:
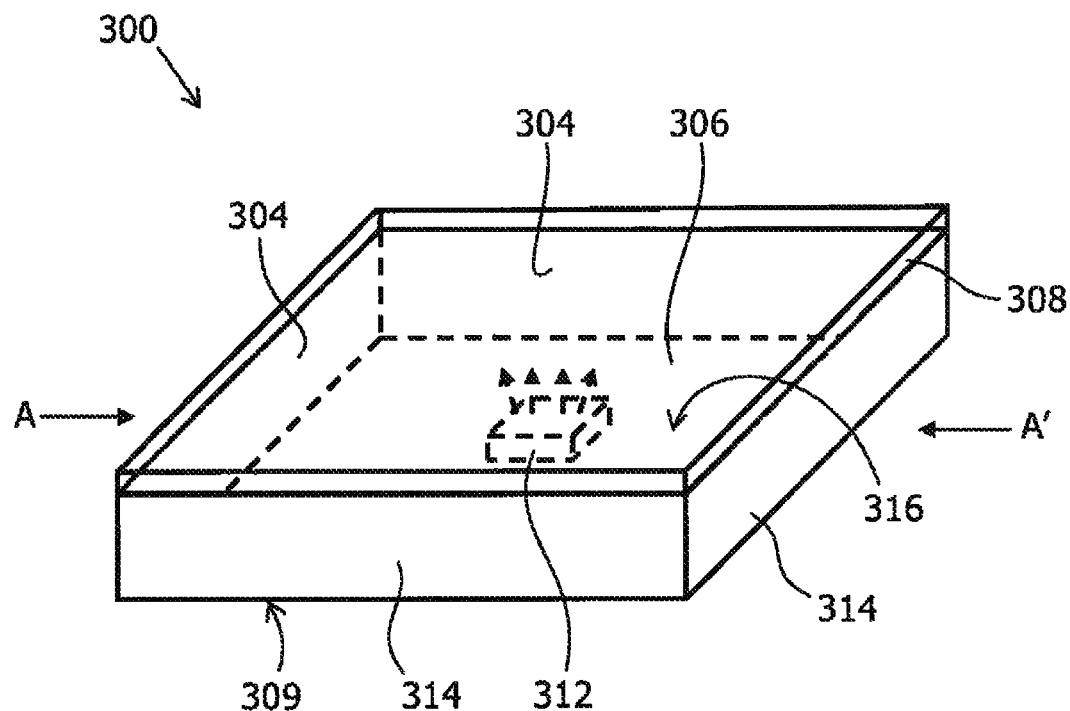

FIG. 3a presents an embodiment of a light emitting module 300 which comprises a cavity 316. The light emitting module 300 comprises a base 309 which has a light reflective surface 306 inside the cavity 316. On the light reflective surface 306 is provided a solid state light emitter 312 which emits light in a first color range towards the light exit window. The light exit window is formed by a luminescent layer 308. In between the base 309 and the luminescent layer 308 walls 314 are provided, in this case four walls 314. The inner surfaces 304 of the walls 314 are light reflective and have a wall reflection coefficient Rwall. The wall reflection coefficient is the ratio between an amount of light which is reflected by the light reflective surface 304 of the walls 314 and an amount of light which impinges on the light reflective surface 304 of the walls 314. The solid state light emitter 312 has a solid state light emitter reflection coefficient R_SSL. The light reflective surface 306 of the base 309 has a base reflection coefficient Rbase. The definition of the base and the solid state light emitter reflection coefficient are given in the description of FIGS. 1a and 1b.

The walls 314 may consist of various materials. The wall material may provide a high reflectivity such as when using a scattering ceramic such as reflective alumina, zirconia or other ceramics, a scattering glass, a scattering pigmented polymer, such as white polyamide; or scattering fluorpolymers, like Spectralon or a scattering silicone resin. The walls 314 may also consist of a metal material such as aluminium or silver. The metal may be a metal foil or film, such a highly reflective commercial metal mirrors with the trade name of Alanod.

The wall material may also be of low reflectivity and covered with a reflective layer. In this case the wall may comprise another material like a thermally conductive polymer, such as a carbon filled plastic, e.g. a polyamide, or metallic materials like copper, nickel, stainless steel or ceramic materials such as aluminium nitride (AlN). These materials typically have a high thermal conductivity which is beneficial, e.g. copper=~400 W/mK, AlN=~140 W/mK. The reflective layer may be a coating, a film or a thin layer. The reflective layer may for example be a casted, dipped, dispensed or sprayed layer of white silicone or a white solgel, for example an alkylsilicate based material, pigmented with scattering particles such as $TiO_2$ or $ZrO_2$. Or the reflective layer may for example be a thin metal coating such as protected silver or aluminium which may be evaporated or sputtered on the wall material. The walls 314 may come in a variety of shapes such as, for example, circular such as a ring, cylindrical, squared or triangular. The wall may contain surface structures such as fins in order to facility cooling.

The wall material may also consist of a thin film layer, such as the reflector coating or film only. In this case the wall reflector may cover the edges of a solid material present between the base and the luminescent material, such as the circumference of a glass or ceramic substrate.

The wall may be a diffuse reflector or a specular reflector. In some embodiments a specular reflecting wall shows a better performance than a diffuse reflecting wall, and in other embodiments a diffuse reflecting wall shows a better performance than a specular reflecting wall.

Further, the base 306 and the walls 314 may comprise a heat conducting material. The luminescent layer 308 preferably is thermally connected to the walls 314 at the edges of the luminescent layer 308. For example, a heat conducting paste or heat conducting adhesive may be used to connect the luminescent layer 308 to the walls 314. At the base 306 an interface to a heat sink (not shown) may be provided. The base 306 may be part of the heat sink, or the base 306 may constitute the heat sink. The solid state light emitter 312 is provided within the cavity 316 and is applied to the light reflective base 306. The contact between the solid state light emitter 312 and the light reflective base 306 is such that the solid state light emitter 312 is thermally coupled to the base 306. The solid state light emitter 312 may be soldered, or glued with a heat conducting adhesive, for example a metal particle filled adhesive, to the light reflective base 306. The base 306 of the cavity 316 and/or the walls 314 may contain thermal vias to further improve heat transfer. For example, the base 306 may be made of an aluminum oxide ceramic that contains through holes which are metalized with copper. The copper has a higher thermal conductivity (approx. 400 W/mK compared to the aluminum oxide (20-30 W/mK). The solid state light emitter 312 may also be connected with electrical vias through the base 306 of the cavity 316 to a power source. The electrical vias may also conduct heat.

The luminescent layer may comprise phosphors for converting light in the first color range into light of the second color range. The second color range is preferable different from the first color range—however, the ranges may partially overlap. The phosphor may be a yellow phosphor like YAG:Ce, LuAG:Ce or LuYAG:Ce, for partial conversion of blue light generated by the solid state light emitter to yellow light such that a combined substantial white light emission may be obtained. In another embodiment the phosphor may be a full conversion phosphor like BSSNE:Eu or ECAS:Eu for fully converting blue light to amber light or red light, respectively. The luminescent layer may comprise a combination of phosphors, e.g. YAG:Ce and ECAS:Eu to obtain a warmer white light emission.

The conversion of the light of the first color range into light of the second color range has a high efficiency, however, some light is absorbed and converted into heat. Especially with high power solid state light emitters the amount of absorbed energy may be relatively high. The efficiency of the luminescent layer may degrade if the luminescent layer 308 becomes too hot, for example more than 200° C. Further, the luminescent layer may comprise materials which degrade at high temperatures such that their light emission characteristics degrade as well. In the light emitting module the generated heat is transferred via the walls and the base towards a heat sink. As such the luminescent layer does not become too hot.

The luminescent layer may be a ceramic phosphor which is manufactured to a fused macroscopic body via sintering of powder particles of phosphor or from precursor powders that form the phosphor in a reactive sintering process. Such a ceramic phosphor is produced in plates and these plates are mechanically diced to give a proper size matching the light exit window. It is to be noted that a single sheet of luminescent material, like a sheet of the ceramic phosphor, may cover a plurality of neighboring cavities.

A ceramic phosphor is a relative good thermal conductor. The thermal conductivity depends on the type of ceramic phosphor and the residual porosity. As an example typical thermal conductivity for a ceramic Ce doped YAG phosphor is 9-13 W/mK at room temperature. A typical thermal conductivity of a powder phosphor layer in a binder resin such as a silicone or organic polymer is dominated by the binder with a thermal conductivity of about 0.15-0.3 W/mK. The ceramic phosphor layer may be around 10-300 micron in thickness, typically about 100 micron, and is therefore rigid, self-supporting, hence no additional supporting substrate is need for the luminescent layer.

The luminescent layer may also be a substrate of glass on which a layer of a translucent resin comprising phosphor particles is deposited. For example, a powder with phosphor particles which are dispersed in a binder, typically a silicone resin. Preferably however, the binder is a better heat conducting material such as a glass or sol-gel derived silicate or alkylsilicate with a typical heat conductivity around 1 W/mK. The luminescent layer may also be sandwiched in between two other layers, for example the luminescent layer is applied on a glass layer and on top of the luminescent layer a glass layer is applied, which improves the spreading of heat. Examples of other layer combinations are ceramic layer—luminescent layer—glass layer and ceramic layer—luminescent layer—ceramic layer.

In an embodiment, an additional layer is placed on top of the luminescent layer which acts as a diffuser such that the light emitting module 300 emits light in a plurality of output directions with improved angular color uniformity. The luminescent layer will convert light travelling more or less perpendicular through the luminescent layer less than light travelling at large angles with the normal. In case a partial converted luminescent layer is used this induces more light (typically of blue color) to be emitted near the normal angle than at large angles. This leads to unacceptable color variations with angle. The diffuser scrambles the light prior to emission towards the ambient to improve the color-over-angle uniformity. The diffuser is preferably dominantly forward scattering.

Alternatively a dichroic or interference layer may be present on top of the luminescent layer to correct the color-over-angle errors in the light emitted through the luminescent layer. The dichroic layer consists of a multitude of thin layers with alternative higher and lower refractive indices with which the light interferes. The optical characteristics of the dichroic layer are such that blue light is reflected more near the normal, and less or not at larger angles in a gradual way. The excess of a blue solid state light emitter near the normal through the phosphor is then compensated by a higher backreflection by the dichroic layer. The backreflected blue light will partially excite the phosphor and be color converted and is partially be recycled in the cavity. The dichroic layer may be present as a thin film on a carrier substrate, such as a glass, and connected to the phosphor. The connection may be made using an adhesive.

Alternatively the phosphor may be present as a coating on the same substrate as the dichroic layer at the opposite side. The carrier substrate of the dichroic layer may be a heat conducting transparent substrate such as a ceramic.

Light which is reflected or scattered by the luminescent layer and which is emitted by the luminescent layer is also reflected towards the walls 314 and is reflected by the light reflective surfaces 304 of the walls 314. As such light, which is not immediately transmitted through the light exit window into the ambient, is reflected via the light reflective surfaces 304 of the walls 314 and/or the light reflective surface 306 of the base 309. Thus, the light which is not immediately transmitted into the ambient is recycled more efficiently and contributes to an efficient light emitting module. In this case an effective reflection coefficient Reff is defined as a weighted average of the base and the wall reflection coefficient, or, in other words, the effective reflectivity is a weighted average of the base and the wall reflection coefficients. The effective reflection coefficient Reff may be defined as:

$$Reff = \frac{Rbase*Abase + Rwall*Awall}{Abase + Awall} \quad (1)$$

wherein the base reflection coefficient Rbase is the reflection coefficient of the light reflective surface 306 of the base 309, the wall reflection coefficient Rwall is the reflection coefficient of the light reflective surfaces 304 of the walls 314, Abase is the total area of the reflective surface 306 of the base 309 and Awall is the total area of the reflective surfaces 304 of the walls 314.

In this embodiment, the value of the effective reflection coefficient Reff should be at least larger than the value of the solid state light emitter reflection coefficient R_SSL. Preferably, the value of the effective reflection coefficient Reff should be at least larger than the value of the solid state light emitter reflection coefficient R_SSL plus a factor c times the difference between 1 and the solid state light emitter reflection coefficient R_SSL. Thus, Reff>R_SSL+c(1−R_SSL). The factor c is, similar to the embodiments described in FIGS. 1a and 1b, dependent on the solid state light emitter area ratio $\rho_{SSL}$, which in this case is defined as:

$$\rho_{SSL} = \frac{A\_SSL}{Abase + Awall} \quad (2)$$

Thus, as compared to the embodiments of FIGS. 1a and 1b, in this case the area of the reflective surfaces 304 of the walls 314 is also taken into account, i.e. the total reflective area now comprises the base and the wall reflective area. If $\rho_{SSL}$<0.1, indicating a relatively large reflective area of the base 309 and walls 314 with respect to the area of the top surface of the solid state light emitter 312, then the value of the factor c should be larger than or equal to 0.2 in order to have a relatively efficient light emitting module. If 0.1≤$\rho_{SSL}$≤0.25, indicating a reflective area of the base 309 and walls 314 that is comparable to the area of the top surface of the solid state light emitter 312, then the value of the factor c should be larger than or equal to 0.3 in order to have a relatively efficient light emitting module. If $\rho_{SSL}$>0.25, indicating a relatively small reflective area of the base 309 and walls 314 with respect to the area of the top surface of the solid state light emitter 312, then the value of the factor c should be larger than or equal to 0.4 in order to have a relatively efficient light emitting module. The value of the factor c in both cases is in practice smaller than 1.0.

Figure 3B:
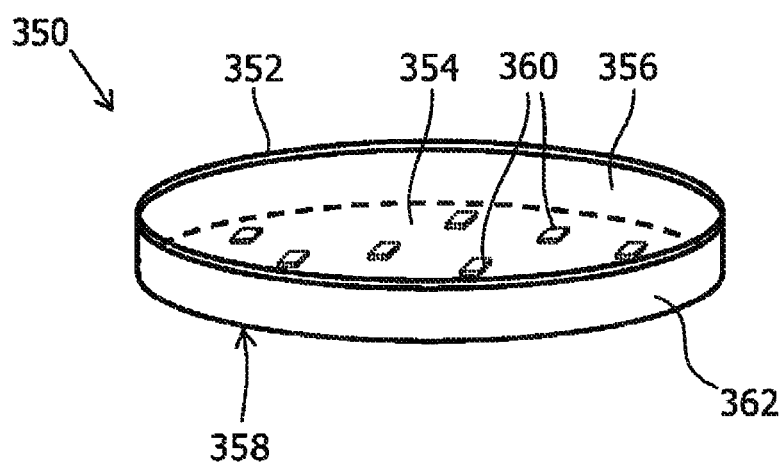

FIG. 3b shows another embodiment of a light emitting module 350 according to the first aspect of the invention. The light emitting module 350 is similar to light emitting module 300 of FIG. 3a. However, there are some minor differences. Light emitting module 350 has a circular base 358 with a light reflective surface 354 which is faced towards a cavity. The cavity is enclosed by the base 358, a cylindrical wall 362 and a luminescent layer 352. A surface of the cylindrical wall 362 which faces towards cavity is a light reflective wall surface 356. On the light reflective surface 354 of the base 358 a plurality of solid state light emitters are provided which emit light of a first color range towards the light exit window of the cavity. The light exit window of the cavity is formed by a luminescent layer 352 which comprises luminescent material for converting a part of the light of the first color range towards light of a second color range.

Also for this embodiment $\rho_{SSL}$ is defined as the ratio of the total summed area of the top surfaces of the solid state light emitters 360 and the area of the reflective surface 354 of the base 358. The same criteria and ranges apply as are described with reference to FIG. 3a.

Figure 4A:
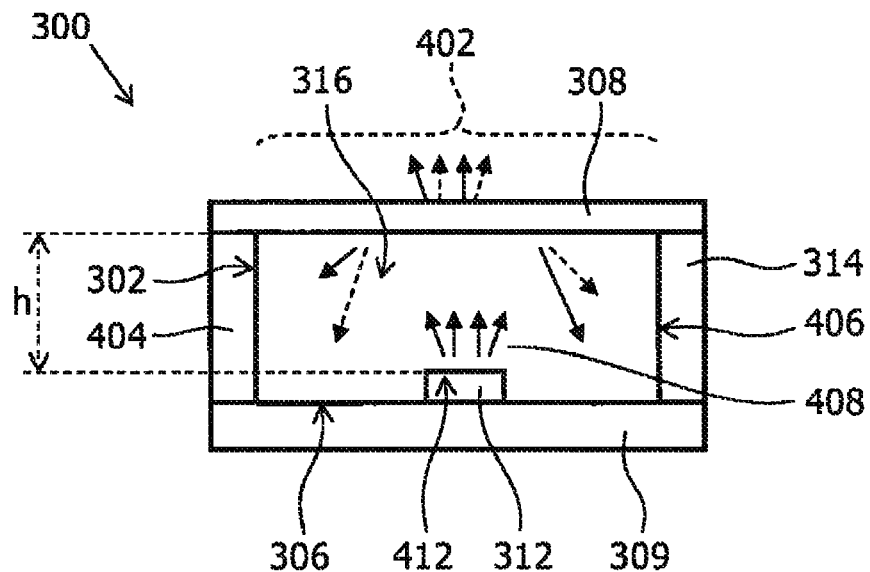

A cross-section of the light emitting module 300 of FIG. 3a along line A-A' is presented in FIG. 4a. The light exit window is indicated with 402. The light exit window 402 is a portion of the luminescent layer 308 because a part of the luminescent layer 308 is arranged on top of the walls 404, 314 which have a certain thickness. Alternatively, there may be a recess in the wall edge to which the luminescent layer 308 may be fitted as a support of the luminescent layer 308. An adhesive may be used to attach the luminescent layer 308 to the top of the wall or into the recess in the wall. In the case that a recess is used to attach the luminescent layer 308, there is an additional benefit of achieving thermal contact of the side face of the luminescent layer 308 to the wall.

Thus, the value of the effective reflection coefficient Reff should be at least larger than the value of the solid state light emitter reflection coefficient R_SSL. Preferably, the value of the effective reflection coefficient Reff should be at least larger than the value of the solid state light emitter reflection coefficient R_SSL plus a factor c times the difference between 1 and the solid state light emitter reflection coefficient R_SSL. The factor c is, similar to the embodiments described with reference to FIGS. 1a and 1b, dependent on the solid state light emitter area ratio $\rho_{SSL}$, which in this embodiment also includes the area of reflective surface 356 of the walls 362. $\rho_{SSL}$<0.1, indicating a relatively large reflective area of the base 309 and walls 404, 314 with respect to the area of the top surface of the solid state light emitter 312, then the value of the factor c should be larger than or equal to 0.2 in order to have a relatively efficient light emitting module. If 0.1≤$\rho_{SSL}$≤0.25, indicating a reflective area of the base 309 and walls 404, 314 that is comparable to the area of the top surface of the solid state light emitter 312, then the value of the factor c should be larger than or equal to 0.3 in order to have a relatively efficient light emitting module. If $\rho_{SSL}$>0.25, indicating a relatively small reflective area of the base 309 and walls 404, 314 with respect to the area of the top surface of the solid state light emitter 312, then the value of the factor c should be larger than or equal to 0.4 in order to have a relatively efficient light emitting module. The value of the factor c in both cases is in practice smaller than 1.0.

Furthermore, the inventors have found that the distance h between the top surface 412 of the solid state light emitter 312 and the luminescent layer 308 preferably is in a range that has a minimum value of 0.3 times the largest linear size $d_{SSL}$ of the top surface 412 and has a maximum value of 5 times the largest linear size $d_{SSL}$ of the top surface 308 for values of the solid state light emitter area ratio $\rho_{SSL}$ smaller than 0.1. For 0.1≤$\rho_{SSL}$≤0.25, the distance h between the top surface 308 and the luminescent layer 102 is preferably in a range that has a minimum value of 0.15 times the largest linear size $d_{SSL}$ of the top surface 308 and has a maximum value of 3 times the largest linear size $d_{SSL}$ of the top surface 308. For $\rho_{SSL}$>0.25 the distance h between the top surface 308 and the luminescent layer 102 is preferably in a range that has a minimum value of 0.1 times the largest linear size $d_{SSL}$ of the top surface 308 and has a maximum value of 2 times the largest linear size $d_{SSL}$ of the top surface 308.

It is noted that, if the solid state light emitter 312 fulfills the above criteria, the light emitting module 300 is a relatively efficient light emitting module. Absorption by the solid state light emitter contributes significantly to the inefficiency, while all other distances, sizes and reflection coefficients are optimized for maximum light output. The light emitting module 300 may be even more efficient if in the above presented formulas the factor c is larger than the values mentioned above. An efficiency increase in the order of 40% may be obtained with respect to a light emitting module with a luminescent layer directly on the top surface of the solid state light emitter.

The luminescent layer 308 is placed on a top edge of the walls 404, 314 and as such the luminescent layer 308 is thermally coupled to the walls 404, 314. The luminescent layer 308 becomes warm because of the absorption of energy by the luminescent material while it converts light of the first color range towards light of the second color range. The thermal coupling between the luminescent layer 308 and the walls 404, 314 allows the walls 404, 314 to conduct the heat of the luminescent layer towards the base 309, which may comprise an interface for coupling the base 309 to a heat sink. This mechanism provides an effective heat management of the light emitting module 300 and prevents that the luminescent layer 308 becomes too warm, which enhances the efficiency and the lifetime of the luminescent material. Further, the cavity 316 may be filled with a substantially optically transparent material. If the whole cavity is filled with the transparent material, the transparent material is also thermally coupled to the luminescent layer 308 and may conduct heat away from the luminescent layer towards the walls 404, 314 and the base 309 in a much more efficient way than when an air gap is used. As will be discussed in the context of FIG. 5a the transparent material has further advantages such as the increase of light outcoupling from the solid state light emitter 412.

The substantially transparent material is typically a solid material, such as a solidified or cured silicone resin with a thermal conductivity of 0.2 to 0.3 W/mK. Many types of such materials exist, ranging from hard silicone resins, to soft silicone resins, to flexible elastic silicone resins or gel type of resins. Other materials may include epoxy resins, many types of optically transparent polymers known to those skilled in the art. In other embodiments, wide range of glass type of materials may be used, such as sodalime glass of about 1.0 W/mK thermal conductivity or borosilicate glass or a fused silica glass of about 1.3 W/mK. Also, ceramic materials may be used such as translucent polycrystalline alumina substrates of about 30 W/mK, sapphire substrates of 42 W/mK, AlON of 9.5 W/mK, spinel of 15 W/mK or YAG of 7 W/mK thermal conductivity. Combinations of such materials may also be used. For example, solid glass or ceramic substrates may be bonded to the emitters and/or the base. Also, sintered translucent polycrystalline alumina may be used as the substantially transparent material, wherein the grain size is preferably larger than 44 um or preferably smaller than 1 um in order to obtain relatively high forward light transmission. The total forward transmission of light is larger than 84% for 1 mm thick material and a grain size that is smaller than 1 um. The total forward transmission of light is larger than 82% for 1 mm thick material and a grain size that is larger than 44 um. The polycrystalline alumina can be made with, for example, a ceramic powder processing technology in which $Al_2O_3$ powder is shaped, for example by powder pressing, slip casting, injection molding, and pre-sintered and end-sintered. A relatively large grain size, i.e. larger than 44 um, may be achieved by applying an alumina powder with a relatively large grain size, by applying a longer sinter time and/or a higher sinter temperature, using less grain growth suppressing MgO doping (<300 ppm) and/or apply grain growth stimulating dopes or a combination of one or more of the above methods. Preferably, the grain size is smaller than 120 um to prevent micro-cracking of the polycrystalline alumina. In this way the excellent thermal properties of this material, because the thermal conductivity is about 30 W/mK, are combined with a relatively high translucency.

Optionally the optical and thermal contact is achieved with the emitter surface such as to extract more light from the emitter and an air gap is still present between the solid material and the base. This may help to spread out the light more effectively by lightguiding in the solid material to enhance light uniformity. For optimal thermal contact, the solid substrates may also be attached to the base, for instance using an adhesive. The solid substrate performs the function of a heat spreading layer and thermal interface material in case it is also coupled to the luminescent layer. The solid material may also be present on the emitter, such as a piece of sapphire or silicon carbide SiC, which may be the growth substrate on to which the emitter die was formed. Furthermore a dome shape or lens shape optical body may be present on the die, typically of a size at least 2 times larger than the longest linear size, which may, for example, be from a silicone resin of a glass material. The dome or lens shaped body may be covered with another transparent material.

The substantially transparent material preferably has a relatively high refractive index if in optical contact to the emitter die. As typical solid state light emitters, like GaN or InGaN or AlInGaN, have a high refractive index of about 2.4, a high refractive index contact to the die extracts more light from the die by reducing total internal reflection in the solid state light emitter chip. Most transparent materials come with a refractive index ranging from 1.4 to 1.6, typically 1.5. Some examples of high refractive index materials suitable for attaching to the emitter are high refractive index glasses, like LaSFN9, or ceramic materials like sapphire (n~1.77), alumina (n~1.77), YAG (n~1.86), zirconia (n~2.2) or silicon carbide (SiC, n~2.6). A high refractive index optical bond may be used to attach the substrates, such as a high index glass or a high index resin. The high index resin may consist of a low index binder filled with high refractive index nano-particles, such as silicone resin filled with nano-$TiO_2$ particles smaller than 100 nm in diameter or other high index nano-particles such as ZrO2 or titanates such as BaTiO3, SrTiO3. In some types of emitter dies the typical growth substrates such as sapphire and silicon carbide may still be present on the die. Preferably these dies are covered in this case with a high refractive index material, such as described above.

Alternatively also liquid materials may be used, such as silicone oils (n~1.4) or mineral oils (n~1.5) or a wide variety of liquids, such as aliphatic or aromatic hydrocarbons, or liquids of high refractive index, known to those skilled in the art. When a liquid is used a tight sealing around the edges of the exit window is preferred to prevent leakage from the light emitting module. The liquid may serve the purpose of cooling the luminescent layer by convective flow and/or by being pumped around.

Figure 4B:
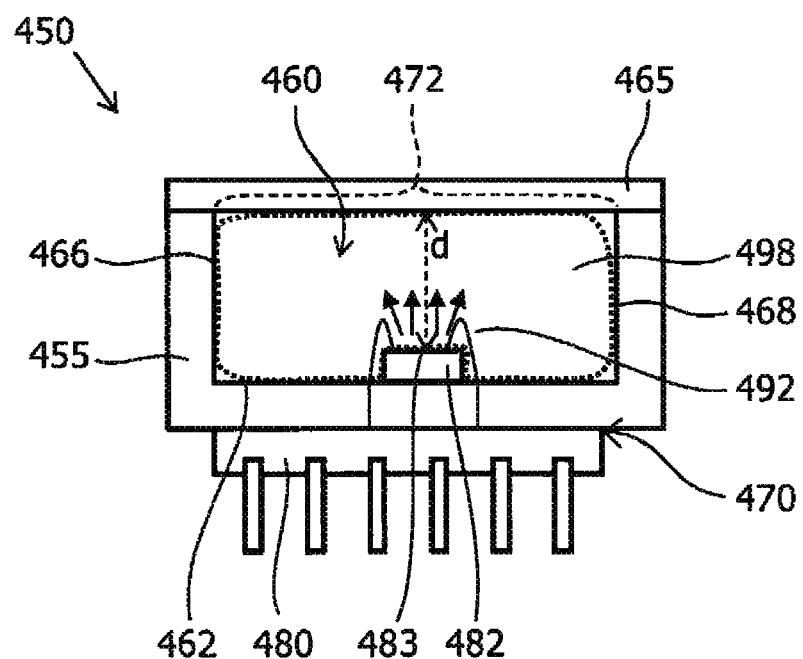

FIG. 4b shows a cross-section of another embodiment of the light-emitting module of FIG. 3a. A light emitting module 450 comprises a housing 455, a cavity 460, a luminescent layer 465, an interface 470 to a heat sink 480 and a light exit window 472. The housing 455 in this case comprises both a base and walls with a light reflective base surface 462 and light reflective wall surfaces 466, 468. A specific type of solid state light emitter 482 is shown which is connected to the electrical power by means of two wires 492. LEDs often have bond wires 492 that are connected to the solid state light emitter 482 at a top surface 483 of the solid state light emitter 482. The top surface 483 is a surface of the solid state light emitter 482 which is closest to the luminescent layer 465 and where the light is emitted into the cavity 460. In some embodiments there are two electrical wire contacts at the top surface 483, and in other embodiments there is one electrical wire contact at the top surface 483 and one electrical contact at a bottom surface of the solid state light emitter 482 to the base.

As seen in FIG. 4b the interface 470 to the heat sink 480 is provided at the back side of the light emitting module 450. It is to be noted that the back side is substantially opposite the side where the luminescent layer 465 is present and that a part of the housing which forms the back side also forms the base of the cavity 460. As seen in FIG. 4b the solid state light emitter 482 is applied to the light reflective base 462 of the cavity 460. The contact between the solid state light emitter 482 and the housing 455 is such that a good thermal coupling is obtained between the solid state light emitter 482 to the housing 455 and as such between the solid state light emitter 482 and the heat sink 480.

Alternatively, the solid state light emitter 482 may be mounted in a through hole in the light reflect base such that light is emitted into the cavity 460 and such that the solid state light emitter 482 has a good thermal contact with the housing 455.

A wire-bond top connection 492 is a wire which is electrically connected to an electrical contact area at the top surface 483 of a LED 482 which is usually metalized and the wire provides electrical energy to the LED 482. The top surface 483 of the LED 482 is often the light emitting surface of the LED 482 as well. The light emitting surface of the LED 482 is defined as the non-obstructed emissive surface area of the LED 482 where the light generated by the LED 482 is emitted into the cavity 460. In this embodiment the top surface 483 of the LED 482 is the surface which faces towards the luminescent layer 465.

Using a luminescent layer 465, which is implemented as a ceramic phosphor, or which is implemented as a phosphor layer deposited on for example a glass substrate in combination with the LED 482 with a wire-bond top connection 492 has proved to be difficult. The wires 492 obstruct the direct provision of such a ceramic phosphor layer on top of the light emitting surface. A solution may be to drill precision holes in the ceramic phosphor through which the wire is led, which is a relative expensive process. However, it is difficult to prevent light leakage via the precisions holes along the wire. This results in a reduced color control. Especially when the luminescent layer 465 has to convert most of the light of in the first color range, the light leakage results in an unacceptable reduced color saturation. Further, the holes would typically be drilled with laser ablation which comes with the risk of damaging the phosphor near the drilled holes such that the ablation by-products absorb light and a part of the phosphor is deactivated.

Typical ceramic phosphors, like YAG:Ce and amber colored barium strontium silicon nitride (BSSNE:Eu) have a refractive index of about 1.86 and 2, respectively. Thus, a transparent resin with a refractive index higher than 1.4 may provide a relatively good optical coupling between these specific LEDs and the discussed specific ceramic phosphors. Extra scattering centers, like scattering particles, may be incorporated preferably with forward scattering characteristics.

The embodiment provides an effective and efficient solution for converting light of a LED 482 with one or more wire bond top connections 492 into another color. The cavity 460 provides space for the wires 492, and because of the reflections of the light inside the cavity no shadow of the wires 492 is visible at the light exit window 472. It is to be noted that the cavity 460 of the embodiment is relative large with respect to the size of the light emitting module 450 and as such less shadows of wires may be available compared to the known light emitting modules in which the cavity is relative small.

The use of the wire-bond top-connection 492 together with a transparent resin 498, which is arranged between the LED 482 and the luminescent layer 465, is advantageous. The transparent resin 498 may be injected into the cavity 460 after assembling the LED 482 to the housing 455. During injection the transparent resin 498 is in a liquid state and may flow towards each corner of the cavity. The wires 492 are not an obstacle for the injected transparent resins and as such a good contact may be made between the transparent resin 498 and the whole top surface 483 of the LED 482. Thus, the transparent resin 498 increases the outcoupling of light from the LED 482. Further, if the transparent resin 498 is hardened the wire-bound top connections 492 are fastened by the resin 498 and is less sensitive to damage, for example, if the light emitting module 450 is subject to vibrations like for example in automotive applications.

Figure 5A:
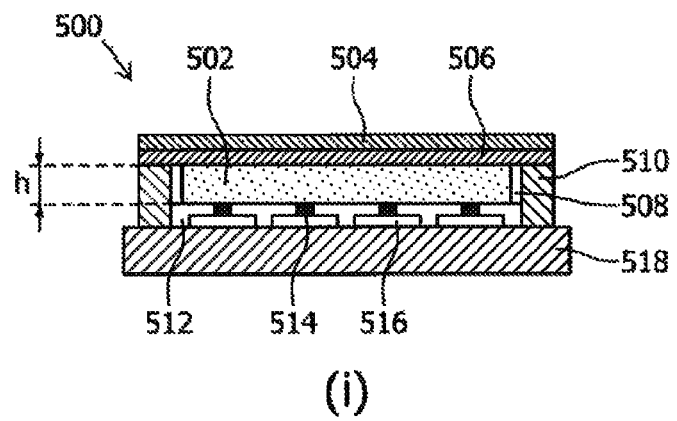
Figure 5A:
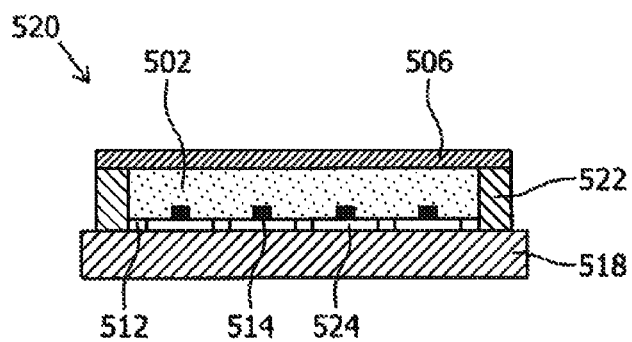
Figure 5A:
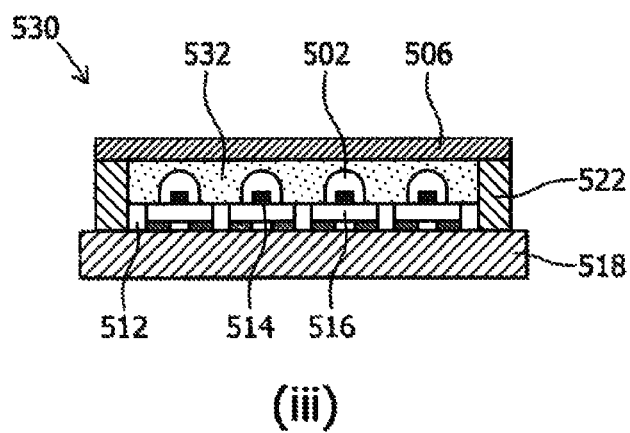
Figure 5A:
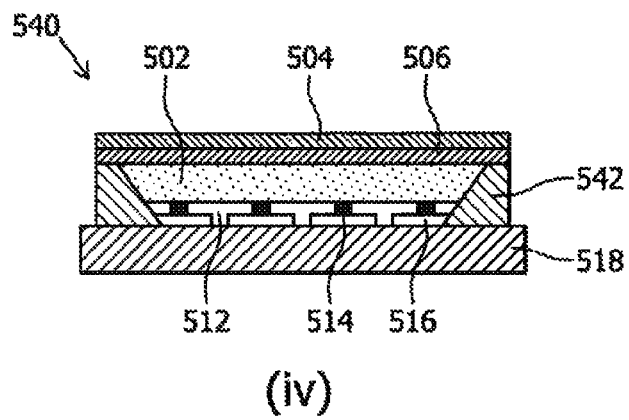
Figure 5A:
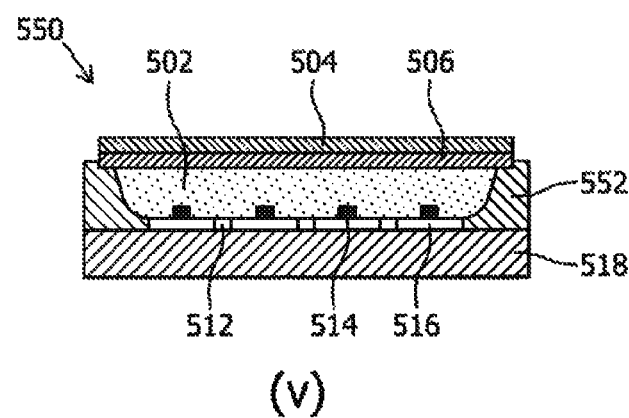
Figure 5A:
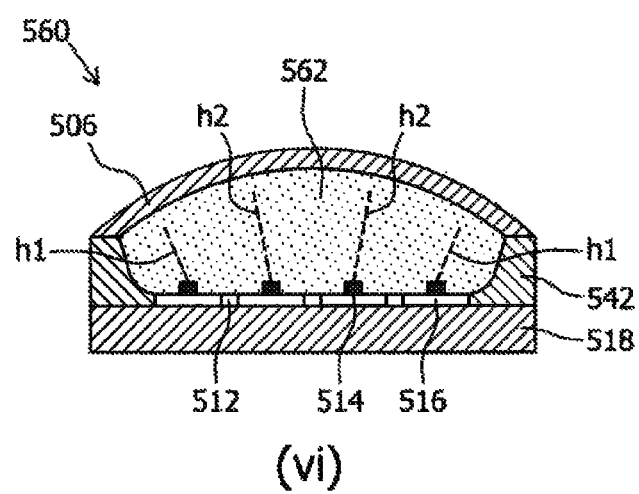

FIG. 5a presents several alternative embodiments of the light emitting module according to the first aspect of the invention. Light emitting module 500, depicted in FIG. 5a(i), comprises a base 518, a plurality of LEDs 514 provided on substrates 516, walls 510, a first luminescent layer 506 and a second luminescent layer 504 provided on an edge of the walls and forming a light exit window. The LEDs 514 emit light of a first color range and all LEDs 514 have the same size with a longest linear size d. The first luminescent layer 506 comprises luminescent material for converting light of the first color range into light of a second color range. The second luminescent layer 504 comprises another luminescent material for converting light of the first color range into light of a third color range or for converting light of the second color range into light of the third color range. The walls 510, the base 518 and first luminescent layer 506 enclose a cavity which is filled with a transparent material 502. Thus, the transparent material is interposed between the LEDs 514 and the first luminescent layer 506. The transparent material is optically coupled to the LEDs 514 and optically and thermally coupled to the first luminescent layer 506. The distance between the light emitters and the first luminescent layer 506 is indicated with h. The surfaces of the walls 510 which face towards the cavity are provided with a light reflective coating 508. The spaces between the LEDs 514 and the light transmitting material 502 are filled with a light reflective material 512, thereby covering the base 518 and the substrates 516. The light reflective surface is formed by the surface of the light reflective material 512 which is interposed between the LEDs 514. The light reflective material has a base reflection coefficient Rbase. The LED dies have a reflection coefficient R_SSL. The light reflective coating 508 has a wall reflection coefficient Rwall. The parameters of the light emitting module 500 relate to each other according to the same criteria as described in the previous embodiments with reference to FIGS. 1a, 1b, 3a, 3b and 4a, wherein the area of the top surface of the solid state light emitter A_SSL is in this embodiment calculated as the summed total area of the top surfaces of the plurality of LEDs 514.

Instead of a light reflective coating also a light reflective foil or film may be used that can be attached to or transferred to the base and or walls. An adhesive may be used for the attachment, such as a pressure sensitive adhesive. The reflective coating layer may be a dielectric layer as is typically used in an MCPCB carrier to isolate the surface electrodes from the metal carrier or a solder mask typically used in an MCPCB or PCB carrier to screen-off the surface electrodes. As the substrate 516 is covered with a reflective layer and is hence optically screened off, it may consist of a material with poor reflectivity such as aluminiumnitride (AlN). AlN has the advantage of having a very high thermal conductivity of about 140 W/mK. Hence, optical functions can be screened off from thermal functions by the use of a reflective coating or foil allowing individual optimization of both functions which is advantageous.

The light reflective coating or film may consist of a diffusely reflecting material, such as a white coating consisting of a binder filled with a scattering pigment or various scattering pigments. Suitable binders are silicone materials or silicate materials or alkylsilicate materials or epoxy materials or polyimide materials or fluoropolymers or polyamides or polyurethanes or other polymeric materials. The coating may also consist of highly reflective BariumSulphate (BaSO4) based material. Examples of scattering pigments are TiO2 pigments, ZrO2 pigments, Al2O3 pigments, but many other scattering particles or pores may be used as well, known to those skilled in the art. The reflective coating or film may also consist of metal layers, such as aluminium or silver. The metal may be a metal foil or film, such a highly reflective commercial metal mirrors with the trade name of Alanod. The thin metal layer may be evaporated or sputtered on the wall material. The metal foil may be used as in insert attached/bonded/soldered to the base. The metal layer may be covered with a white coating layer, for example a white silicone or white alkylsilicate layer, such as. a pigmented methylsilicate. A ceramic reflector layer may also be used on the base or the walls, for example a scattering alumina layer, typically porous, or other reflective ceramic material.

Light emitting module 520, depicted in FIG. 5a(ii), is similar to light emitting module 500, however, the walls 522 themselves are of a light reflective material, and as such no additional coating is applied to the walls 522. Further, only one luminescent layer 506 is applied. The substrates 524 on which the LEDs 514 are provided are also of a light reflective material, and as such only the spaces between the substrates 524 are filled with light reflective particles 512.

Light emitting module 530, depicted in FIG. 5a(iii), is another variation in which so-called domed LEDs 514 are used. The LEDs 514 are provided on a substrate 516 and domes of a light transmitting material 502 are placed on top of the LEDs. The dome of the light transmitting material 502 is optically coupled to the die of the LED. Further, the cavity is filled with a further light transmitting material 532. The further light transmitting material 532 is optically coupled to the domes of the light transmitting material 502 and is optically coupled to the first luminescent layer 506. This facilitates thermal transfer of heat generated in the luminescent layer towards the base and the heat sink to which the base is typically attached.

Light emitting module 540, depicted in FIG. 5a(iv), is similar to light emitting module 500, however, the walls 542 are tilted with respect to a normal axis to the base 518. The walls 542 are tilted in a way such that light which impinges on the tilted walls 542 is reflected towards the first luminescent layer 506 instead of a direction towards the base 518. The tilted walls 542 direct the light reflected on the walls 542 towards the luminescent layer 506 and prevent that light rays are reflected many times between the walls 542 and base, which prevents unnecessary light absorption, namely, every reflection is not perfect and at every reflection a small amount of light is absorbed.

Light emitting module 550, depicted in FIG. 5a(v), is a variant of light emitting module 540. The walls 552 of light emitting module 550 are curved in a way such that more light, which impinges on the curved walls 552, is reflected towards the first luminescent layer 506 and thus towards the light exit window. Furthermore, the substrate surfaces 516 are not coated but the spacing 512 between the substrates is coated with a reflective material. The substrate 516 may consist of a reflective material, such as a scattering ceramic, such as alumina that includes scattering pores and/or scattering particles, such as zirconia particles. Thus the reflectance of the light reflective surface of the base 518 is an average of the reflectance of the substrate 516 and the spacing 512 weighted over the area.

Light emitting module 560, depicted in FIG. 5a(vi), is another variation which does not comprise the second luminescent layer 504. The cavity is filled with a substantially transparent material 562 and has at the light exit side of the light emitting module a curved surface. The first luminescent layer 506 is provided on top of the transparent material 562. As shown, the distances between the LEDs 514 and the first luminescent layer 506 differ. Two LEDs are positioned at a distance h1 from the first luminescent layer 506, and two LEDs are positioned at a distance h2 form the first luminescent layer 506. The value of the distance h between the top surface of the LEDs 514 in this embodiment should be calculated as the average distance: h=(h1+h2)/2. In the case that three or more LEDs are applied in the light emitting module, the average distance formula is adapted accordingly.

In yet another embodiment, which is not shown, the solid state emitter dies are bonded directly to the carrier board without the additional intermediate substrate. This further reduces thermal resistance between the die and the board and the die and the heat sink to which the board is typically attached. Wire bonds may be present to electrically contact the top of the LED die.

Figure 5B:
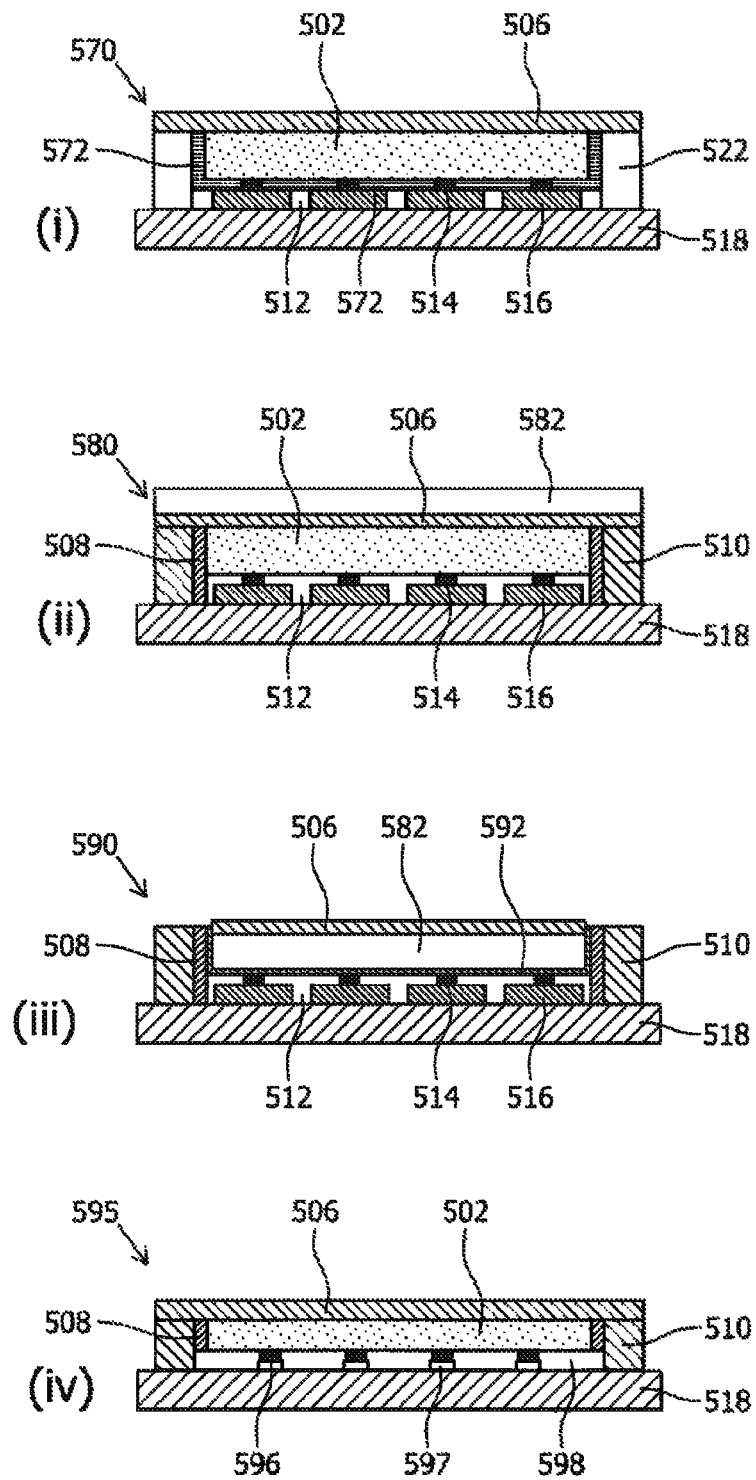

FIG. 5b presents four alternative light emitting modules 570, 580, 590, 595. Light emitting module 570, depicted in FIG. 5b(i), is similar to light emitting module 520 and has inside the cavity an additional luminescent layer 572. Thus, for example, a layer with another type of luminescent material may be applied to the light reflective walls 522 and the light reflective surface of the base 518, which is different from the luminescent material as applied in the first luminescent layer 506. This another luminescent material converts light of the first color range towards light of the third color range. Alternatively, the same luminescent material as used in the first luminescent layer may be applied to the light reflective walls 522 and the light reflective surface of the base 518. Not all light which impinges on the additional luminescent layer 527 is converted, and some light is emitted towards the light reflective walls 522 and the light reflective surface of the base 518 and is subsequently reflected back towards the cavity and thus towards the light exit window. For example, this may be used to add additional red light to a white emission to achieve a warm white emission.

Light emitting module 580, depicted in FIG. 5b(ii), is similar to light emitting module 500. A first difference is that only a single luminescent layer 506 is provided at the light exit window. During manufacturing the luminescent layer 506 is applied to a transparent substrate 582, which is for example glass. The substrate 582 with the luminescent layer 506 is cut into pieces, for example with a saw, or drilled and a piece of the substrate 582 with the luminescent layer 506 is provided on the walls 510 of the light emitting module 580.

Light emitting module 590, depicted in FIG. 5b(iii), is similar to light emitting module 580, however, the cavity is not filled with a substantially transparent material, but with a piece of the transparent substrate 582 with the luminescent layer 506. The piece is bonded with, for example, a transparent resin 592 to the light reflective wall surfaces and the light reflective surface of the base 518. The transparent substrate 582 is, for example, 2 mm thick and provides as such a height difference between the top surfaces of the LEDs 514 and the luminescent layer 506 of about 2 mm. On top of the device a white silicone rim may be applied at the circumference of the luminescent layer 506 to prevent escape of direct light of the light emitted by the LEDs 514 (e.g. blue) (not shown).

Light emitting module 595, depicted in FIG. 5b(iv), is similar to light emitting module 520. However, other types of LEDs are used. The base 598 is a metal core PCB (MCPCB). LEDs without a relatively large substrate may be mounted directly on the MCPCB. LEDs which are suitable for such applications are LEDs which are manufactured with the so-called CSP or COB technologies. COB refers to chip-on-board wherein the LED chip is soldered directly on the MCPCB. CSP refers to Chip Scale Packages where a carrier is provided to the wafer on which the LED is manufactured, and the wafer is diced to obtain CSP LEDs. Such CSP LEDs are presented in light emitting module 595. In CSP LEDs the carrier 597 has the same size as the LED chip 596. The side surfaces of the CSP may be reflective and the surface of the PCB may be reflective such that no additional (thick) base reflector layer may be needed.

Figure 6:
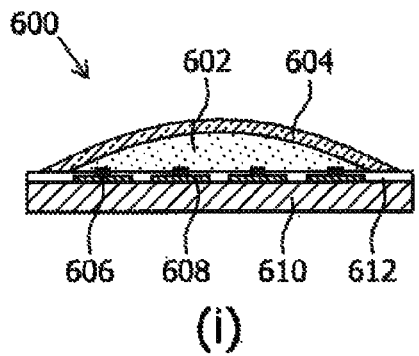
Figure 6:
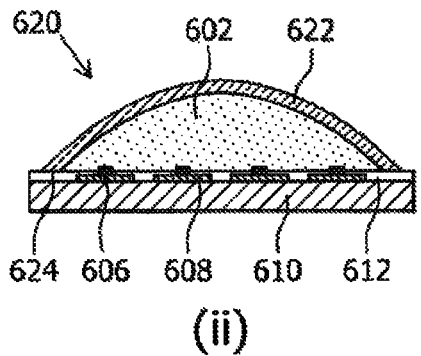
Figure 6:
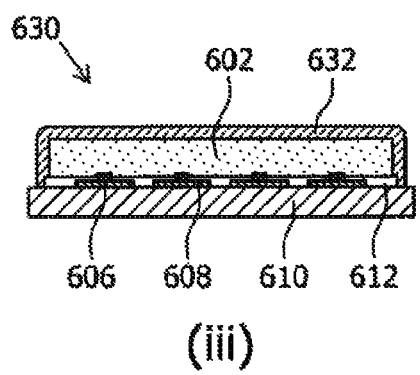
Figure 6:
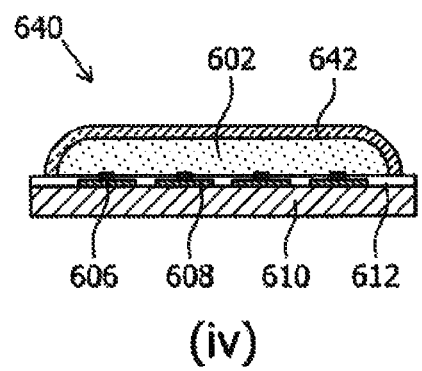
Figure 6:
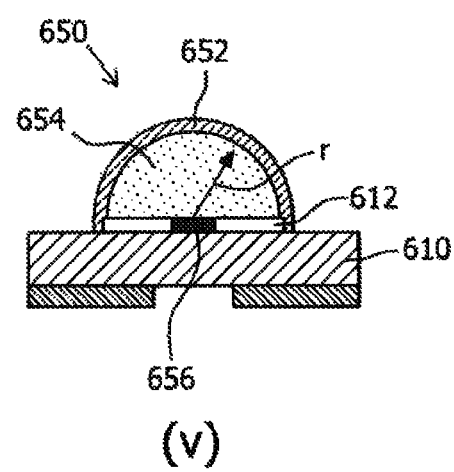
Figure 6:
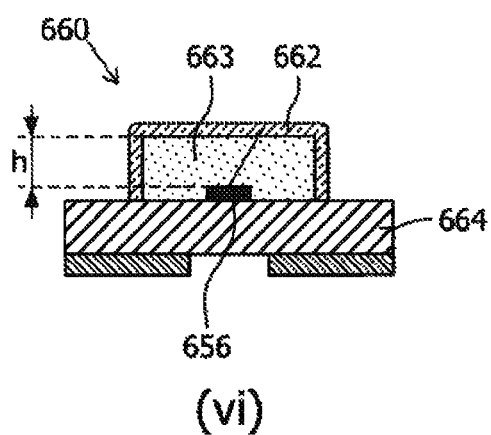

In FIG. 6 other schematically drawn cross-cuts of embodiments of a light emitting module 600, 620, 630, 640, 650, 660 are presented. The light emitting modules 600, 620, 630, 640, 650, 660 do not have walls between a luminescent layer 604, 622, 632, 642, 652, 662 and the base, but they have the luminescent layer 604, 622, 632, 642, 652, 662 of which the edge touches the light reflective surface or base 610, 664. The luminescent layer 604, 622, 632, 642, 652, 662 as a whole forms the whole light exit window of the light emitting modules 600, 620, 630, 640, 650, 660. The light emitting modules 600, 620, 630, 640, 650, 660 do not only emit light in a direction substantially parallel to a normal axis to the base 610, 664, but also emit light in various light emission angles with respect to the normal axis of the base. In FIG. 6(ii) a schematical cross-section of light emitting module 620 an edge 624 of the luminescent layer 622 is shown. As seen the edge 624 is in contact with the light reflective surface of the base 610 and the luminescent layer 622 may extend on the surface of the base.

The light emitting module 600, depicted in FIG. 6(i), comprises a base 610, on which substrates 608 with LEDs 606 are provided. The substrates 608 and LEDs 606 are surrounded by a light reflective material 612 which forms a light reflective surface. The light emitting top surfaces of the LEDs 606 are optically coupled to a transparent material 602 which is also in contact with the luminescent layer 604. Light emitting modules 620, 630, 640 have luminescent layers 622, 632, 642 of another shape and are depicted in FIGS. 6(ii), 6(iii) and 6(iv), respectively.

Light emitting module 650, depicted in FIG. 6(v), has a base 610, on which a single chip-scale packaged LED 656 is provided. Often the abbreviation CSP-LED is used for the chip-scaled packaged LED 656—such a chip-scaled packaged LED 656 does not comprise an extra substrate as shown in previous embodiments. Around the LED 656 a light reflective material 612 is applied which creates a light reflective surface facing towards the luminescent layer 652. On top of the LED 656 and the light reflective material 612 is placed a dome 654 of a transparent material on which the luminescent layer 652 is arranged. The radius r is the distance between the LED 656 and the luminescent layer 652. The definition of the distance h is in this case replaced by the radius r.

Light emitting module 660, depicted in FIG. 6(vi), does not comprise a dome of transparent material but a box shaped transparent material 663. Further, the base 664 is made of a light reflective material and as such no additional layer of light reflecting material is provided on the surface of the base 664 which is facing towards the luminescent layer 662. Other shapes and combinations may be envisioned as well.

The schematically shown light emitting modules 500, 520, 530, 540, 550, 560, 600, 620, 630, 640, 650, 660 may be (circularly) symmetric but may also be asymmetric out of the plane of the depicted cross-section. For example, the module may be elongated in the depth direction to the plane of the paper such as to form an elongated, tube, rod, or cylinder like shape. Multiple emitters may form an emitter array in the depth direction. Such a shape may for instance be used in an LED streetlamp or LED retrofit TL lamp. LED emitter arrays of tens up to hundreds of LEDs may in principle be used. Different amounts of emitters may be present to match the light output required in the associated application.

Figure 7A:
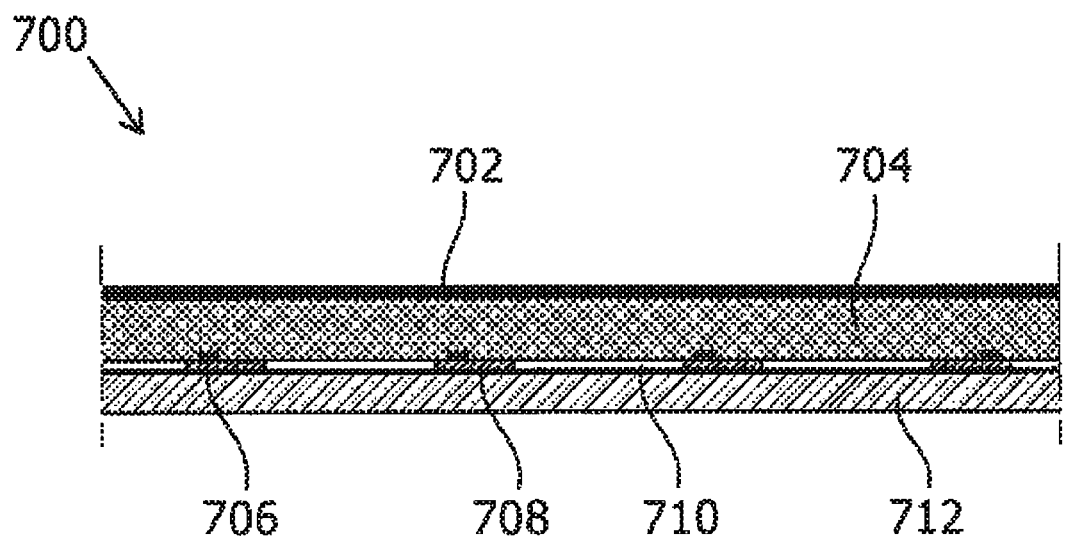

In FIG. 7a a light emitting module 700 is shown which is manufactured on a flexible base foil 712. Solid state light emitters 706 which are provided on a small substrate 708, which is equipped with electrode connection pads (not shown), are provided on the flexible base foil 712, and the area in between the substrates 708 is filled with a light reflective material 710. The light emitters 706 are optically coupled to a layer of a flexible transparent material 704. On top of the flexible light transmitting material 704 a luminescent layer 702 is provided comprising at least one luminescent material. Not the whole surface of the flexible light transmitting material 704 needs to be covered by the luminescent layer 702, a part of the surface may for example be blocked with a top reflector. As seen in FIG. 7a, the light emitting module 700 comprises a plurality of solid state light emitters 706. In an embodiment a relatively large two-dimensional array of solid state emitters is provided to obtain a relatively large light exit window. In conformity with previous embodiments, the distance between the solid state light emitter 706 and the luminescent layer 702 should be in a range that depends on the longest linear size of the top surface of the solid state light emitters 706, and the average reflectivity of the light reflective surface of the base 712, formed by the combination of the substrates 708 and the light reflective material 710, should be substantially larger than the reflectivity of the solid state light emitter 706. Further, the solid state light emitters should only cover a relatively small part of the light reflective surface formed by the light reflective material 710 and the substrates 708. It is to be noted that the reflection coefficient Rbase of the light reflective surface is defined as the average reflectivity of the whole light reflective surface. Thus, the reflection coefficient Rbase is a weighted average between the reflection coefficient of the substrates and the reflection coefficient of the light reflective material, wherein preferably the weights are formed by the part of the total area that is covered by the specific material.

Figure 7B:
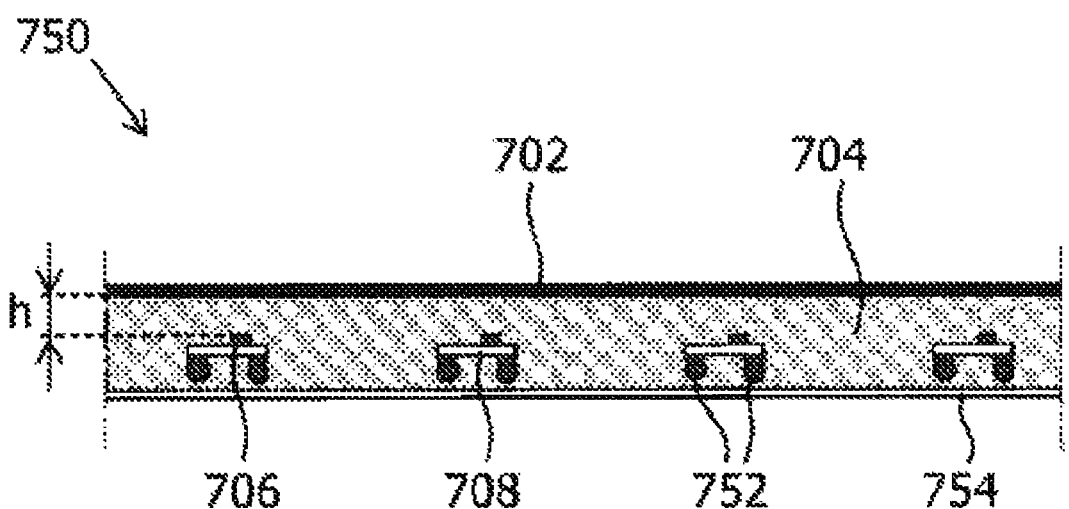

In FIG. 7b another embodiment of a flexible light emitting module 750 is presented. Light emitting module 750 is similar to light emitting module 700, however, the base only exists of a light reflective foil 754 which is applied to a side of a transparent material 704. On another side of the flexible transparent material 704, which is opposite to the side to which the light reflective foil 754 is applied, a luminescent layer 702 is arranged. Within the transparent material wires, bars or rods 752 are provided which support substrates 708 on which solid state light emitters 706 are provided. The wires, bars or rods 752 provide electrical power to the solid state light emitters 706. The distance from a top surface of the solid state light emitters to the luminescent layer 702 is indicated with h. The distance h is preferably larger than or equal to 0.3 times the largest linear size $d_{SSL}$ of the top surfaces of the solid state light emitters 706 and smaller than or equal to 5 times the largest linear size $d_{SSL}$ of the top surfaces of the solid state light emitters 706 in case the solid state light emitter area ratio $\rho_{SSL}$ is smaller than 0.1. For a value of the solid state light emitter area ratio $\rho_{SSL}$ that is in a range with a minimum value that is larger than or equal to 0.1 and a maximum value that is smaller than or equal to 0.25, the distance h is preferably larger than or equal to 0.15 times the largest linear size $d_{SSL}$ of the top surfaces of the solid state light emitters 706 and smaller than or equal to 3 times the largest linear size $d_{SSL}$ of the top surfaces of the solid state light emitters 706. For a value of the solid state light emitter area ratio $\rho_{SSL}$ larger than 0.25 the distance h is preferably larger than or equal to 0.1 times the largest linear size $d_{SSL}$ of the top surfaces of the solid state light emitters 706 and smaller than or equal to 2 times the largest linear size $d_{SSL}$ of the top surfaces of the solid state light emitters 706. It is to be noted that this criterion also applies to the light emitting module 700. Further, in conformity with previously discussed embodiments, the base reflection coefficient Rbase of the light reflective foil 754 is larger than the solid state light emitter reflection coefficient R_SSL of the solid state light emitters 706, preferably the base reflection coefficient Rbase of the light reflective foil 754 relates to the solid state light emitter reflection coefficient R_SSL of the solid state light emitters 706 according to: Rbase>R_SSL+ c(1−R_SSL) wherein also in this case the value of the factor c depends on the solid state light emitter area ratio $\rho_{SSL}$, which in this case only includes the reflective area of the base as described in some of the previous embodiments.

Figure 8A:
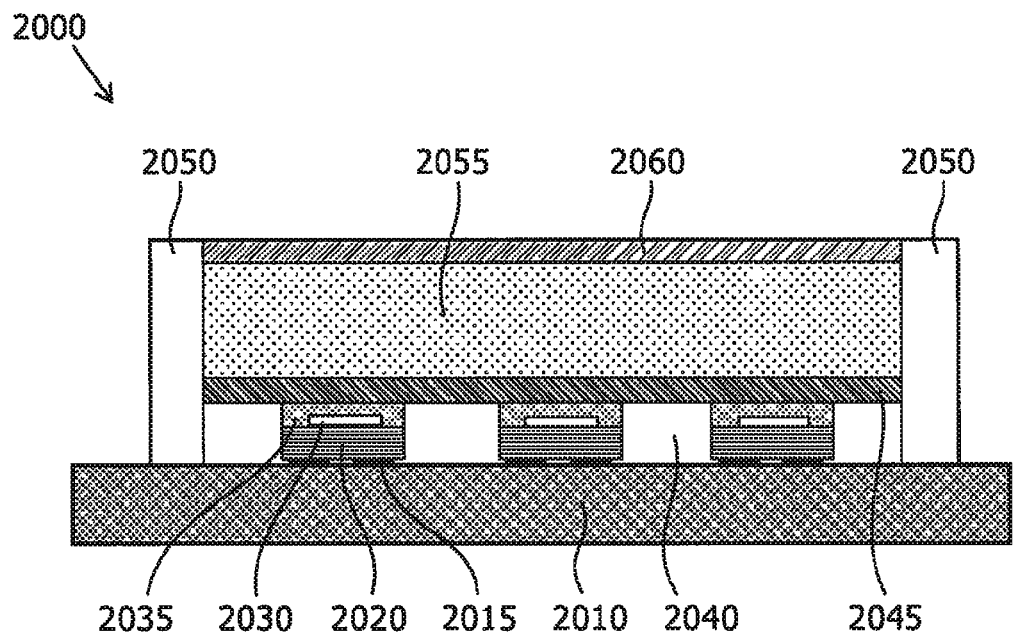
Figure 8B:
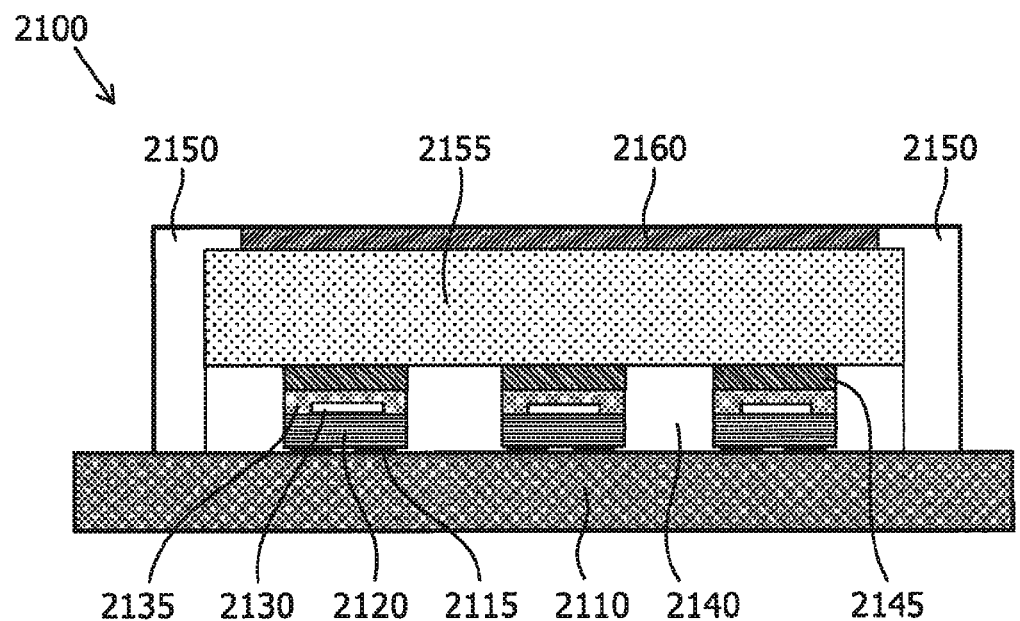
Figure 8C:
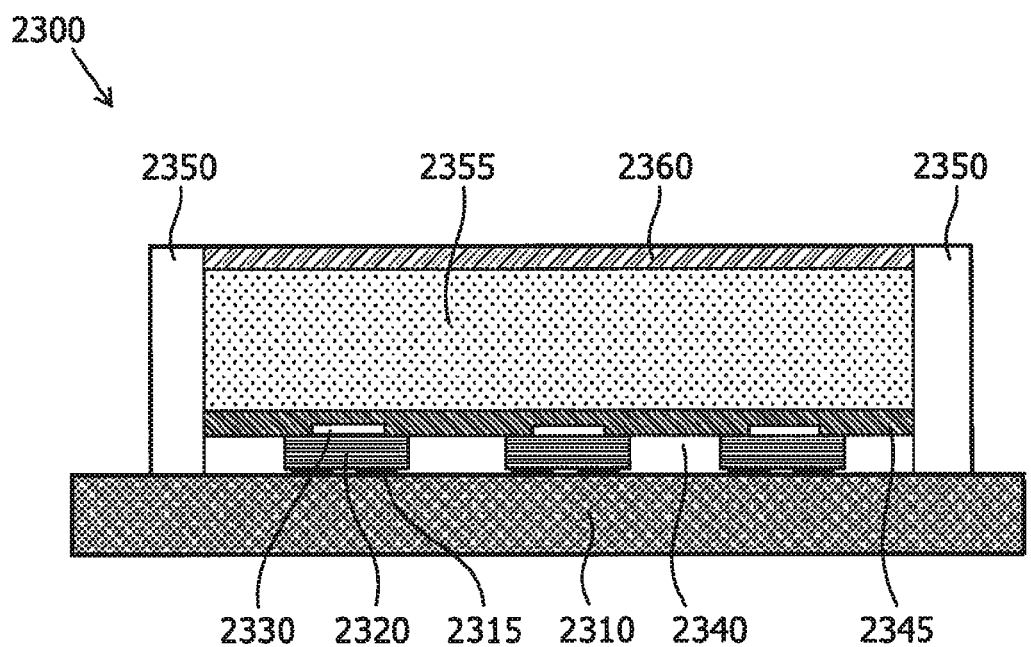

FIGS. 8a-8c show schematic cross-sections of embodiments of light emitting modules according to the invention. FIG. 8a shows a schematic cross-section of a light emitting module 2000 comprising LED dies 2030 on a substrate carrier 2020, for example comprising alumina or aluminiumnitride. The substrate carrier 2020 is electrically connected to contact pads of a printed circuit board 2010 via electrical contacts 2015, for example solder contacts. The printed circuit board 2010 may be a metal core printed circuit board comprising an aluminium base covered by a dielectric insulating layer (not shown). On the dielectric layer electrically conducting electrodes and the contact pads are provided, and the electrodes are protected by a solder mask protective layer (not shown). The LED dies 2030 are covered with a transparent protective layer 2035, for example a transparent silicone layer. In between the LED packages or devices, which comprise the LED dies 2030, the substrate carrier 2020 and the transparent protective layer 2035, a reflective layer 2040 is provided, for example a white TiO2 pigmented silicone. A cavity is defined by the printed circuit board 2010, walls 2050 and a luminescent layer 2060. The walls 2050 for example comprise TiO2 dispensed in silicone and the luminescent layer 2060 for example comprises a phosphor material. On the transparent protective layer 2035 and the reflective layer 2040 an optical bond layer 2045 is provided, comprising for example silicone, which provides for optical bonding between the transparent protective layer 2035 and a filling layer 2055, wherein the filling layer 2055 comprises, for example, glass and substantially fills the cavity in between the optical bond layer 2045, the luminescent layer 2060 and the walls 2050.

FIG. 8b shows a schematic cross-section of a light emitting module 2100 comprising LED dies 2130 on a substrate carrier 2120, for example comprising alumina or aluminiumnitride. The substrate carrier 2120 is electrically connected to contact pads of a printed circuit board 2110 via electrical contacts 2115, for example solder contacts. The printed circuit board 2110 may be a metal core printed circuit board as described in relation to the light emitting module 2000 which is depicted in FIG. 8a. The LED dies 2130 are covered with a transparent protective layer 2135, for example a transparent silicone layer. On the transparent protective layer 2135 of each of the LED dies 2135 an optical bond layer 2145 is provided, comprising for example silicone. In between the LED packages or devices with the optical bond layer 2145, wherein the LED packages or devices comprise the LED dies 2130, the substrate carrier 2120 and the transparent protective layer 2135, a reflective layer 2140 is provided, for example a white TiO2 pigmented silicone. A cavity is defined by the printed circuit board 2110, walls 2150 and a luminescent layer 2160. The walls 2150 for example comprise TiO2 dispensed in silicone and the luminescent layer 2160 for example comprises a phosphor material. A filling layer 2155, which comprises, for example, glass, substantially fills the cavity in between the optical bond layer 2145, the reflective layer 2140, the luminescent layer 2160 and the walls 2150. The optical bond layer 2145 provides for optical bonding between the transparent protective layer 2135 and the filling layer 2155. The reflective layer 2140 is provided in between the LED packages or devices via, for example, underfilling or overmolding after bonding of the LED packages or devices to the filling layer 2155 via the optical bond layer 2145.

FIG. 8c shows a schematic cross-section of a light emitting module 2300 comprising LED dies 2330 on a substrate carrier 2320, for example comprising alumina or aluminiumnitride. The substrate carrier 2320 is electrically connected to contact pads of a printed circuit board 2310 via electrical contacts 2315, for example solder contacts. The printed circuit board 2310 may be a metal core printed circuit board as described in relation to the light emitting module 2000 which is depicted in FIG. 8a. In between the LED packages or devices, which comprise the LED dies 2330 and the substrate carriers 2320, a reflective layer 2340 is provided, for example a white TiO2 pigmented silicone. A cavity is defined by the printed circuit board 2310, walls 2350 and a luminescent layer 2360. The walls 2350 for example comprise TiO2 dispensed in silicone and the luminescent layer 2360 for example comprises a phosphor material. On the reflective layer 2340 and the LED devices or packages an optical bond layer 2345 is provided, comprising for example silicone, which provides for optical bonding between the LED packages or devices and a filling layer 2355, wherein the filling layer 2355 comprises, for example, glass and substantially fills the cavity in between the optical bond layer 2345, the luminescent layer 2360 and the walls 2350. This light emitting module 2300 differs from the light emitting module 2000, which is depicted in FIG. 8a, in that the LED dies 2330 are not covered with a transparent protective layer but are covered with the optical bond layer 2345.

Figure 9:
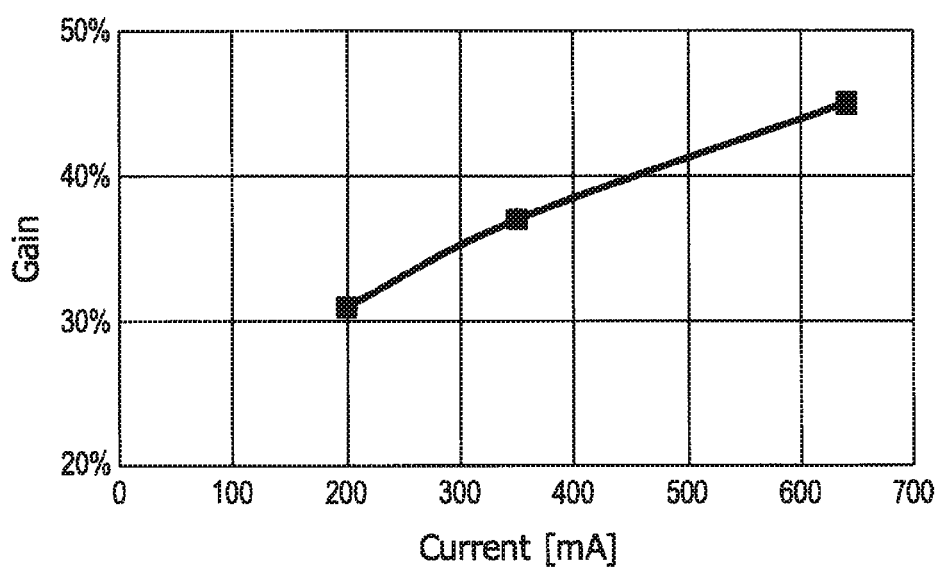
FIG. 9 shows a graph with the results of measurements of an embodiment of a light emitting module according to the invention.

Several embodiments were manufactured according to the invention. In a first experiment a Philips Fortimo SLM light emitting module was used as a reference comprising 16 LEDs with phosphor directly on top of the dies with a luminous flux of 1800 lumen. Light emitting modules according to an embodiment of the invention contained 16 blue light emitting LEDs in a highly reflective mixing chamber with a Lumiramic™ phosphor layer at a distance of 2.1 mm from the LEDs and with a cavity diameter of 22 mm. At 640 mA the Wall Plug Efficiency (WPE) was improved with a factor ranging between 30% and 50%. The Wall Plug Efficiency is the energy conversion efficiency with which electrical power is converted into optical power (in Watt) and is also defined as the ratio of the radiant flux (i.e. radiant energy per unit time, also called radiant power) to the input electrical power. FIG. 9 shows the results of measurements that were performed at varying current levels on one of the light emitting modules according to an embodiment of the invention having 16 LEDs. The horizontal x-axis represents the current level and the vertical y-axis represents the gain or improvement of the radiant flux of one of the light emitting modules according to an embodiment of the invention having 16 LEDs with respect to the radiant flux of the reference light emitting module with 16 LEDs having phosphor directly on the LEDs. FIG. 9 shows that the improvement of the radiant flux with respect to the reference light emitting module increases when the current increases, which can be attributed to an improved photo-thermal performance of the phosphor layer with respect to the reference.

In another experiment light emitting modules were fabricated according to an embodiment of the invention comprising 9 LEDs each with a top surface area of 1 mm² and comprising 4 LEDs each with a top surface area of 2 mm² each with a Lumiramic™ phosphor layer at a distance of 2.1 mm from the LEDs. Measurements of the radiant flux showed improvements of the radiant flux with respect to the reference light emitting module with 16 LEDs with phosphor directly on top ranging between 20% and 40%.

Figure 10A:
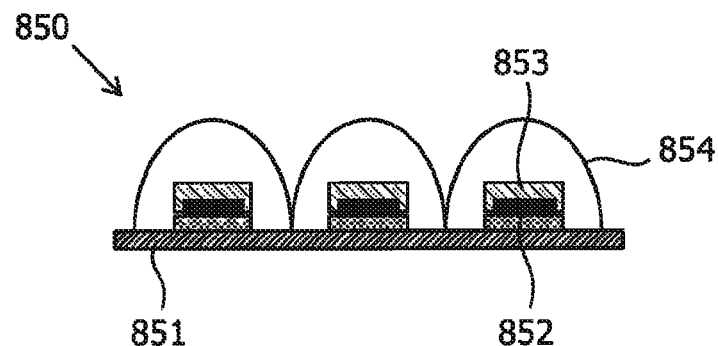
FIG. 10a shows a schematic cross-section of a first reference light emitting module.
Figure 10B:
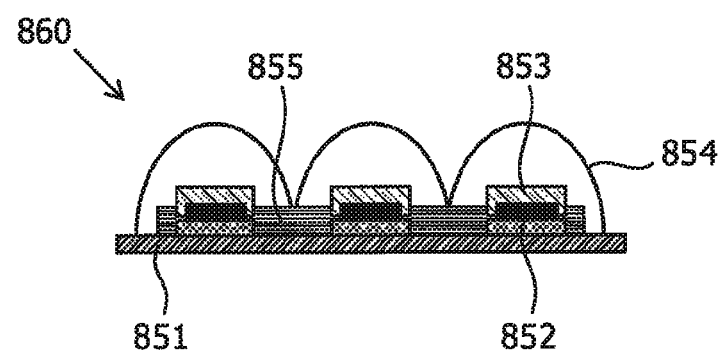
FIG. 10b shows a schematic cross-section of a second reference light emitting module.
Figure 10C:
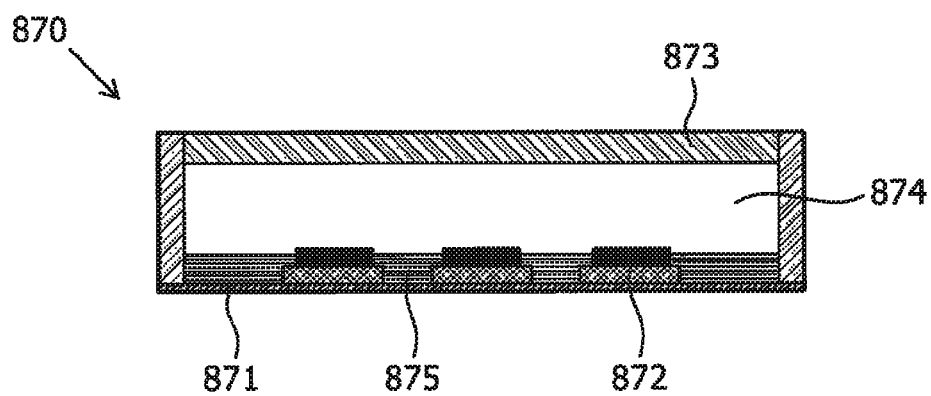
FIG. 10c shows a schematic cross-section of a light emitting module according to the invention.

FIGS. 10a-c show schematic cross-sections of another comparative experiment. FIG. 10a shows a schematic cross-section of a first reference light emitting module 850 comprising four LEDs 852 (one LED not shown) with a luminescent layer 853 directly on top placed on a base substrate 851. Each LED is covered with a dome-shaped optical element 854. FIG. 10b shows a schematic cross-section of a second reference light emitting module 860 which differs from the first reference light emitting module because of a reflective layer 855 which is applied on the base substrate 851 in between the LEDs. FIG. 10c shows a schematic cross-section of a light emitting module 870 according to an embodiment of the invention comprising four LEDs 872 (one LED not shown) on a base substrate 871 that is covered with a reflective layer 875. The LEDs are placed in a cavity 874 that is covered with a luminescent layer 873 at a distance of 2.1 mm from the top surface of the LEDs 872. Measurements of the radiant flux show an improvement of the radiant flux of the second reference light emitting module 860 with respect to the radiant flux of the first reference light emitting module 850 of approximately 4% (measured at 700 mA), which is mainly due to the additional reflective layer 855 in the second reference light emitting module 860. The measured improvement of the radiant flux of the light emitting module 870 according to an embodiment of the invention with respect to the radiant flux of the first reference light emitting module 850 is approximately 25% (measured at 700 mA).

FIGS. 11, 12, 13 and 14 show graphs with the results of simulations of a light emitting module according to the invention. With a light-ray tracing software package an optical model was built of the light emitting modules according to the invention. The model comprises seven blue light emitting LEDs with dies that have a top surface of 1×1 mm² each. Thus, the largest linear size $d_{SSL}$ of the top surfaces of these LEDs is about 1.4 mm. The LED dies have a diffuse reflectance with a weighted average over the first and second spectral range of about 70%, which corresponds to a typical surface roughened GaN type of LED die. The cavity has a circular shape with a varying diameter. The LEDs are uniformly distributed on a highly reflective substrate and are surrounded with highly reflective walls forming the cavity. The light exit window of the cavity is covered by a luminescent layer comprising a ceramic phosphor and an additional coating layer with particles of another phosphor in silicon. The light emitted by the light emitting module through the light exit window has a warm white color point.

The optical simulations show that the walls and/or base either being diffuse reflective or specular reflective, or combinations thereof, has a minor influence, in the order of a few percent, on the performance of the light emitting module. This influence depends, amongst others, on the area ratio and the geometry of the cavity.

Figure 11:
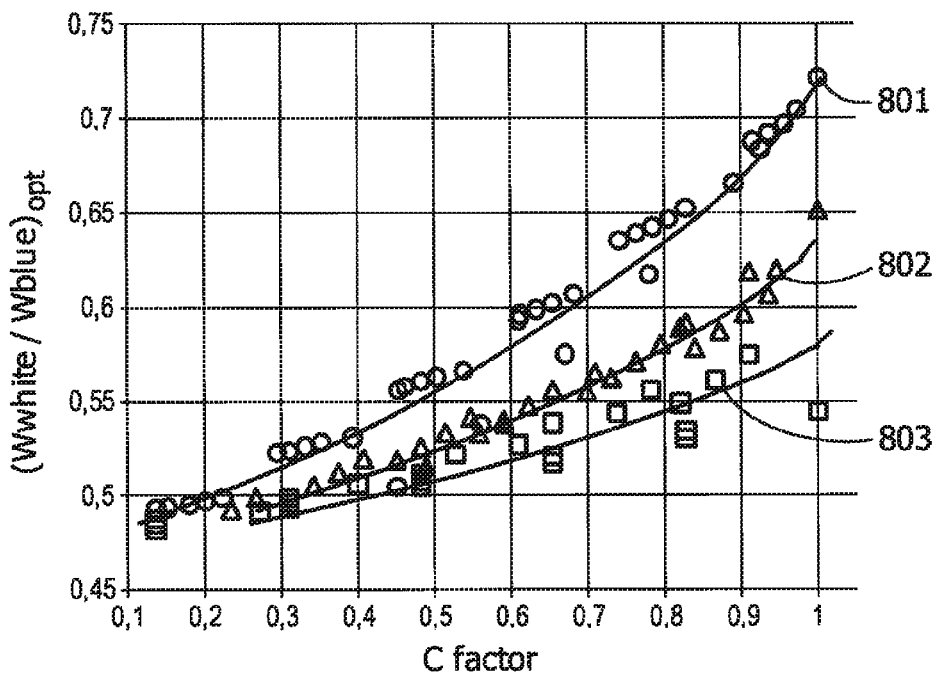
FIGS. 11, 12, 13, 14 and 15 show graphs with the results of simulations of an embodiment of the light emitting module according to the invention, FIGS. 16a and 16b schematically show cross-sections of embodiments of a light emitting module according to the invention.

FIG. 11 shows the influence of the factor c on the optical efficiency for several values of the solid state emitter area ratio. In FIG. 11 the vertical y-axis represents the optimum value of the efficiency of the optical performance expressed by the ratio of the flux of white radiation exiting the mixing cavity Wwhite (units: Watt) and the total blue flux emitted by the solid state light emitters in first spectral range, usually the blue spectral range, Wblue (units: Watt). The optimum value of the optical efficiency is determined by varying the distance h between the solid state light emitter top surface and the luminescent layer. The horizontal x-axis represents the factor c from the formula Reff>R_SSL+c*(1−R_SSL). Curve 801 represents a range of relatively low values of the solid state light emitter area ratio $\rho_{SSL}$, in this case varying between 0.01 and 0.02, curve 802 represents an intermediate value range of the solid state light emitter area ratio $\rho_{SSL}$, in this case varying between 0.19 and 0.28, and curve 803 represents a range with relatively high values of the solid state light emitter area ratio $\rho_{SSL}$, in this case varying between 0.39 and 0.68. A reference light emitting module with a luminescent layer directly on top of the LEDs shows an optical efficiency of about 0.5, thus an efficiency improvement over the reference light emitting module is in this case achieved for a value of the optical efficiency that is larger than 0.5. FIG. 11 shows that the factor c should be larger than about 0.2 to have an optical efficiency larger than 0.5 in the relatively low value range of the solid state light emitter area ratio $\rho_{SSL}$, larger than about 0.3 to have an optical efficiency larger than 0.5 in the intermediate value range of the solid state light emitter area ratio $\rho_{SSL}$, larger than about 0.4 to have an optical efficiency larger than 0.5 in the relatively high value range of the solid state light emitter area ratio $\rho_{SSL}$. Even better values of the optical efficiencies can be reached for larger values of the factor c in the respective ranges of the solid state light emitter area ratio $\rho_{SSL}$.

Figure 12:
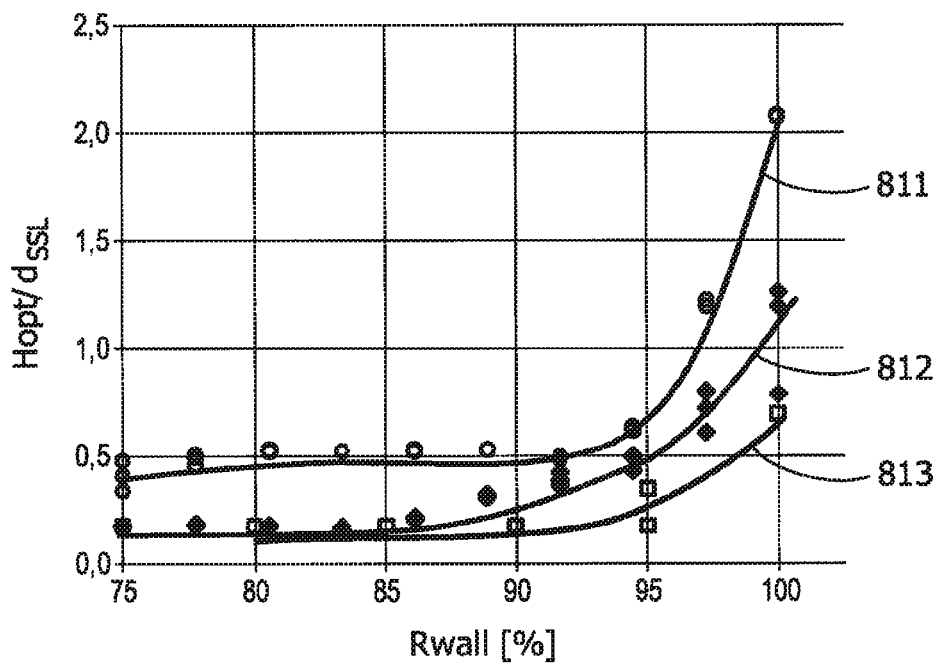

FIG. 12 shows the dependence of the optimum distance h, indicated as Hopt in the graph, on the reflection coefficient of the cavity walls Rwall. The optimum distance Hopt is the distance h between the top surface of the solid state light emitter and the luminescent layer where the optical efficiency of the light emitting module is optimal, e.g. has a local maximum. In FIG. 12 the vertical y-axis represents the quotient of the optimum distance Hopt and the largest linear size of the LED $d_{SSL}$ and the horizontal x-axis represents the reflection coefficient of the cavity walls Rwall in %. In this case the LED area ratio $\rho_{SSL}$ with respect to the base and walls varies for each of the curves, because each of the curves 811, 812, 813 represent a variable distance h between the LED top surface and the luminescent layer, and hence a variable height of the walls and thus the LED area ratio $\rho_{SSL}$ with respect to the total reflective area of the walls and the base varies. For curve 811 the total LED area ratio $\rho_{SSL}$ varies between 0.01 and 0.02, for curve 812 the total LED area ratio $\rho_{SSL}$ varies between 0.16 and 0.22 and for curve 813 the total LED area ratio $\rho_{SSL}$ varies between 0.28 and 0.41. The reflection coefficient of the base Rbase in this case is in a range between 85% and 95%. The optimum distance Hopt between the luminescent layer and the LEDs is determined by a balance of light absorption losses in LEDs and cavity walls. At relatively low values of the distance h between the LED top surface and the luminescent layer the light emitted by the LEDs will interact dominantly with the LED, LED substrate and the surface of base reflector in the LED. At relatively large values of the distance h between the LED top surface and the luminescent layer the area of the walls will become dominant and absorption losses will be dominated by the walls. The optimum distance Hopt between the luminescent layer and the LEDs depends mostly on the reflection coefficient of the surfaces of the walls Rwall and the LED area ratio parameter $\rho_{SSL}$. On average for a relatively low LED area ratio $\rho_{SSL}$ and typical values of the wall reflection coefficient Rwall, for example in the range of 80% to 90%, the optimum distance Hopt is of the order of half of the largest linear size of the LED $d_{SSL}$. Increasing the value of the wall reflection coefficient Rwall, for example to above 95%, results in an increase of the optimum distance Hopt between the LEDs and the luminescent layer. Increasing the LED area ratio $\rho_{SSL}$ results in a decrease of the optimum distance Hopt. It was found that a relatively efficient lighting module is provided for if Rwall<95% and $0.3*d_{SSL} \leq h \leq 0.75*d_{SSL}$ for $0 < \rho_{SSL} < 0.1$, $0.15*d_{SSL} \leq h \leq 0.3*d_{SSL}$ for $0.1 \leq \rho_{SSL} < 0.25$ and $0.1*d_{SSL} \leq h \leq 0.2*d_{SSL}$ for $\rho_{SSL} > 0.25$. Furthermore it was found that in the case that Rwall≥95% a relatively efficient lighting module is provided for when the lighting module fulfills the following criteria: $0.75*d_{SSL} \leq h \leq 2*d_{SSL}$ for $0 < \rho_{SSL} < 0.1$, $0.3*d_{SSL} \leq h \leq 0.7*d_{SSL}$ for $0.1 \leq \rho_{SSL} \leq 0.25$ and $0.2*d_{SSL} \leq h \leq 0.5*d_{SSL}$ for $\rho_{SSL} > 0.25$. The results of FIG. 12 consider only cavities with walls orthogonal to the base and a uniform LED placement. For tilted walls and/or non uniform LED placement the optimum distance between the LEDs and the luminescent layer may increase.

Figure 13:
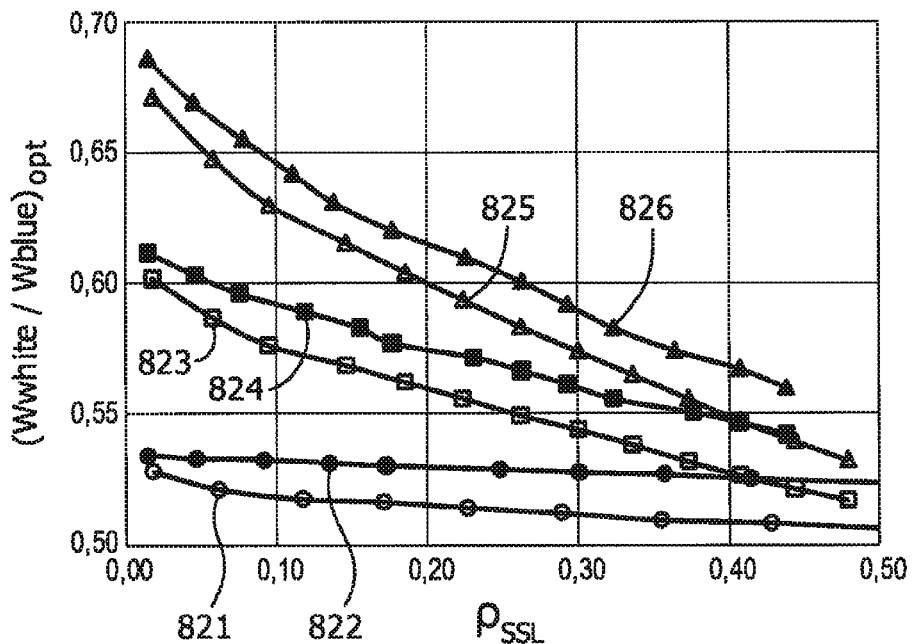

FIG. 13 shows the influence of the total solid state light emitter area ratio $\rho_{SSL}$ on the optical efficiency for several combinations of base and wall reflection coefficients. In FIG. 13 the vertical y-axis represents the optimum value of the efficiency of the optical performance expressed by the ratio of the flux of white radiation exiting the mixing cavity Wwhite (units: Watt) and the total blue flux emitted by the solid state light emitters in first spectral range, usually the blue spectral range, Wblue (units: Watt). The optimum value of the optical efficiency is determined by varying the distance h between the solid state light emitter top surface and the luminescent layer. The horizontal x-axis represents the solid state light emitter area ratio $\rho_{SSL}$ with respect to the base and wall area. In total six curves 821, 822, 823, 824, 825, 826 are shown for two different values of the base reflection coefficient Rbase and three different values of the reflection coefficient of the cavity walls Rwall. Curve 821 represents Rbase=80% and Rwall=90%, curve 822 represents Rbase=80% and Rwall=98%, curve 823 represents Rbase=90% and Rwall=90%, curve 824 represents Rbase=90% and Rwall=98%, curve 825 represents Rbase=98% and Rwall=90% and curve 826 represents Rbase=98% and Rwall=98%. FIG. 13 shows that there is an inverse relation between the optimum value of the optical efficiency of the light mixing cavity and the solid state light emitter area ratio $\rho_{SSL}$. FIG. 13 further shows that three ranges of the solid state light emitter area ratio $\rho_{SSL}$ values can be distinguished: a relatively low, an intermediate and a relatively high range of the values of the solid state light emitter area ratio $\rho_{SSL}$. At relatively low values of $\rho_{SSL}$, for example $\rho_{SSL} < 0.1$, the influence of the value of the reflection coefficient of the wall Rwall on the value of the optical efficiency is almost negligible compared to the influence of the value of the reflection coefficient of the base Rbase, i.e. changing the value of the base reflection coefficient Rbase has an impact on the optical efficiency of the light emitting module and a change of the value of the wall reflection coefficient Rwall impacts the optical efficiency in a negligible way in this relatively low value range of the solid state light emitter area ratio $\rho_{SSL}$. At relatively high values of PSSL, for example if $\rho_{SSL} > 0.25$, the influence of the value of the reflection coefficient of the walls Rwall on the value of the optical efficiency is comparable to the influence of the reflection coefficient of the base Rbase, i.e. changing the value of the base reflection coefficient Rbase has a comparable impact on the optical efficiency of the light emitting module as a change of the value of the wall reflection coefficient Rwall in this high value range of the solid state light emitter area ratio $\rho_{SSL}$. At intermediate values of $\rho_{SSL}$, for example $0.1 \leq \rho_{SSL} \leq 0.25$, the influence of the reflection coefficient of the base Rbase on the value of the optical efficiency is larger than the, in this range non-negligible, influence of the value of the reflection coefficient of the walls Rwall, i.e. changing the value of the base reflection coefficient Rbase has an impact on the optical efficiency of the light emitting module and a change of the value of the wall reflection coefficient Rwall also impacts the optical efficiency but to a lesser extent in this intermediate value range of the solid state light emitter area ratio $\rho_{SSL}$.

Figure 14:
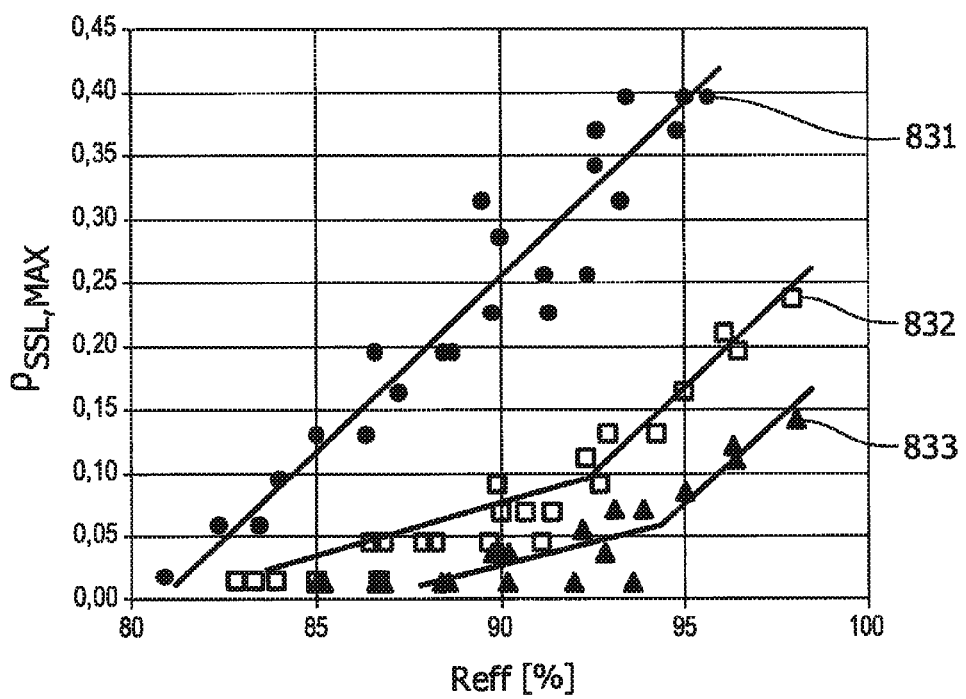

FIG. 14 shows the dependence of a maximum possible solid state light emitter area ratio at which a gain in optical efficiency is achieved as a function of the effective reflectivity coefficient Reff of the base and the walls according to an aspect of the invention. The vertical y-axis in FIG. 14 represents the maximum possible solid state light emitter area ratio, indicated as $\rho_{SSL,MAX}$, at which an improved optical efficiency is achieved with respect to a lighting emitting module with the luminescent layer placed directly on top of the solid state light emitter. The horizontal x-axis represents the effective reflectivity coefficient of the cavity base and walls surfaces Reff. The set of data points 831 represents a distance h between the solid state light emitter surface and the luminescent layer of 0.35 times the largest linear size $d_{SSL}$ of the solid state light emitter, the set of data points 832 represents a distance h of 1.04 times the largest linear size $d_{SSL}$ of the solid state light emitter and the set of data points 833 represents a distance h of 1.73 times the largest linear size $d_{SSL}$ of the solid state light emitter. The results allow to predict the maximum possible solid state light emitter area ratio PSSL, MAX at a certain distance h which still allows for a relatively large light recycling efficiency and relatively good performance compared to the same number of solid state light emitters with the luminescent layer placed directly on the solid state light emitters. From FIG. 14 it can be concluded that a larger value of the effective reflection coefficient Reff allows for a larger value of the solid state light emitter area ratio PSSL, MAX (depending on the distance h between the solid state light emitter top surface and the luminescent layer) while still achieving an improved optical efficiency with respect to a reference situation in which the luminescent layer is placed directly on the solid state light emitters. Increasing the distance h between the solid state light emitter and the luminescent layer decreases the maximum allowed solid state light emitter area ratio $\rho_{SSL,MAX}$ at similar values of the effective reflection coefficient Reff which still provides for an improved optical efficiency with respect to the reference situation in which the luminescent layer is placed directly on the solid state light emitters.

Figure 15:
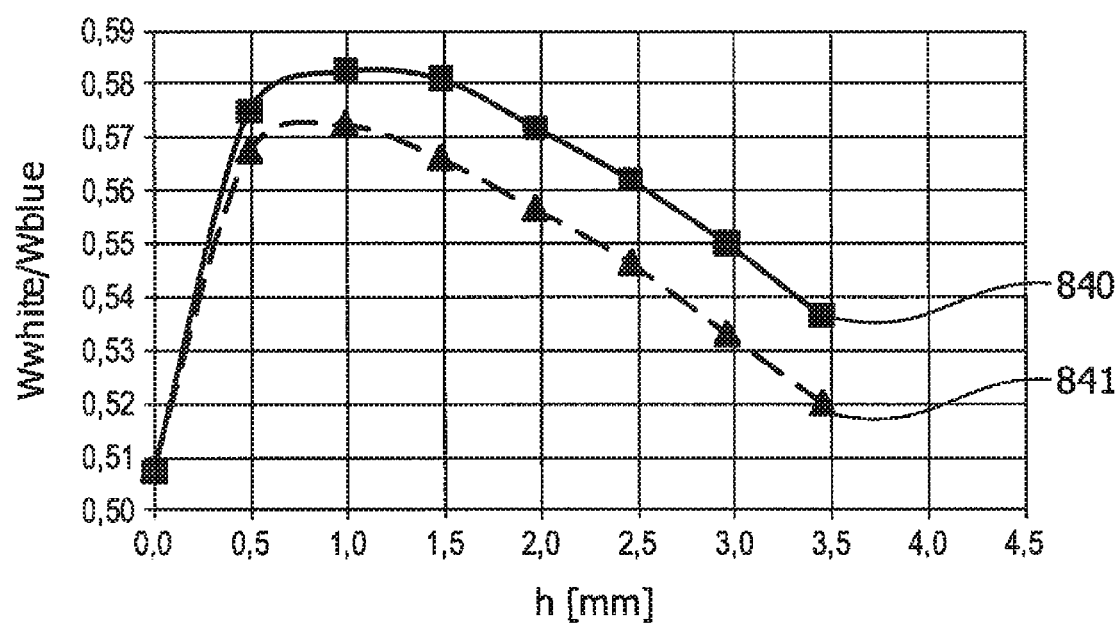

FIG. 15 shows a comparison of optical modeling results for a light emitting module according to the invention with walls orthogonal to the base and cavities with tilted walls. The results were obtained from optical simulation modeling with four LEDs each having a die area of 2 mm². The diameter of the luminescent layer is 6.5 mm and the LED area ratio $\rho_{SSL}$ with respect to the base area only is 0.241 and 0.298 for the orthogonal and tilted walls respectively. Also in this case the LED area ratio $\rho_{SSL}$ with respect to the base and the walls varies as a function of the distance h between the LED and the luminescent layer. The angle between the reflective surface of the tilted walls and the reflective surface of the base is in this case in a range of 5 to 33 degrees. In FIG. 15 the vertical y-axis represents the efficiency of the optical performance expressed as the ratio of the flux of white radiation exiting the mixing cavity Wwhite (units: Watt) and the total blue flux emitted by the solid state light emitters in blue spectral range Wblue (units: Watt) and the horizontal x-axis represents the distance h between the LED top surface and the luminescent layer in millimeters. Curve 841 represents the light emitting module with the orthogonal walls and curve 840 represents the light emitting module with the inclined or tilted walls. It is clear that a relatively large optical efficiency can be achieved by the tilting of the walls for this embodiment in which the LED area ratio $\rho_{SSL}$ is in the intermediate value range. The optimum value of the optical efficiency in this case is achieved at a distance h between the LED top surface and the luminescent layer of approximately 1.1 mm and 0.75 mm for tilted and orthogonal walls respectively, at which distance the LED area ratio $\rho_{SSL}$ with respect to the base and the walls is 0.18 for the light emitting module with the straight walls and 0.21 for the light emitting module with the inclined or tilted walls. For light emitting modules with an intermediate LED area ratio $\rho_{SSL}$ a significant amount of light reflected from the walls can impinge on the poor reflecting LED area. Tilting of the walls improves the situation by a more efficient re-direction of light toward the exit window comprising the luminescent layer which results in relatively large Wwhite/Wblue values and thus an improved optical efficiency. This effect becomes more pronounced for relatively large values of the LED area ratio $\rho_{SSL}$. For relatively small values of the LED area ratio $\rho_{SSL}$ the walls are more distant from the LEDs and tilting of the walls will have a relatively small effect on the optical efficiency.

Figure 16A:
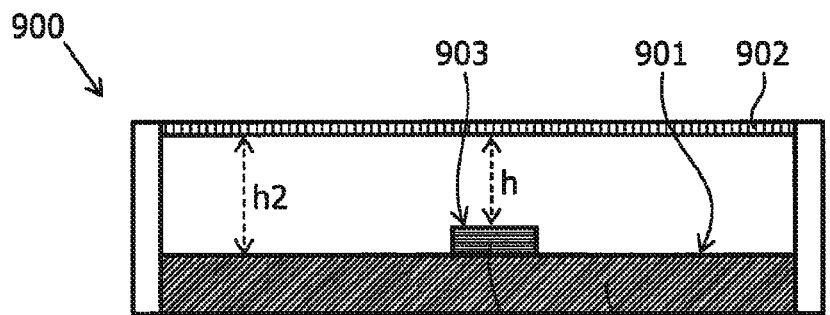
FIG. 16c shows a graph with the results of simulations of the embodiments of the light emitting module according to FIGS. 16a and 16b, FIG. 17a schematically shows a top view of an embodiment of a light emitting module according to the invention.
Figure 16B:
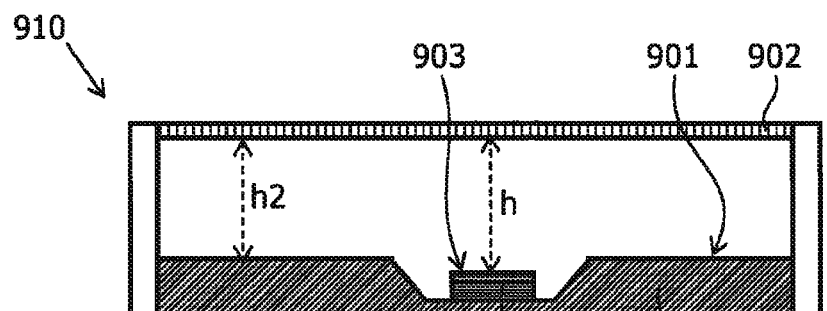

From manufacturing point of view, LED dies can be positioned on a highly reflective PCB board, without filling the space in between LED packages with white reflecting material. In this case the reflective surface of the base can be positioned on a significantly lower level than the surface of LED dies. The influence of the distance h between the top surface of the LED and the luminescent layer and the distance between the surface of the reflective base and the luminescent layer, indicated as h2, on the optimum position of the luminescent layer was investigated by means of optical ray-trace modeling of a light emitting module according to the invention with one LED. FIG. 16a shows a cross-section of a first light emitting module 900 having a base 906, a solid state light emitter 908, for example a LED, and a reflective base surface 901 that is further removed from a luminescent layer 902 than a top surface 903 of the LED 908, i.e. h2>h. FIG. 16b shows a cross-section of a second light emitting module 910, for example a LED, in which the reflective base surface 901 is closer to the luminescent layer 902 than the top surface 903 of the LED, i.e. h2<h. In the latter case there is a conical opening or recess in the center of reflective base, with an angle of for example 45 degrees.

Figure 16C:
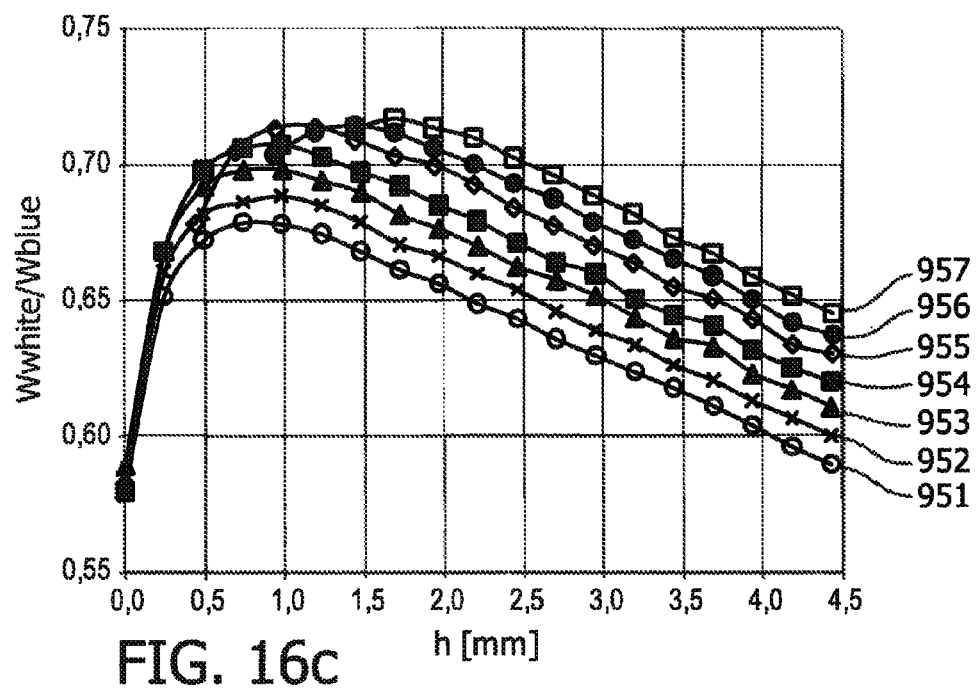

FIG. 16c shows the results of simulations in which the vertical y-axis represents the efficiency of the optical performance expressed as the ratio of the flux of white radiation exiting the mixing cavity Wwhite (units: Watt) and the total blue flux emitted by the solid state light emitter 908 in the first, blue, spectral range Wblue (units: Watt) and the horizontal x-axis represents the distance h between the luminescent layer 902 and the top surface 903 of the solid state light emitter 908. FIG. 16c shows seven curves 951, 952, 953, 954, 955, 956, 957 each representing a different value for the difference between the distance h2 between the reflective base surface 901 and the luminescent layer 902 and the distance h between the LED top surface 903 and the luminescent layer 902. Curves 951, 952 and 953 represent variations of the first light emitting module 900 in which the reflective base surface 901 is further away from the luminescent layer 902 than the LED top surface 903, i.e. h2>h: curve 951 represents h2=h+1.5 mm, curve 952 represents h2=h+1.0 mm and curve 953 represents h2=h+0.5 mm. Curve 954 represents the situation in which the distance h2 between the reflective base surface 901 and the luminescent layer 902 is equal to the distance h between the LED top surface 903 and the luminescent layer 902, i.e. h2=h. Curves 955, 956 and 957 represent variations of the second light emitting module 910 in which the reflective base surface 901 is closer to the luminescent layer 902 than the LED top surface 903, i.e. h2<h: curve 955 represents h2=h−0.5 mm, curve 956 represents h2=h−1.0 mm and curve 957 represents h2=h−1.5 mm. From the curves in FIG. 16c it can be concluded that for the LED device 910 in which the reflective base surface 901 is closer to the luminescent layer 902 than the top surface 903 of the LED, i.e. h2<h, the optimum value of the distance h between the LED top surface 903 and the luminescent layer 902, which is the value of the distance h for which the optical efficiency has an optimum, e.g. a local maximum, is almost independent of the distance h2 between the reflective base surface 901 and the luminescent layer 902. Thus, the criteria for the distance h between the top surface of the solid state light emitter and the luminescent layer, as defined above, can also be applied for this first light emitting module 900. When the reflective base surface 901 is closer to the luminescent layer 902 than the top surface 903 of the LED, for example in the case that the LED is placed in a recess in the reflective base, i.e. h>h2, the distance h at which the efficiency has an optimum is larger with respect to the situation in which the reflective base surface 901 and the LED surface 903 have an equal distance to the luminescent layer 902. For the second light emitting module 910 where the reflective base surface 901 is closer to the luminescent layer 902 than the top surface 903 of the LED, i.e., h2<h, the criteria for the distance change to: $0.4*d+\Delta h/2 < h < 5*d+\Delta h/2$ for $\rho_{SSL}<0.1$, $0.15*d+\Delta h/2 < h < 3*d+\Delta h/2$ for $0.1 \leq \rho_{SSL} \leq 0.25$, and $0.1*d+\Delta h/2 < h < 2*d+\Delta h/2$ for $\rho_{SSL}>0.25$, in which $\Delta h$ is the absolute value of the distance between the surface of the reflective base 901 and the top surface 903 of the LED, i.e. $\Delta h=|h2-h|$.

The relative positioning or placement of the plurality of solid state light emitters on the base is another design parameter. The placement of the solid state light emitters in the cavity may influence the distribution and uniformity of the optical flux in the exit window of the cavity comprising the luminescent layer. It is desirable to avoid optical hot spots which may result in thermal hot spots. This is especially important for the center of the cavity where the heat load in the luminescent layer is more difficult to transport to a PCB board and to a heat sink for example because of the relatively long distance and/or due to the relatively low thermal conductivity of the optical material filling the cavity, with respect to the, in some embodiments, relatively high thermal conductivity of the cavity walls.

Figure 17A:
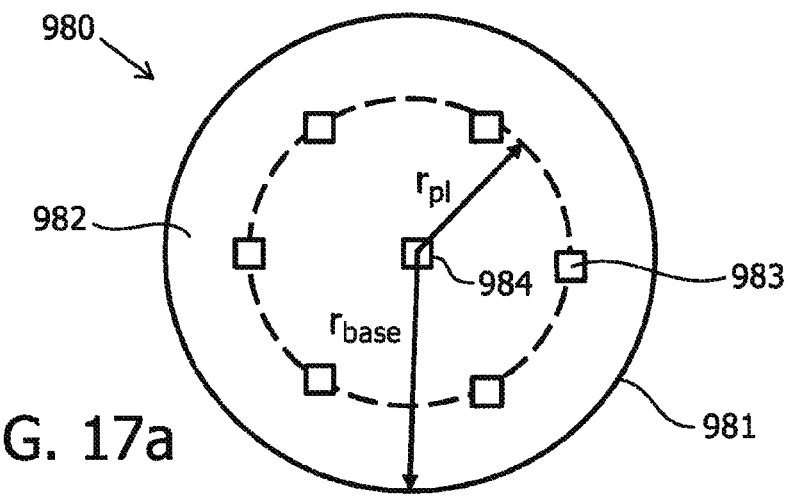
FIGS. 17b, 17c and 17d show three other graphs with the results of simulations of the embodiment of the light emitting module according to FIG. 17a, FIG. 18 shows another graph with the results of simulations of the light emitting module according to the invention.
Figure 17B:
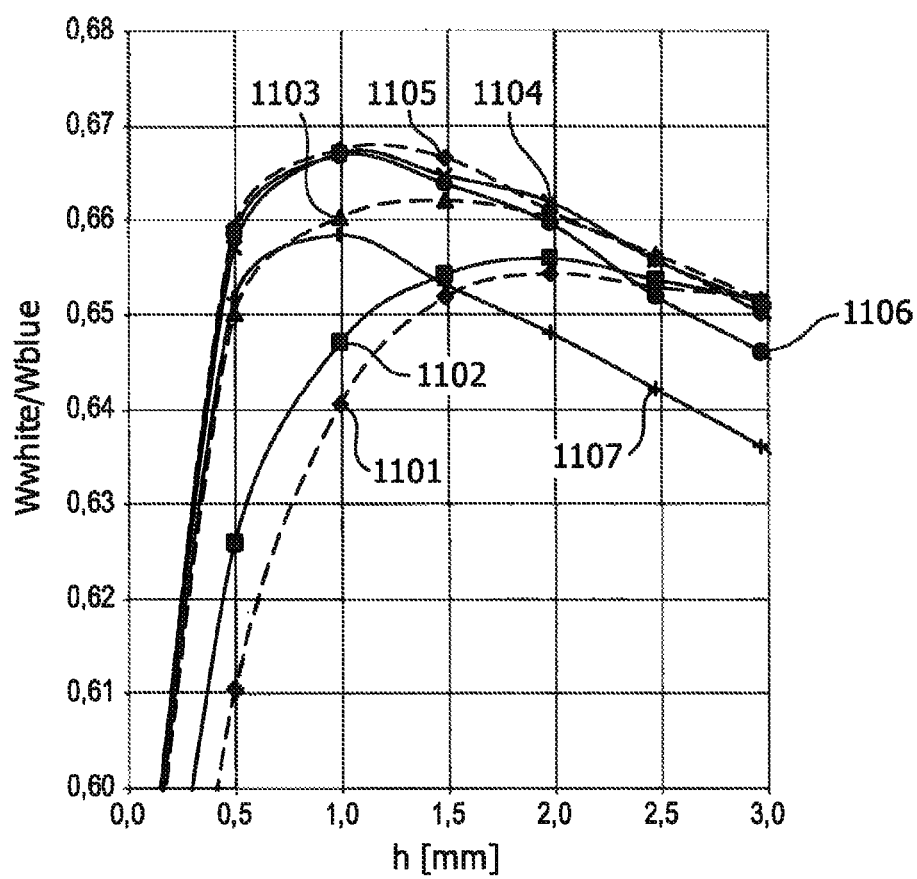
Figure 17C:
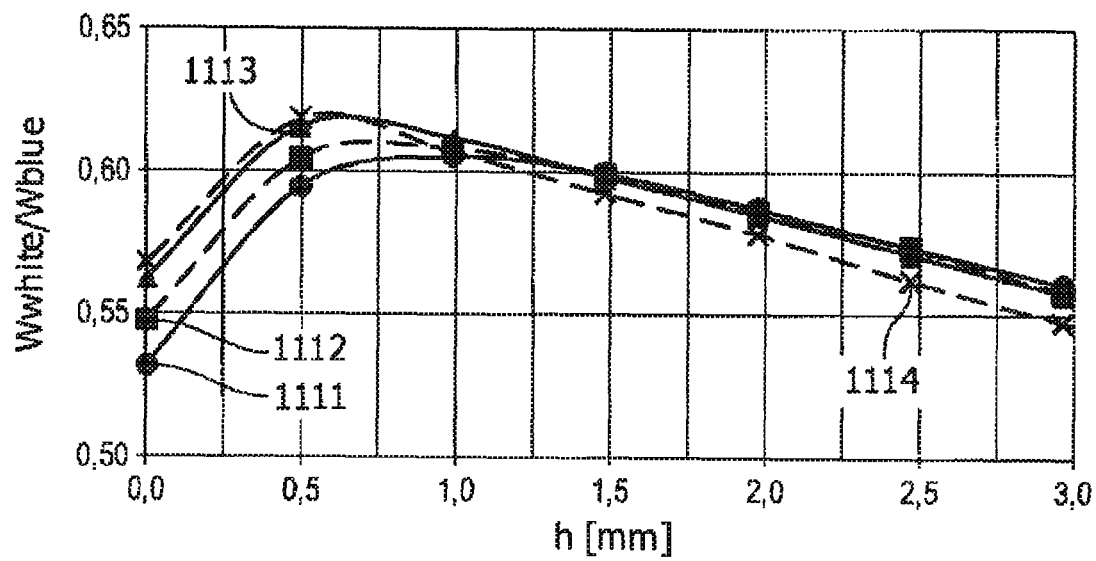
Figure 17D:
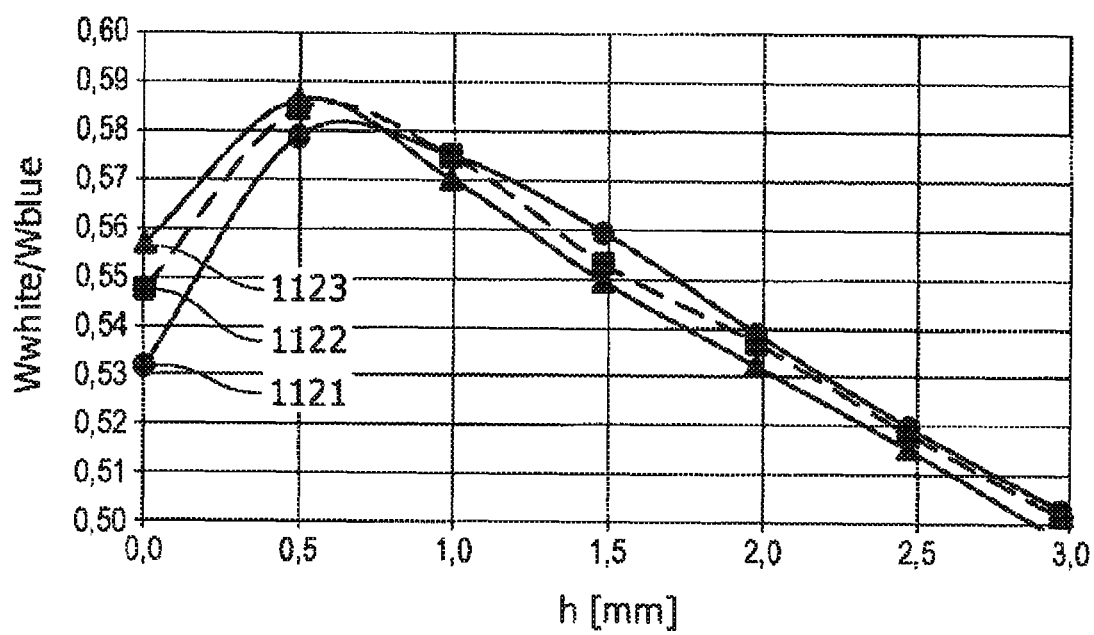

The influence of different LED distributions inside the cavity on efficiency and on optimum distance between the LEDs and the luminescent layer is investigated with optical ray-trace modeling of a light emitting module according to the invention. FIG. 17a shows a schematic top view of a light emitting module 980 with a wall 981 and a base surface 982 in which one LED 984 is positioned in the center of the base 982 and six other LEDs 983 are positioned on an imaginary circle with a radius of placement $r_{pl}$, equidistant from the center and equidistant from each other. The light emitting module 980 in this case comprises seven LEDs each having an area of 1×1 mm². The calculations are performed for three different values base radius $r_{base}$, respectively 7.46 mm, 3.05 mm and 2.36 mm. The distance between the LED top surface and the luminescent layer has been varied, resulting in different height values of the walls, and thus in different areas of the wall. Therefore the value of the solid state emitter area ratio $\rho_{SSL}$ with respect to the base and walls ranges between 0.02 and 0.04 for the case where $r_{base}$ is 7.46 mm, between 0.09 and 0.22 for the case where $r_{base}$ is 3.05 mm and between 0.13 and 0.39 for the case where $r_{base}$ is 2.36 mm. FIGS. 17b, 17c and 17d show the results of the optical ray tracing simulations in which the vertical y-axis represents the efficiency of the optical performance expressed as the ratio of the flux of white radiation exiting the mixing cavity Wwhite (units: Watt) and the total blue flux emitted by the solid state light emitter in blue spectral range Wblue (units: Watt) and the horizontal x-axis represents the distance h in millimeters between the luminescent layer and the LED top surface. The different curves in FIGS. 17b, 17c and 17d represent different values of the placement radius $r_{pl}$. In FIG. 17b shows the results at a base radius $r_{base}$ of 7.46 mm and curve 1101 represents $r_{pl}$=1.2 mm, curve 1102 represents $r_{pl}$=1.5 mm, curve 1103 represents $r_{pl}$=2.5 mm, curve 1104 represents $r_{pl}$=3.5 mm, curve 1105 represents $r_{pl}$=4.5 mm, curve 1106 represents $r_{pl}$=5.5 mm and curve 1107 represents $r_{pl}$=6.5 mm. In FIG. 17c shows the results at a base radius $r_{base}$ of 3.05 mm and curve 1111 represents $r_{pl}$=1.2 mm, curve 1112 represents $r_{pl}$=1.4 mm, curve 1113 represents $r_{pl}$=1.8 mm and curve 1114 represents $r_{pl}$=2.2 mm. In FIG. 17d shows the results at a base radius $r_{base}$ of 2.36 mm and curve 1121 represents $r_{pl}$=1.2 mm, curve 1122 represents $r_{pl}$=1.4 mm and curve 1123 represents $r_{pl}$=1.6 mm.

A comparison of the curves of FIG. 17b with those of FIGS. 17c and 17d shows that the influence of different LED positioning on the optical efficiency and the optimum LED top surface to luminescent layer distance, where the efficiency has an optimum, is more pronounced for the cavity with the relatively low LED area ratio $\rho_{SSL}$, the results of which are shown in FIG. 17b. FIG. 17b further shows two extreme cases of LED placement, in which the outer LEDs are placed relatively close to the center, corresponding to the lowest value of the radius of placement $r_{pl}$ and curve 1101, or relatively close to the walls, corresponding to the largest value of the radius of placement $r_{pl}$ and curve 1107. Both extremes cases result in a relatively low value of the optical efficiency.

When the LEDs are placed relatively close together, such that the space in between the LEDs is comparable to the size of the LEDs, then the reflectivity of the base surface around each of the LEDs reduces significantly and the situation may be approximated with a model of one large LED die (a multi-die LED). In this multi die LED situation the optimum distance between the LED top surfaces and the luminescent layer is increased to achieve an efficient recycling of light, which is clearly visible for the light emitting module with the relatively low LED area ratio $\rho_{SSL}$ (see FIG. 17b). This effect is less pronounced for the light emitting modules with the medium to high LED area ratio $\rho_{SSL}$ (FIGS. 17c and 17d). For these latter light emitting modules there is less influence of the LED placement on the optical efficiency, viz. placing the LEDs closer to the center or closer to the cavity walls has less influence on the optical efficiency, than the light emitting modules with a relatively low value of the LED area ratio $\rho_{SSL}$.

For optical efficiency reasons it is preferred to place the solid state light emitters equidistant from each other and equidistant from the walls. Non-uniform solid state light emitter placement results in hot spots and also increases the light absorption losses in the solid state light emitters. A relatively high value of the solid state light emitter area ratio $\rho_{SSL}$ reduces the sensitivity of the optical efficiency Wwhite/Wblue on the placement of the solid state light emitters, also because in this case there is less physical space on the light emitting module for changing the location of the LED. The value of the optimum distance between the solid state light emitter top surface and the luminescent layer, which corresponds to the distance resulting in the highest optical efficiency, is generally lower for relatively large values of the solid state light emitter area ratio $\rho_{SSL}$.

In order to achieve high efficiency values of the cavity it is preferred that all surfaces inside the cavity are highly reflective over the whole spectral range of the device. For this purpose not only wall surfaces but also spaces in between LED packages and LED substrates themselves are additionally coated with, for example, white reflecting coating, for example TiO$_2$ filled silicone. For practical reasons the step of applying a reflective coating on the LED packages is difficult. Therefore the reflectivity coefficients of surfaces next to the LED other than the base surface are in practice relatively low.

Figure 18:
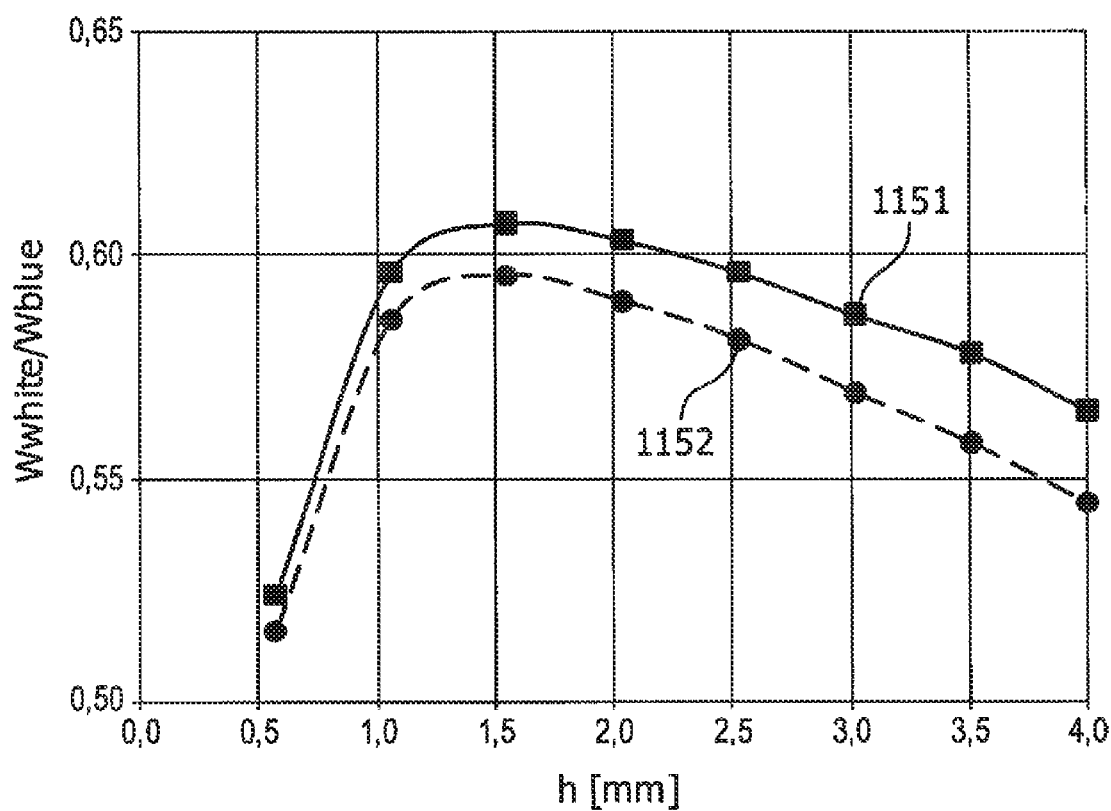

FIG. 18 shows the results of optical ray tracing simulations in which the vertical y-axis represents the efficiency of the optical performance expressed as the ratio of the flux of white radiation exiting the mixing cavity Wwhite (units: Watt) and the total blue flux emitted by the solid state light emitter in blue spectral range Wblue (units: Watt) and the horizontal x-axis represents the distance h in millimeters between the luminescent layer and the top surface of the LED. The simulations included four LEDs each having a die area of 2 mm$^2$ and the diameter of the luminescent layer is 6.5 mm. Curve 1152 represents an uncoated LED package and curve 1151 represents a LED package coated with a reflective layer. FIG. 18 shows that uncoated LED packages have a somewhat lower optical efficiency with respect to the LED packages with a reflective coating, but no significant changes in the optimum LED surface to luminescent layer distance h were observed. These simulation results were verified by an experiment with uncoated and coated LED packages which showed an increase of approximately 7% in optical efficiency for the LED package with the reflective coating with respect to the uncoated LED package.

Figure 19A:
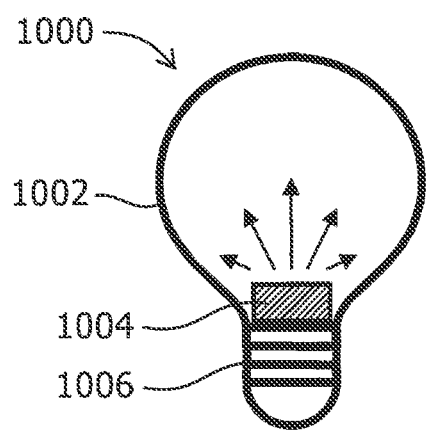
FIGS. 19a and 19b show two embodiments of lamps according to an aspect of the invention.

FIG. 19a shows an embodiment of a lamp 1000 according to the second aspect of the invention. The lamp 1000 comprises a retrofit light bulb 1002 which is connected to a lamp base 1006 which includes a heat sink, a power driver and electrical connections. On the lamp base 1006 is provided a light emitting module 1004 according to the first aspect of the invention. It is to be noted that embodiments of the lamp are not limited to lamps that have the size of a traditional light bulb. Other shapes, likes tube, are possible as well. Alternative lamp types, such a spot lamps or downlighter may be used as well. The lamps may comprise a plurality of light emitting modules as well.

Figure 19B:
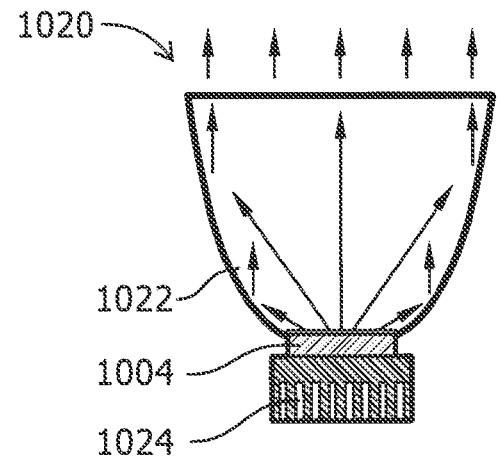

FIG. 19b shows another embodiment of a lamp 1020. Lamp 1020 is a spot lamp which comprises a reflector 1022 for collimating the light which is emitted by a light emitting module 1004. The light emitting module 1004 is thermally coupled to a heat sink 1024 for conducting the heat away from the light emitting module 1004 and providing the heat to the ambient of the lamp 1020. The heat sink 1024 may be passively or actively cooled.

Figure 19C:
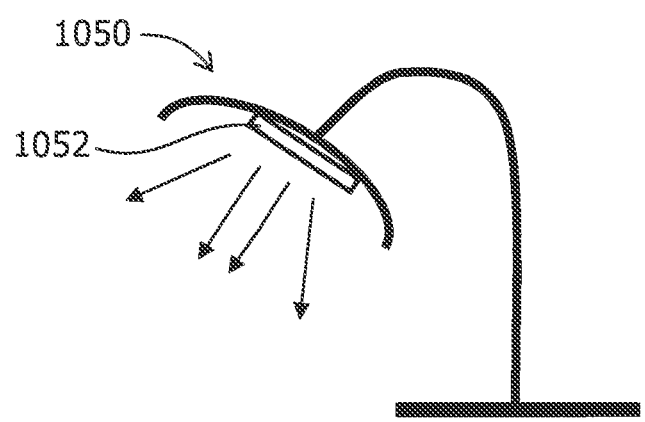
FIG. 19c shows an embodiment of a luminaire according to an aspect of the invention, FIG. 20 schematically shows an embodiment of a cross-section of the embodiment of the light emitting module according to the invention.

FIG. 19c shows an embodiment of a luminaire 1050 according to the third aspect of the invention. The luminaire 1050 comprises a light emitting module 1052 according to the first aspect of the invention. In other embodiments, the luminaire 1050 comprises a lamp according to the second aspect of the invention.

The lamp according to the second aspect of the invention and the luminaire according to the third aspect of the invention, have similar embodiments with similar effects as the light emitting module of the first aspect of the invention as described with reference to FIGS. 1-18.

Figure 20:
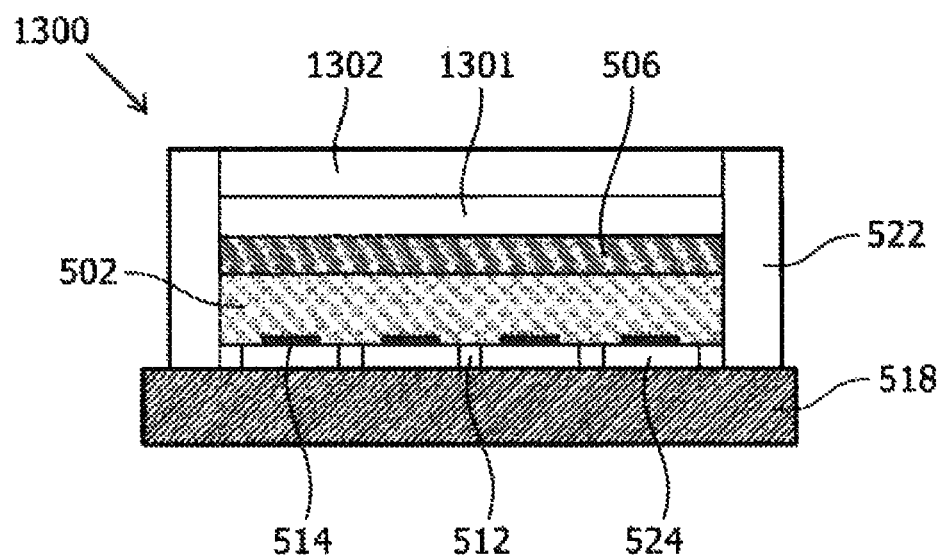

FIG. 20 presents another embodiment of the light emitting module according to the invention. Light emitting module 1300 comprises a base 518, a plurality of light emitting diodes 514 provided on substrates 524, a luminescent layer 506, reflective walls 522, a transparent material 502, and light reflective particles filled layer 512, similar to light emitting module 520. However, a layer of air 1301 and a polarizing element 1302 are positioned on the luminescent layer 506 at the side facing away from the light emitting diodes 514. Light emitting module 1300 generates, in use, polarized light that can be used, amongst others, for street lighting, office lighting and retail lighting, and is capable of reducing the amount of glare in these applications. Alternatively, it can be used in liquid crystal display (LCD) backlighting applications, reducing the cost level as no separate polarizer is necessary any more. Light exiting the luminescent layer 506 and impinging on the polarizing element 1302 with the correct polarization is transmitted through the polarizing element, while light with the non-correct polarization is directed back into the luminescent layer 506 and the cavity of the light emitting module 1300. This light will be randomly polarized or depolarized by scattering in the luminescent layer 506 and/or by diffusive reflection inside the cavity via the reflective walls 522 and/or the light reflective particles filled layer 512, reflected again in the direction of the polarizing element 1302, and light with the correct polarization will be transmitted through the polarizing element 1302. The non-transmitted light is directed back again into the luminescent layer 506 and the cavity, where this process is repeated. Due the relatively high light recycling efficiency of the cavity, the light emitting module 1300 is a relatively efficient polarized light source. The polarizing element 1302 is separated from the luminescent layer 506 by a layer of air 1301 to improve the thermal stability of the polarizing element 1302 due to heat generated in the luminescent layer 506. In an alternative embodiment, the polarizing element 1302 is in direct contact with the luminescent layer 506, for example on a ceramic layer that contains the luminescent material. The polarizing element 1302 may be a reflective or a scattering polarizer. The polarizing element 1302 may be a reflective polarizing foil, for example commercially available Vikuity DBEF foil from 3M. Alternatively, polarizing element 1302 comprises narrow metal lines with high reflectivity, for example commercially available from Moxtek. By varying the width of the metal lines and/or the pitch between the metal lines, the amount of polarization versus light transmission can be optimized.

Figure 21:
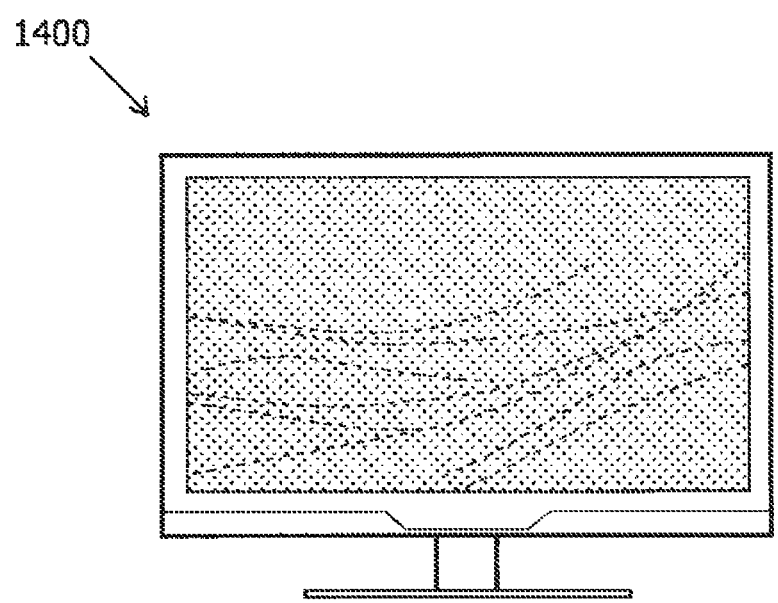
FIG. 21 shows an embodiment of a display device according to an aspect of the invention.

FIG. 21 shows an embodiment of a display device 1400 according to the fourth aspect of the invention. The display device comprises a light emitting module according to the invention as described with reference to FIGS. 1 to 18 and 20. In use, the light emitting module may act as a backlighting unit for a LCD display device or as a light source unit to inject polarized light in a lightguide layer of the backlight system. As the light emitting module generates relatively efficient (polarized light), the cost level of the display device 1400 is reduced.

In all applicable embodiments, in the cavity a solid state light emitter may be provided which emits light in at least one sideward direction. The sideward emission is typically obtained by providing two additional layers on top of a general purpose solid state light emitter, which are a layer of a transparent material and a layer of a light reflective material. A LED, which is a solid state light emitter, is often manufactured on a substrate of transparent sapphire. After manufacturing, in many cases, the layer of sapphire is removed. However, when the sapphire is not removed, or only partially removed, the addition of a light reflective coating to a surface of the sapphire layer which is substantially opposite to the LED results in the manufacturing of the sideward emitting solid state light emitter. Alternatively, a piece of glass or sapphire may be adhered to the LED.

In another embodiment one or more additional solid state light emitter(s) may be provided on the wall of the light emitting module. In that case the reflective area of the wall surface should be corrected by the area of the solid state light emitter(s) that are provided on the wall of the light emitting module.

In an embodiment the light emitting module further comprises a dome shape or lens shape optical body may be present on a side of the partially diffusive reflective layer which faces away from the light exit window. Alternatively, or additionally, a diffuser layer for obtaining a diffuse light emission, for obtaining a spatially, color and color over-angle uniform light emission, and for obtaining a color mixed light emission is provided at a distance from the side of the partially diffusive reflective layer facing away from the at least one solid state light emitter.

For all applicable embodiments the walls and base may be manufactured of the one and the same material and glued together. In another embodiment, the walls and base are different materials. It is to be noted that the base, as drawn, may extend beyond the walls, for example, when one base is shared by a plurality of neighboring light emitting modules, for example, when the base is a heat conducting Printed Circuit Board.

The invention can typically be applied on a module level, for example PCB board, that comprises at least one but typically multiple LED packages. However the invention may also be used on LED packages, comprising either one or more than one LED dies or chips. Also the LED dies or chips may comprise the so-called Chip-on-Boards type in which the LED dies are directly attached to a (PCB) board without intermediate LED packages. Additionally wire-bond connections from the LED die(s) to the board may be used.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A light emitting module comprising:
a light exit window;
a base comprising a light reflective surface facing the light exit window, the light reflective surface having a base reflection coefficient (Rbase) being defined by a ratio between the amount of light that is reflected by the light reflective surface of the base and the amount of light that impinges on the light reflective surface of the base;
at least one solid state light emitter disposed on the base arranged for emitting light of a first color, the at least one solid state light emitter having a top surface and having a solid state light emitter reflection coefficient (R_SSL) being defined by a ratio between the amount of light that is reflected by the top surface and the amount of light that impinges on the top surface,
wherein the top surface of the at least one solid state light emitter faces towards the light exit window,
a wall interposed between the base and the light exit window, the base, the wall and the light exit window enclosing a cavity, the wall comprising a reflective material forming a light reflective wall surface facing towards the cavity, the light reflective wall surface having a wall reflection coefficient (Rwall) being defined by a ratio between the amount of light that is reflected by the light reflective wall surface and the amount of light that impinges on the light reflective wall surface,
wherein an effective reflective coefficient (Reff) is defined as a weighted average of the base reflection coefficient (Rbase) and the wall reflection coefficient (Rwall),
wherein a solid state light emitter area ratio ($\rho_{SSL}$) is defined as the ratio between the area of the top of the at least one solid state light emitter and the sum of the area of reflective surface of the base and the area of the reflective wall surface, and wherein a largest linear size ($d_{SSL}$) of the top surface of the at least one solid state light emitter is defined as the longest distance from a point on the top surface of the at least one solid state light emitter to another point on the top surface of the at least one solid state light emitter along a straight line, and
a partially diffusive reflective layer, comprising a luminescent material for converting at least a part of the light of the first color into light of a second color, the light exit window comprising at least a part of the partially diffusive reflective layer,
wherein a gap with a distance h is present between the top surface of the at least one solid state light emitter and the partially diffusive reflective layer for which $0.3 \cdot d_{SSL} \leq h \leq 0.75 \cdot d_{SSL}$ for $0 < \rho_{SSL} < 0.1$, $0.15 \cdot d_{SSL} \leq h \leq 0.3 \cdot d_{SSL}$ for $0.1 \leq \rho_{SSL} \leq 0.25$, and $0.1 \cdot d_{SSL} \leq h \leq 0.2 \cdot d_{SSL}$ for $\rho_{SSL} > 0.25$, and
wherein the value of the effective reflection coefficient (Reff) is larger than 70% and larger than the solid state light emitter reflection coefficient (R_SSL) and wherein the wall reflection coefficient (Rwall) is smaller than 95%.

2. A light emitting module according to claim 1, comprising a plurality of solid state light emitters, wherein each one of the solid state light emitters is configured for emitting light in a specific color and each one of the solid state light emitters having a top surface, and wherein the solid state light emitter reflection coefficient (R_SSL) is defined as the average value of the reflection coefficients of the plurality of solid state light emitters.

3. A light emitting module according to claim 1 wherein the value of the effective reflection coefficient (Reff) is larger than the solid state light emitter reflection coefficient (R_SSL) plus a factor c times the difference between 1 and the solid state light emitter reflection coefficient (R_SSL), wherein $0.2 \leq c \leq 1$ for $0 < \rho_{SSL} < 0.1$, $0.3 \leq c \leq 1$ for $0.1 \leq \rho_{SSL} \leq 0.25$, and $0.4 \leq c \leq 1$ for $\rho_{SSL} > 0.25$.

4. A light emitting module according to claim 1, wherein at least a part of the reflective surface of the base is closer to the partially diffusive reflective layer than the top surface of the at least one solid state light emitter,
and wherein the distance h between the top surface and the partially diffusive reflective layer is $0.4 * d_{SSL} + \Delta h/2 \leq h \leq 5 * d_{SSL} + \Delta h/2$ for $0 < \rho_{SSL} < 0.1$, $0.15 * d_{SSL} + \Delta h/2 \leq h \leq 3 * d_{SSL} + \Delta h/2$ for $0.1 \leq \rho_{SSL} \leq 0.25$, and $0.1 * d_{SSL} + \Delta h/2 \leq h \leq 2 * d_{SSL} + \Delta h/2$ for $\rho_{SSL} > 0.25$, and wherein $\Delta h$ is the absolute value of the difference between the distance (h) between the top surface of the at least one solid state light emitter and the partially diffusive reflective layer and the shortest distance between the reflective base surface and the partially diffusive reflective layer.

5. A light emitting module according to claim 1, wherein the light reflective wall surface is tilted with respect to a normal axis of the base wherein the tilt increases the reflection of light towards the light exit window.

6. A light emitting module according to claim 1, wherein the partially diffusive reflective layer forms the light exit window, the partially diffusive reflective layer having an edge, and the edge of the partially diffusive reflective layer being in contact with the base.

7. A light emitting module according to claim 1, comprising a substantially transparent material arranged between the at least one solid state light emitter and the partially diffusive reflective layer, the transparent material being optically coupled to the at least one solid state light emitter.

8. A light emitting module according to claim 7 wherein the substantially transparent material is further optically and thermally coupled to the partially diffusive reflective layer.

9. A light emitting module according to claim 7 wherein the substantially transparent material is sintered translucent polycrystalline alumina with a grain size that is larger than 44 μm or smaller than 1 μm.

10. A light emitting module according to claim 1, wherein the light exit window further comprises a diffuser layer for obtaining a diffuse light emission, for obtaining a spatially, color and color over-angle uniform light emission, and for obtaining a color mixed light emission.

11. A light emitting module according to claim 1, wherein a diffuser layer for obtaining a diffuse light emission, for obtaining a spatially, color and color over-angle uniform light emission, and for obtaining a color mixed light emission is provided at a distance from a side of the partially diffusive reflective layer facing away from the at least one solid state light emitter.

12. A lamp comprising a light emitting module according to claim 1.

13. A luminaire comprising a light emitting module according to claim 1 or comprising a lamp.

14. A display device comprising a light emitting module according to claim 1.

15. A light emitting module according to claim 1 wherein the light reflective wall surface is curved for increasing the reflection of light towards the light exit window.

16. A light emitting module according to claim 1, wherein the light exit window further comprises a dichroic layer for correcting color over angle variations or light uniformity.

17. A light emitting module according to claim 1, wherein the light exit window further comprises an optical element for providing a desired light beam shape.

* * * * *